(12) United States Patent
Baek

(10) Patent No.: US 11,398,491 B2
(45) Date of Patent: Jul. 26, 2022

(54) THREE-DIMENSIONAL SEMICONDUCTOR DEVICE

(71) Applicant: Samsung Electronics Co., Ltd., Suwon-si (KR)

(72) Inventor: Seok Cheon Baek, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/403,544

(22) Filed: Aug. 16, 2021

(65) Prior Publication Data
US 2021/0375904 A1 Dec. 2, 2021

Related U.S. Application Data

(63) Continuation of application No. 16/401,205, filed on May 2, 2019.

(30) Foreign Application Priority Data

Aug. 17, 2018 (KR) .......................... 10-2018-0095906

(51) Int. Cl.
*H01L 27/11556* (2017.01)
*H01L 27/02* (2006.01)
(Continued)

(52) U.S. Cl.
CPC .......... *H01L 27/11556* (2013.01); *G11C 5/06* (2013.01); *H01L 27/0207* (2013.01); *H01L 27/11582* (2013.01)

(58) Field of Classification Search
CPC .......... H01L 27/11556; H01L 27/0207; H01L 27/11582; G11C 5/06
See application file for complete search history.

(56) References Cited

U.S. PATENT DOCUMENTS 8,809,938 B2  8/2014  Hwang et al.
9,368,508 B2  6/2016  Jee et al.
(Continued)

FOREIGN PATENT DOCUMENTS

| KR | 10-1487746 B1 | 1/2015 |
|---|---|---|
| KR | 10-2016-0043263 A | 4/2016 |
| KR | 10-2017-0046892 A | 5/2017 |

*Primary Examiner* — Peter Bradford
(74) *Attorney, Agent, or Firm* — Muir Patent Law, PLLC

(57) ABSTRACT

A three-dimensional semiconductor device comprises a stack structure on a lower structure, a vertical channel structure passing through the stack structure, and a first vertical support structure passing through the stack structure and spaced apart from the vertical channel structure. The stack structure includes interlayer insulation layers and gate horizontal patterns, alternately stacked in a vertical direction perpendicular to an upper surface of the lower structure. The vertical channel structure and the first vertical support structure have different cross-sectional shapes. The vertical channel structure further includes a channel semiconductor layer. The vertical channel structure includes first and second vertical regions, and a width variation portion between the first and second vertical regions. The interlayer insulation layers include an intermediate interlayer insulation layer adjacent to the width variation portion. The intermediate interlayer insulation layer has the same thickness as that of an interlayer insulation layer adjacent in the vertical direction.

11 Claims, 48 Drawing Sheets

(51) Int. Cl.
　　　*G11C 5/06*　　　　(2006.01)
　　　*H01L 27/11582*　　(2017.01)

(56) References Cited

U.S. PATENT DOCUMENTS

| | | | |
|---|---|---|---|
| 9,530,742 B1 * | 12/2016 | Jung | H01L 27/11524 |
| 9,870,991 B1 * | 1/2018 | Kim | H01L 23/528 |
| 9,881,929 B1 * | 1/2018 | Ravikirthi | H01L 27/1157 |
| 2016/0225621 A1 * | 8/2016 | Seo | H01L 27/11582 |
| 2017/0117222 A1 | 4/2017 | Kim et al. | |
| 2017/0271352 A1 * | 9/2017 | Nakamura | H01L 27/1157 |
| 2017/0345843 A1 | 11/2017 | Lee et al. | |
| 2018/0040626 A1 | 2/2018 | Zhu et al. | |
| 2018/0083033 A1 * | 3/2018 | Arai | H01L 29/40117 |

\* cited by examiner

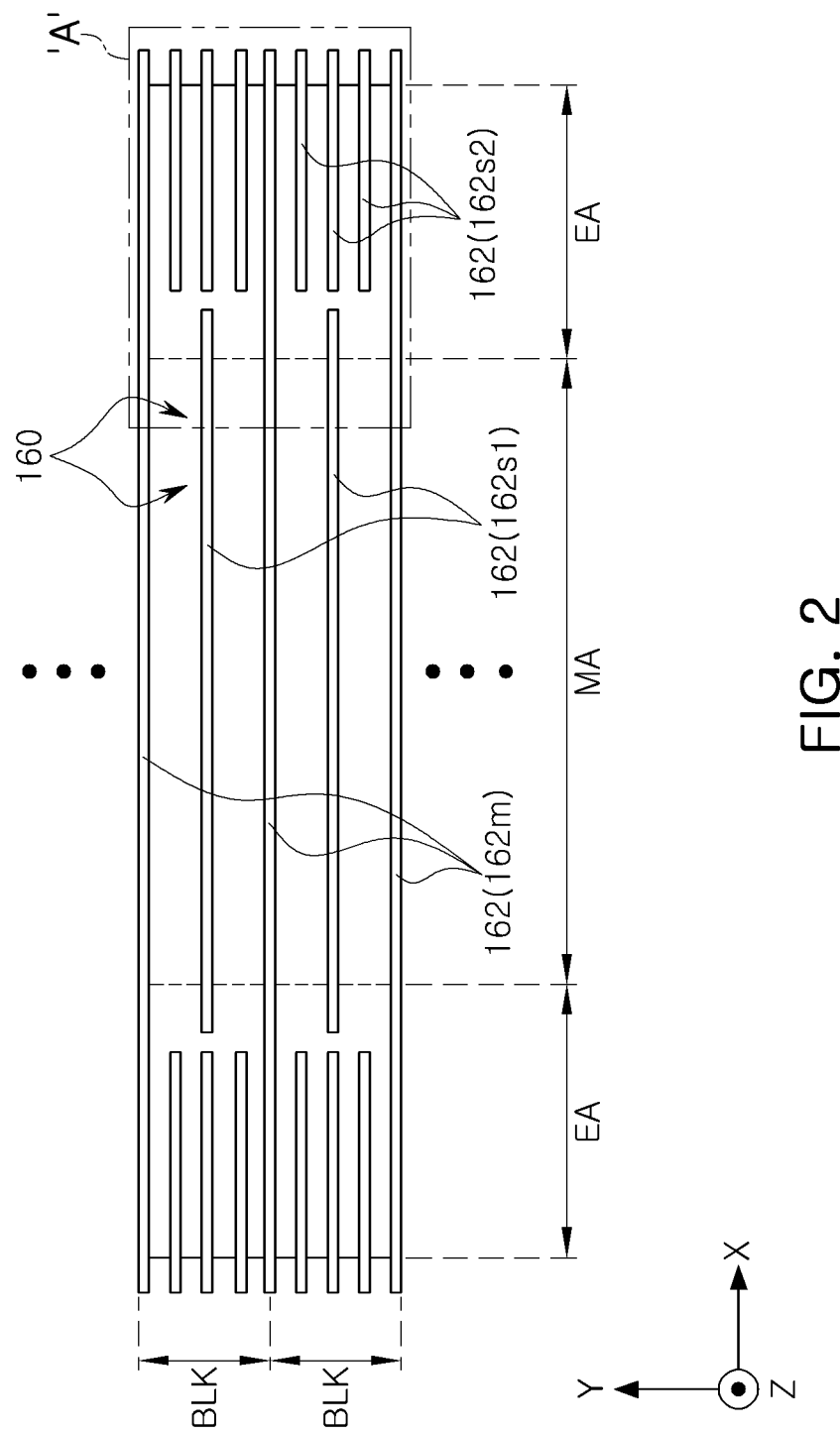

THREE-DIMENSIONAL SEMICONDUCTOR DEVICE

CROSS-REFERENCE TO RELATED APPLICATION

This application is a continuation of U.S. patent application Ser. No. 16/401,205, filed May 2, 2019, in the U.S. Patent and Trademark Office, which claims benefit of priority under 35 U.S.C. § 119 to Korean Patent Application No. 10-2018-0095906, filed Aug. 17, 2018, in the Korean Intellectual Property Office, the disclosures of both of which are incorporated herein by reference in their entireties.

BACKGROUND

1. Field

The present disclosure relates to a semiconductor device, particularly to a three-dimensional semiconductor device including gate horizontal patterns stacked in a vertical direction.

2. Description of Related Art

In order to increase the price competitiveness of products, there is growing demand for improvements in the degree of integration of semiconductor devices. In order to improve the degree of integration of semiconductor devices, a three-dimensional semiconductor device has been developed, in which gates are stacked in a direction perpendicular to a substrate. However, problems occur as the number of stacked gates increases.

SUMMARY

An aspect of the present inventive concept is to provide a three-dimensional semiconductor device having an improved degree of integration.

According to an exemplary embodiment, the disclosure is directed to a three-dimensional semiconductor device comprising: a stack structure on a lower structure and including interlayer insulation layers and gate horizontal patterns alternately stacked in a vertical direction, the vertical direction being perpendicular to an upper surface of the lower structure; a vertical channel structure passing through the stack structure in the vertical direction and including a channel semiconductor layer; and a first vertical support structure passing through the stack structure in the vertical direction and spaced apart from the vertical channel structure in a horizontal direction, wherein a cross-sectional shape of the vertical channel structure is different than a cross-sectional shape of the first vertical support structure, wherein the vertical channel structure includes a first vertical region, a second vertical region, and a width variation portion between the first vertical region and the second vertical region, wherein the interlayer insulation layers include an intermediate interlayer insulation layer adjacent to the width variation portion, and wherein the intermediate interlayer insulation layer and an interlayer insulation layer adjacent to the intermediate interlayer insulation layer in the vertical direction, among the interlayer insulation layers, have the same thickness.

According to an exemplary embodiment, the disclosure is directed to a three-dimensional semiconductor device comprising: a stack structure disposed on a lower structure and including gate horizontal patterns; a vertical channel structure passing through the stack structure in a vertical direction, the vertical direction being perpendicular to an upper surface of the lower structure; and a first vertical support structure passing through the stack structure and spaced apart from the vertical channel structure, wherein the gate horizontal patterns are stacked in a first region on the lower structure in a vertical direction and extend from the first region in a first horizontal direction, the first horizontal direction being parallel to the upper surface of the lower structure, wherein the gate horizontal patterns include pad regions arranged in a stepped shape in a second region adjacent to the first region, wherein the gate horizontal patterns include a lower gate horizontal pattern, an upper gate horizontal pattern on the lower gate horizontal pattern, and intermediate gate horizontal patterns between the lower gate horizontal pattern and the upper gate horizontal pattern, wherein the stack structure further includes interlayer insulation layers alternately stacked with the intermediate gate horizontal patterns interposed therebetween, each of the interlayer insulation layers having a first thickness, wherein the vertical channel structure is disposed in the first region, and the first vertical support structure is disposed in the second region, wherein the vertical channel structure comprises a first vertical region, a second vertical region, and a width variation portion between the first vertical region and the second vertical region, and wherein the first vertical support structure has a cross-sectional structure different from a cross-sectional structure of the vertical channel structure.

According to an exemplary embodiment, the disclosure is directed to a three-dimensional semiconductor device comprising: horizontal gate patterns on a lower structure, the horizontal gate patterns stacked in a vertical direction in a memory array region, and extending lengthwise in a horizontal direction from the memory array region into an extension region, wherein the horizontal gate patterns have pad regions arranged in a stepped shape in the extension region; vertical channel structures disposed in the memory array region and passing through the horizontal gate patterns in the vertical direction; first vertical support structures disposed in the extension region and passing through the pad regions; and second vertical support structures disposed in the memory array region and passing through the horizontal gate patterns, wherein the vertical channel structures and the second vertical support structures each includes a plurality of material layers different from a material layer of the second vertical support structures.

BRIEF DESCRIPTION OF DRAWINGS

The above and other aspects, features, and advantages of the present disclosure will be more clearly understood from the following detailed description, taken in conjunction with the accompanying drawings, in which:

FIGS. 2 to 8A are views illustrating an example embodiment of a three-dimensional semiconductor device, according to an exemplary embodiment.

DETAILED DESCRIPTION

Hereinafter, example embodiments will be described with reference to the accompanying drawings.

Figure 1A:
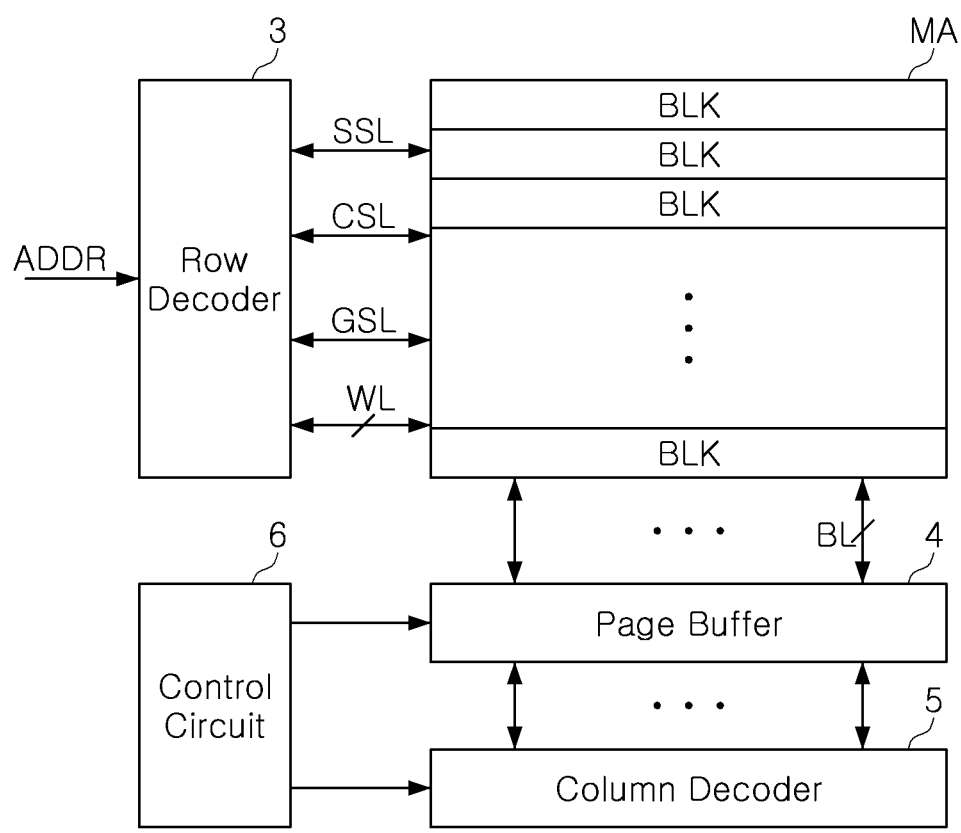
FIG. 1A is a schematic block diagram of a semiconductor device, according to an exemplary embodiment.

FIG. 1A is a schematic block diagram of a semiconductor device, according to an exemplary embodiment.

Referring to FIG. 1A, a semiconductor device 1 according to an embodiment may include a memory array region MA, a row decoder 3, a page buffer 4, a column decoder 5, and a control circuit 6. The memory array region MA may include memory blocks BLK. In some embodiments, the semiconductor device 1 may be a semiconductor chip formed on a die from a wafer, etc., or a package formed from one or more semiconductor chips, a package substrate, and a molding layer, and the semiconductor chip can be a memory chip or memory package.

The memory array region MA may include memory cells arranged in a plurality of rows and columns. For example, each block BLK of the memory array region MA may include memory cells arranged in a plurality of rows and columns. The memory cells included in the memory array region MA may be electrically connected to the row decoder 3 through word lines WL, at least one common source line CSL, string selection lines SSL, at least one ground selection line GSL, and the like. In addition, the memory cells included in the memory array region MA may be electrically connected to the page buffer 4 and the column decoder 5 through bit lines BL.

In one embodiment, among the memory cells, the memory cells arranged on the same row may be connected to the same word line WL, and the memory cells arranged in the same column may be connected to the same bit line BL.

The row decoder 3 may be connected to the memory blocks BLK in common, and may provide a driving signal to the word lines WL of the memory blocks BLK selected according to a block selection signal. For example, the row decoder 3 may receive address information ADDR from an external source, and may decode the received address information ADDR to determine a voltage to be supplied to at least a portion of the word lines WL, the common source line CSL, the string selection lines SSL, and the ground selection line GSL, electrically connected to the memory blocks BLK.

The page buffer 4 may be electrically connected to the memory array region MA through the bit lines BL. The page buffer 4 may be connected to a bit line BL selected according to an address decoded from the column decoder 5. The page buffer 4 may temporarily store data that is to be stored in the memory cells, or sense data stored in the memory cells, according to an operation mode. For example, the page buffer 4 may operate as a writing driver circuit in a programming operation mode, and may operate as a sense amplifier circuit in a reading operation mode. The page buffer 4 may receive power (e.g., voltage or current) from the control circuit 6, and may provide the same to a selected bit line BL.

The column decoder 5 may provide a data transmission path between the page buffer 4 and an external device (for example, a memory controller). The column decoder 5 may decode an externally input address to select one of the bit lines BL.

The column decoder 5 may be connected to the memory blocks BLK in common, and may provide data information to the bit lines BL of the memory block BLK selected according to a block selection signal.

The control circuit 6 may control the overall operation of the semiconductor device 1. The control circuit 6 may receive a control signal and an external voltage, and may operate according to the received control signal. The control circuit 6 may include a voltage generator that generates voltages necessary for internal operations (e.g., a programming voltage, a reading voltage, an erasing voltage, etc.) using an external voltage. The control circuit 6 may control read, write, and/or erase operations in response to control signals.

Figure 1B:
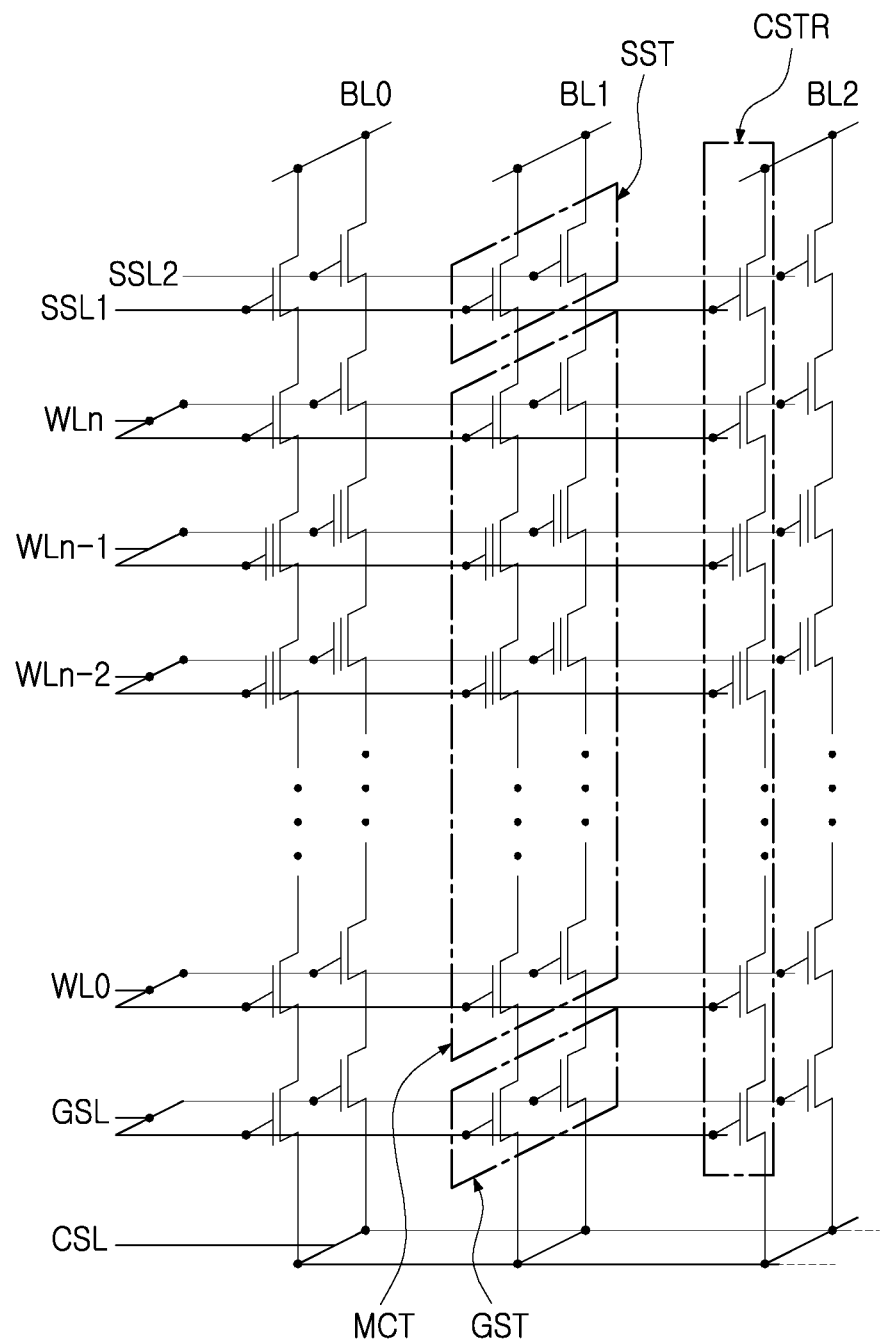
FIG. 1B is a circuit diagram conceptually illustrating a memory array region of a semiconductor device, according to an exemplary embodiment.

An example embodiment of the circuit of the memory array region MA in FIG. 1A of the semiconductor device 1 described in FIG. 1A will be described with reference to FIG. 1B. FIG. 1B is a circuit diagram conceptually illustrating the memory array region MA in FIG. 1A.

Referring to FIG. 1B, a semiconductor device according to an embodiment may include a common source line CSL, bit lines BL0 to BL2, and a plurality of cell strings CSTR arranged between the common source line CSL and the bit lines BL0 to BL2. The plurality of cell strings CSTR may be connected to each of the bit lines BL0 to BL2 in parallel. The plurality of cell strings CSTR may be connected to the common source line CSL in common. Each of the plurality of cell strings CSTR may include a lower selection transistor GST, memory cells MCT, and an upper selection transistor SST, which may be connected in series.

The memory cells MCT may be connected between the lower selection transistor GST and the upper selection transistor SST in series. Each of the memory cells MCT may include information storage regions capable of storing information.

The upper selection transistor SST may be electrically connected to the bit lines BL0 to BL2, and the lower selection transistor GST may be electrically connected to the common source line CSL.

The upper selection transistors SST may be arranged in plural, and may be controlled by string selection lines SSL1 to SSL2. For example, in some embodiments, a cell string CSTR may include a plurality of upper selection transistors SST. The memory cells MCT may be controlled by a plurality of word lines WL0 to WLn.

The lower selection transistor GST may be controlled by the ground selection line GSL. The common source line CSL may be connected in common to sources of the lower selection transistors GST.

In an example embodiment, the upper selection transistor SST may be a string selection transistor, and the lower selection transistor GST may be a ground selection transistor.

Figure 3:
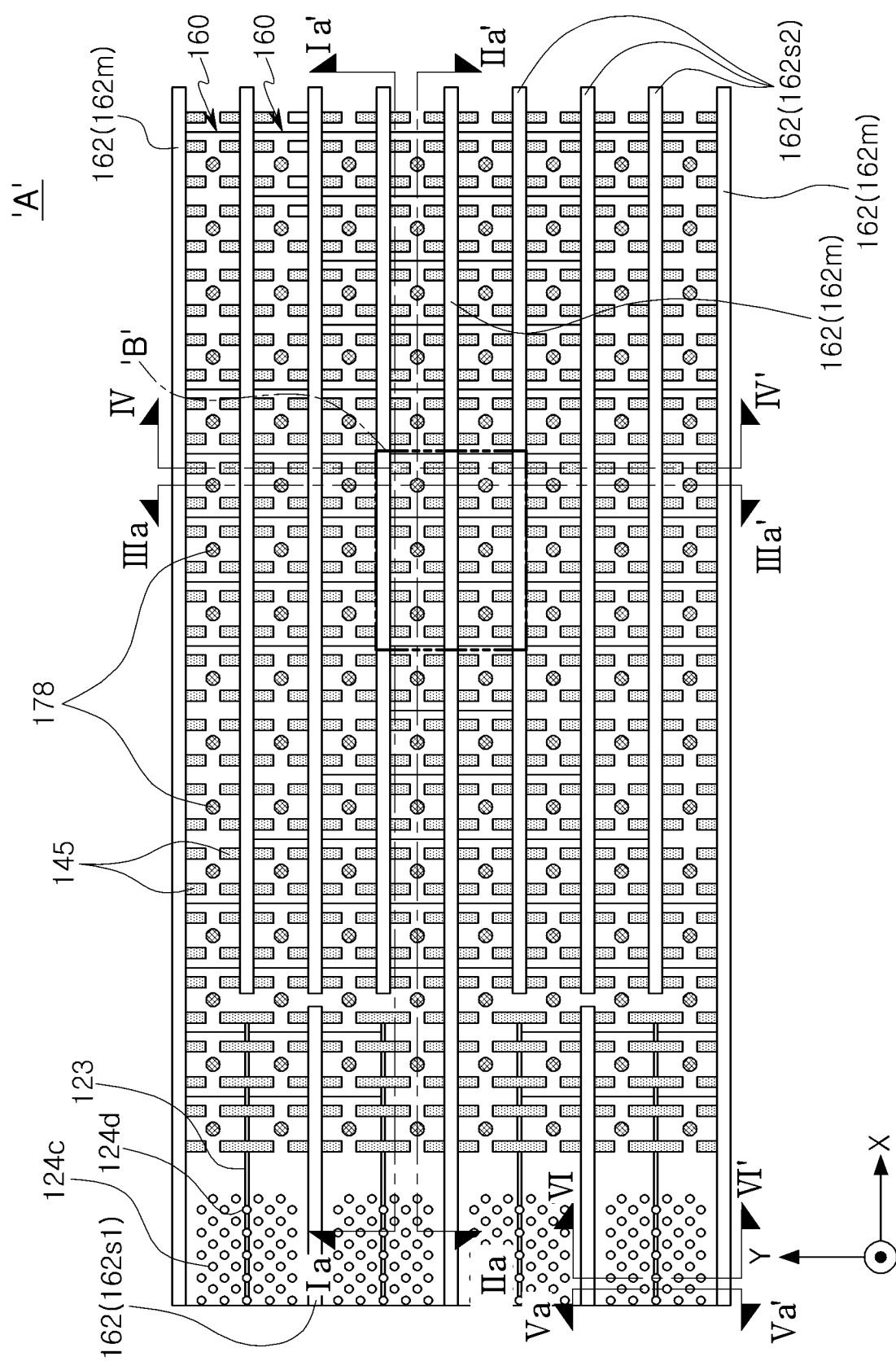
Figure 4:
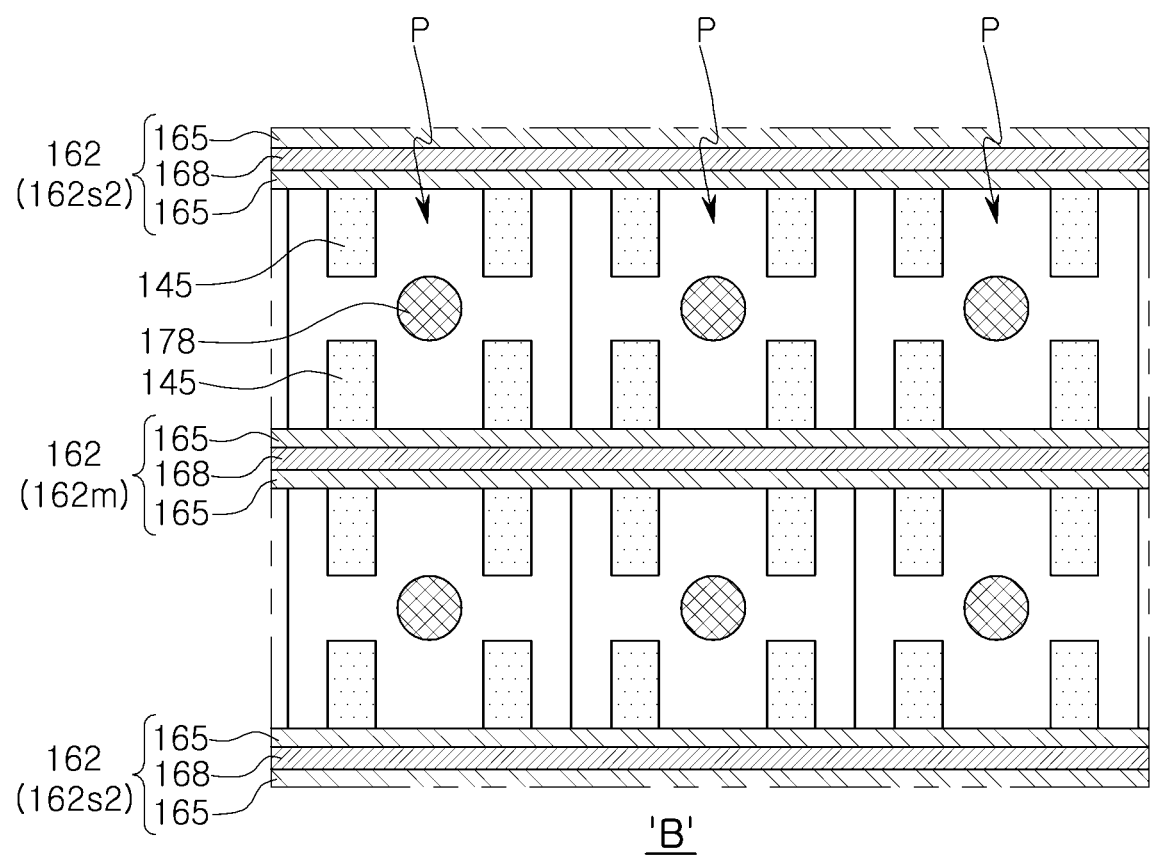
Figure 5A:
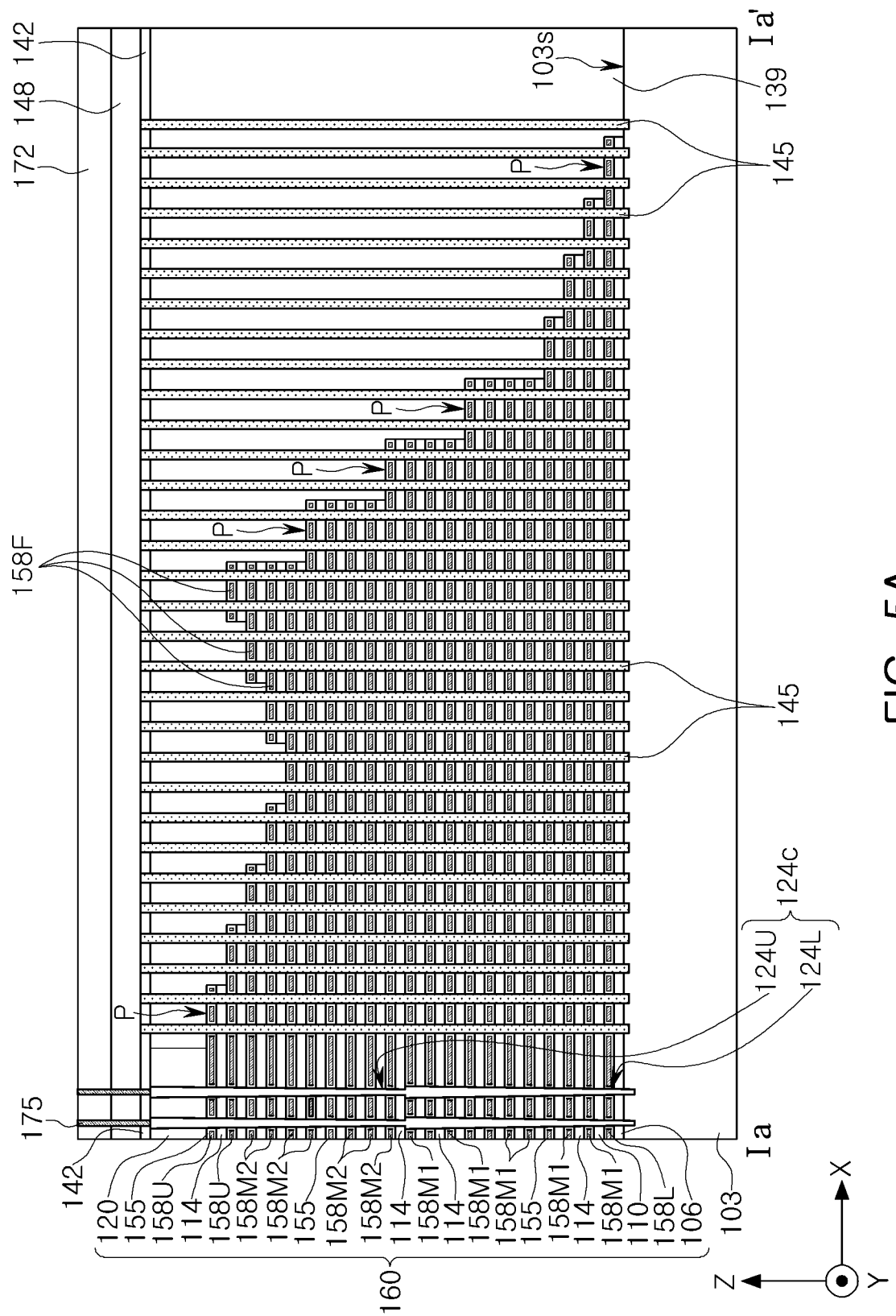
Figure 5B:
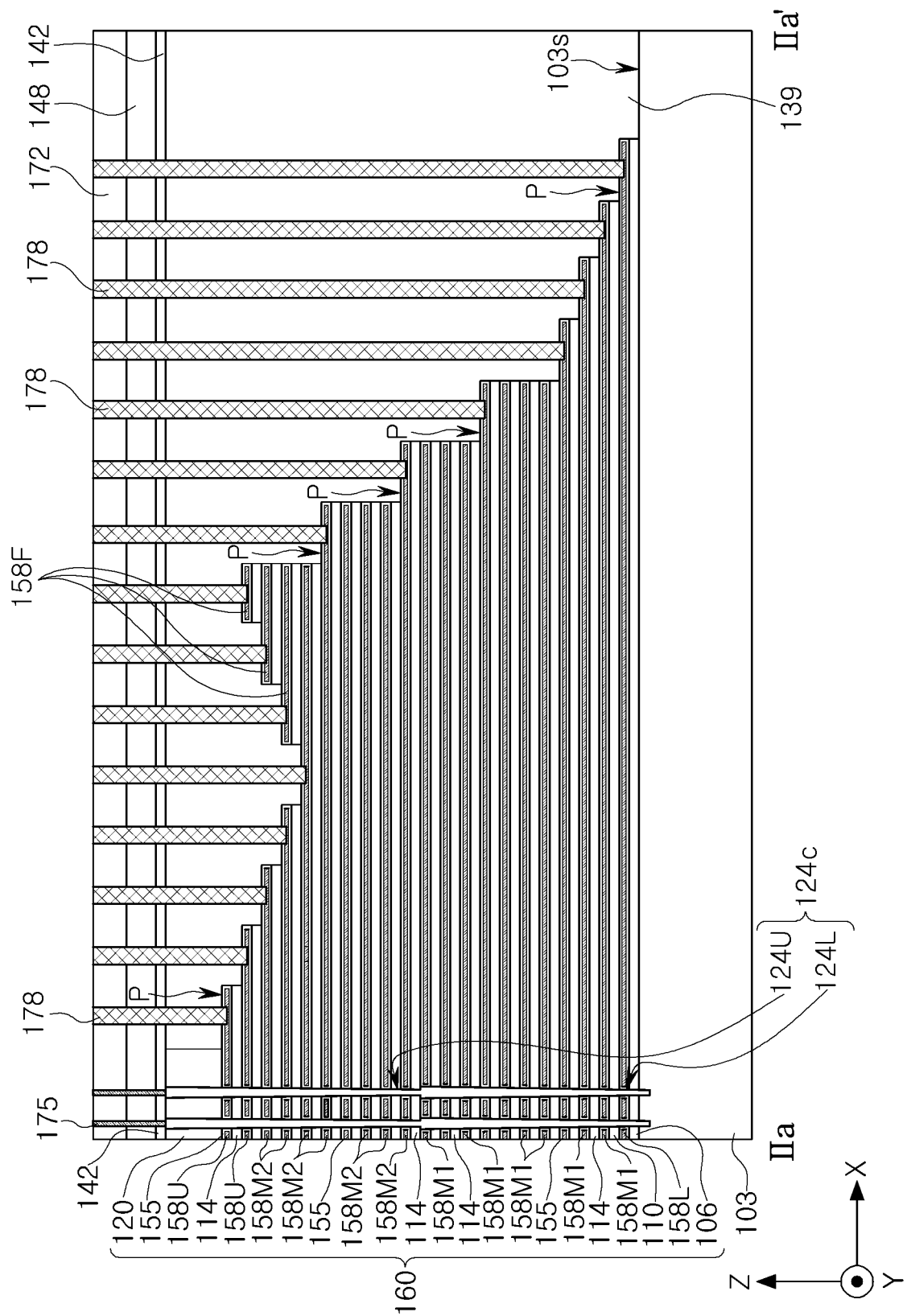
Figure 6A:
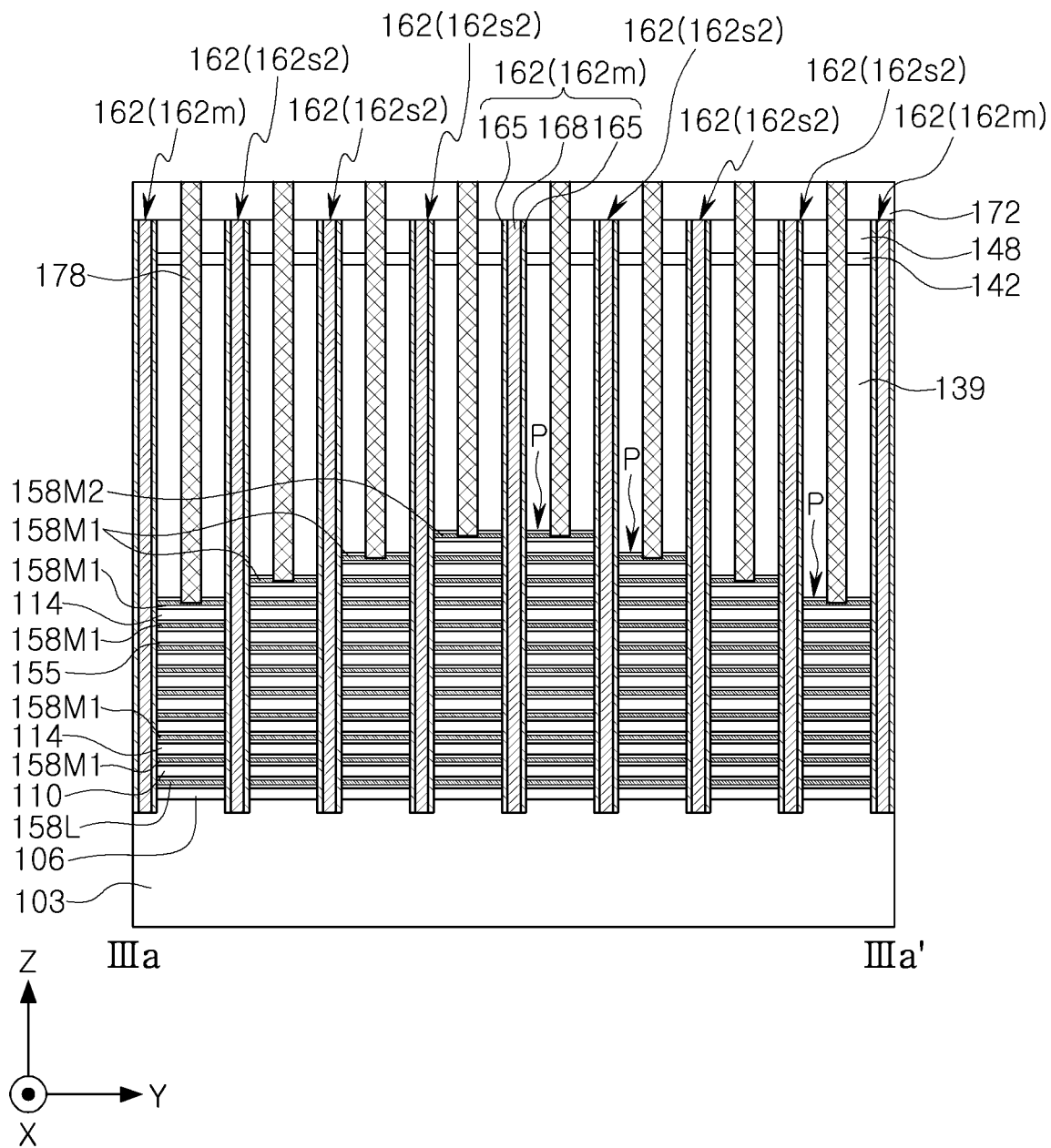
Figure 6B:
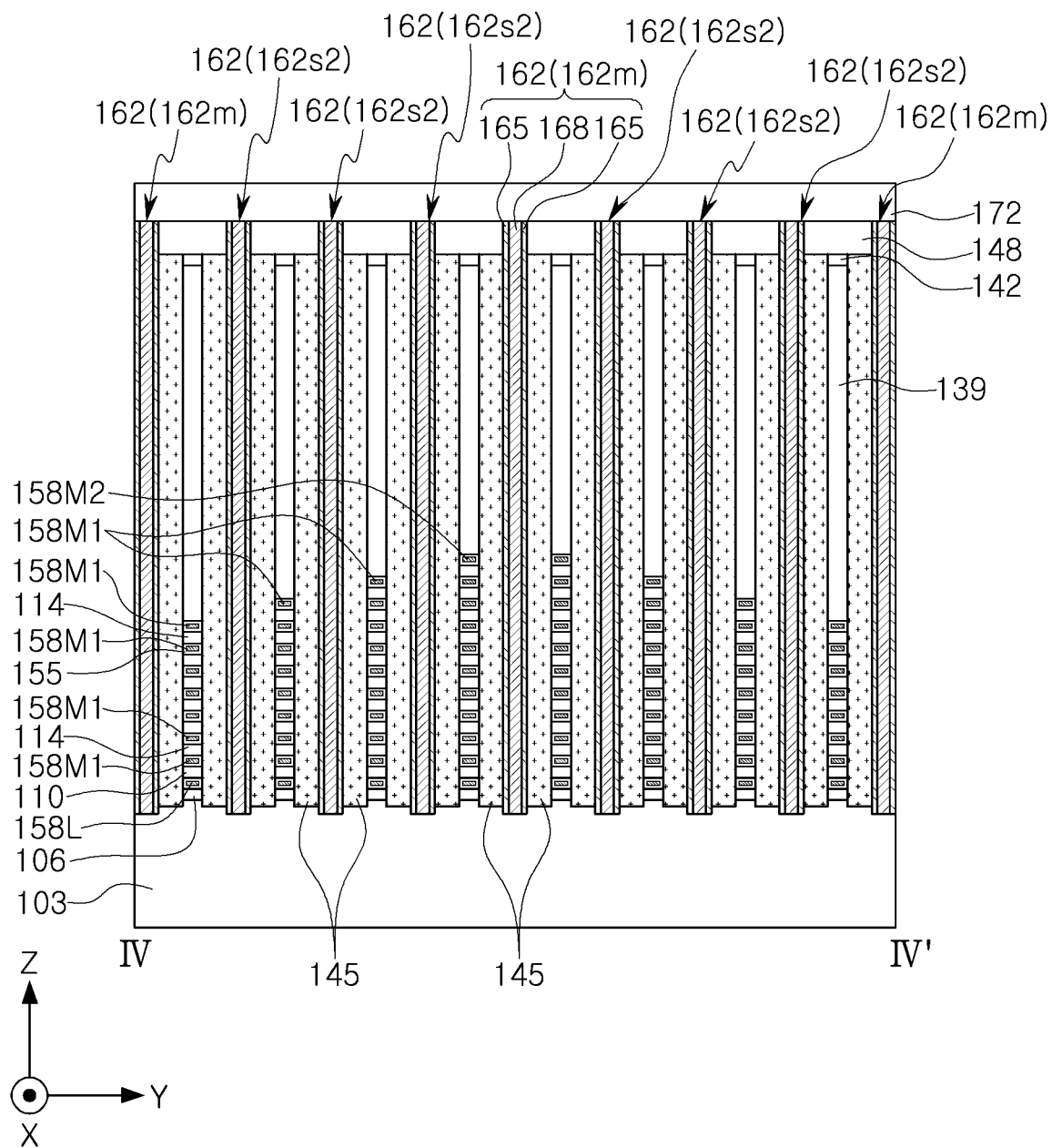
Figure 7A:
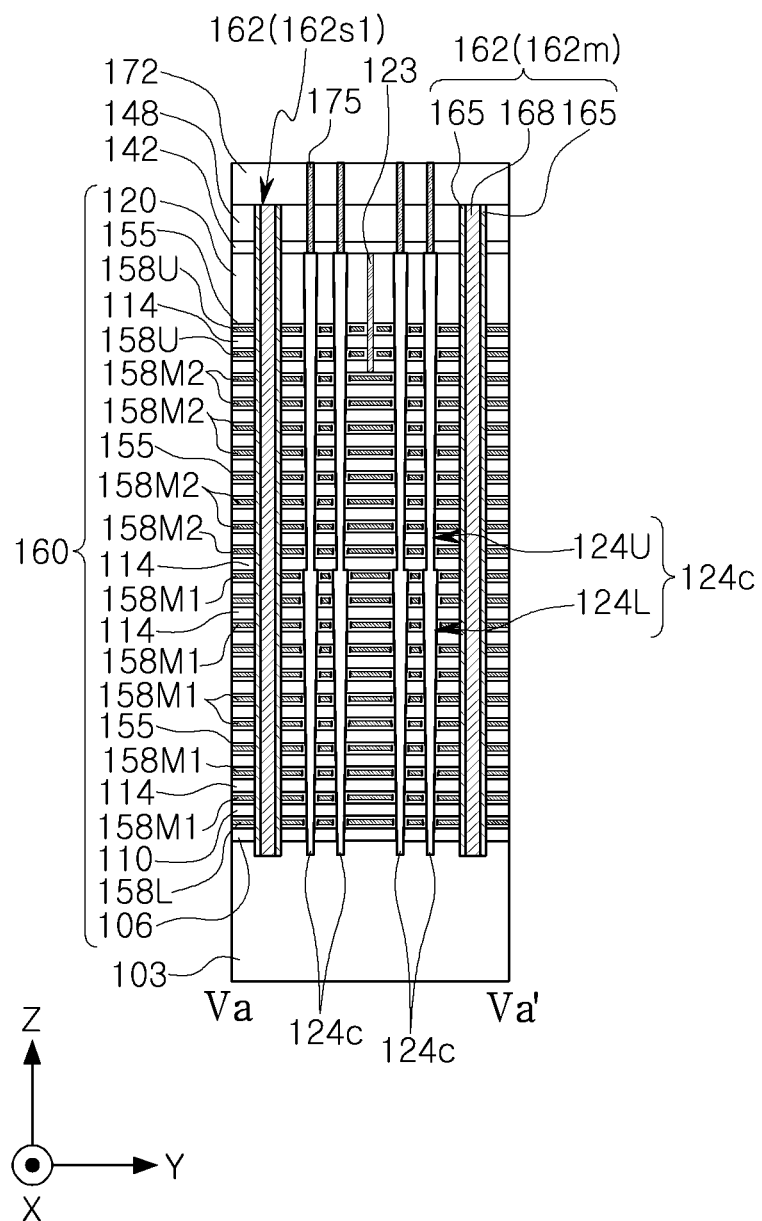
Figure 7B:
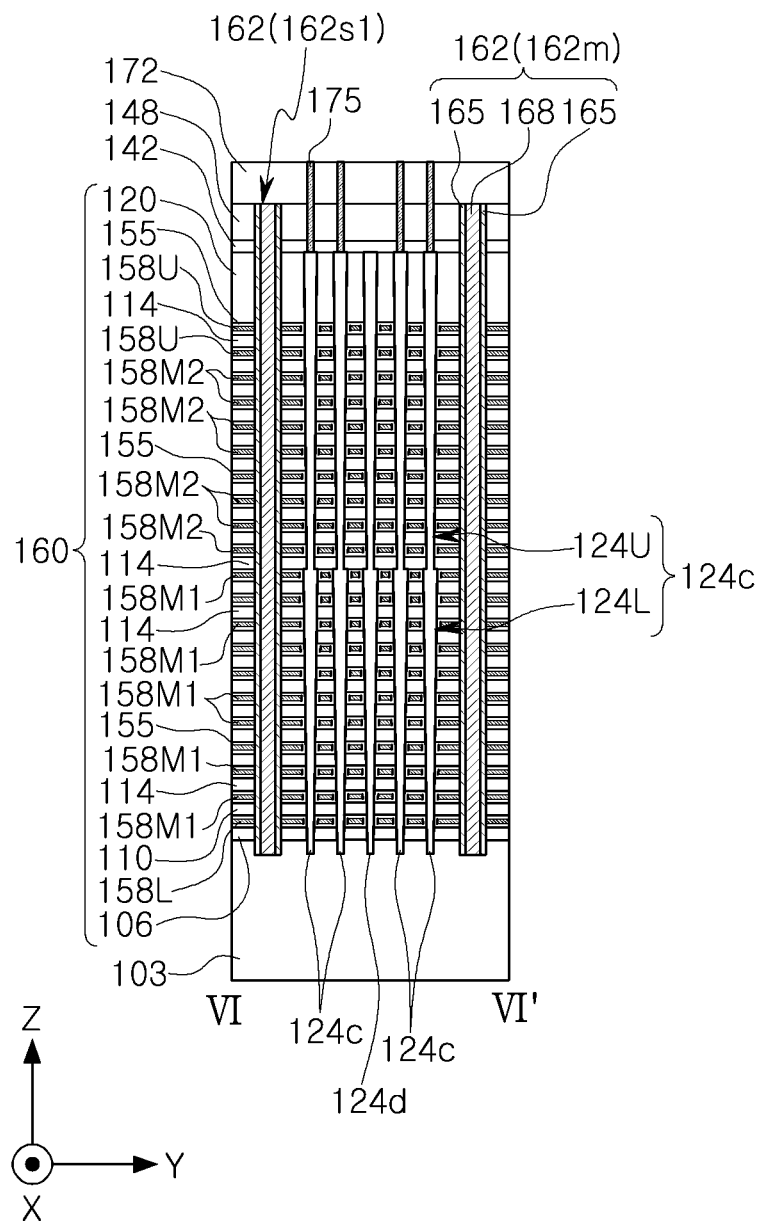

Next, an example embodiment of a three-dimensional semiconductor device according to an embodiment will be described with reference to FIGS. 2, 3, 4, 5A, 5B, 6A, 6B, 7A, and 7B. In FIGS. 2 to 7B, FIG. 2 is a conceptual plan view illustrating a three-dimensional semiconductor device, according to an exemplary embodiment; FIG. 3 is a plan view illustrating an enlarged view of a region indicated by 'A' in FIG. 2; FIG. 4 is a plan view illustrating an enlarged view of a region indicated by 'B' in FIG. 3; FIG. 5A is a cross-sectional view illustrating a region taken along line Ia-Ia' in FIG. 3; FIG. 5B is a cross-sectional view illustrating a region taken along line IIa-IIa' in FIG. 3; FIG. 6A is a cross-sectional view illustrating a region taken along line IIIa-IIIa' in FIG. 3; FIG. 6B is a cross-sectional view illustrating a region taken along line IV-IV' in FIG. 3; FIG. 7A is a cross-sectional view illustrating a region taken along line Va-Va' in FIG. 3; and FIG. 7B is a cross-sectional view illustrating a region taken along line VI-VI' in FIG. 3.

Referring to FIGS. 2 to 7B, a stack structure 160 may be disposed on a lower structure 103. The lower structure 103 may be a semiconductor substrate.

The stack structure 160 may include gate horizontal patterns 158L, 158M1, 158M2, and 158U. The gate horizontal patterns 158L, 158M1, 158M2, and 158U may be stacked in a first region MA on the lower structure 103 in a vertical direction Z, and may extend lengthwise from the first region MA into a second region EA on the lower structure 103 in a first horizontal direction X. The gate horizontal patterns 158L, 158M1, 158M2 and 158U may include pad regions P arranged in a stepped shape. The pad regions P are not limited to the stepped shapes illustrated in the drawings, and may be modified to have various shapes. An item, layer, or portion of an item or layer described as extending "lengthwise" in a particular direction has a length in the particular direction and a width perpendicular to that direction, where the length is greater than the width.

The vertical direction Z may be perpendicular to an upper surface 103s of the lower structure 103, and the first horizontal direction X may be parallel to the upper surface 103s of the lower structure 103.

In embodiments, the first region MA may be the memory array region described in FIG. 1A. Therefore, for convenience of description, the first region MA will be referred to as 'memory array region MA' hereinafter.

In embodiments, the second region EA may be positioned on either or both side surfaces of the memory array region MA in the first horizontal direction X. The second region EA may be a region in which the gate horizontal patterns 158L, 158M1, 158M2, and 158U extend from the memory array region MA to form the pad regions P. Therefore, the second region EA may also be referred to as an extension region. Hereinafter, the second region EA will be referred to as 'extension region EA.'

The gate horizontal patterns 158L, 158M1, 158M2, and 158U may include a lower gate horizontal pattern 158L, an upper gate horizontal pattern 158U on the lower gate horizontal pattern 158L, and intermediate gate horizontal patterns 158M1 and 158M2 between the lower gate horizontal pattern 158L and the upper gate horizontal patterns 158U. The gate horizontal patterns 158L, 158M1, 158M2, and 158U may be arranged in the memory array region MA, and may extend from the memory array region MA into the extension region EA. Floating horizontal patterns 158F spaced apart from the memory array region MA and positioned in the extension region EA may be disposed on a portion of the gate horizontal patterns 158L, 158M1, 158M2, and 158U.

The pad regions P are regions of horizontal patterns that do not overlap horizontal patterns positioned in a relatively higher position (in the third direction Z) among the gate horizontal patterns 158L, 158M1, 158M2, and 158U, and the floating horizontal patterns 158F, and the pad region P positioned in an uppermost position among the pad regions P may be defined as a region of the upper gate horizontal pattern 158U positioned in the extension region EA. For example, the pad region P may be those regions of the horizontal patterns that do not have horizontal patterns above them in the third direction Z.

As illustrated in FIGS. 3 to 6B, the stepped shape in which the pad regions P are arranged may be a shape in which a first step lowers to a first drop, a second step facing the first step and rises toward the first drop, a third step lowers from the second step to a second drop larger than the first drop, and a fourth step lowers to the first drop are arranged in order, away from the memory array region MA, when viewed in a first horizontal direction X, as illustrated in FIGS. 5A and 5B; or may include steps lowering to the first drop in lateral directions, based on any one of separation structures 162m, when viewed in a second horizontal direction Y, as illustrated in FIGS. 6A and 6B. For example, referring to FIGS. 5A and 5B, left-to-right in the first horizontal direction X, the pad regions P may have a shape that includes a series of five steps where each subsequent step is lower than the previous step by one horizontal pattern, then a series of three steps where each subsequent step is higher than the previous step by one horizontal pattern, then a series of four steps where each subsequent step is lower than the previous step by four horizontal patterns, and then a series of three steps where each subsequent step is lower than the previous step by one horizontal pattern. According to example embodiments, the pad regions P may be arranged not only in the stepped shapes illustrated in FIGS. 3 to 6B, but also in various step shapes.

The intermediate gate horizontal patterns 158M1 and 158M2 may include first intermediate gate horizontal patterns 158M1, and second intermediate gate horizontal patterns 158M2 on the first intermediate gate horizontal patterns 158M1.

In an example embodiment, the gate horizontal patterns 158L, 158M1, 158M2, and 158U may be gate electrodes.

In an example embodiment, the lower gate horizontal pattern 158L may be the ground selection line GSL described in FIGS. 1A and 1B.

In an example embodiment, the upper gate horizontal pattern 158U may be the string selection line SSL described in FIGS. 1A and 1B.

In an example embodiment, the upper gate horizontal pattern 158U may be provided in plural, for example, in an amount of two in the vertical direction Z.

In an example embodiment, a portion of or all of the intermediate gate horizontal patterns 158M1 and 158M2 may be the word lines WL described in FIGS. 1A and 1B. For example, a portion of the intermediate gate horizontal patterns 158M1 and 158M2 may be dummy word lines or dummy gates. In some examples, the dummy gates may have voltages applied for reading data from memory cells of the cell string of which they form a part. However, the dummy gate may be part of a dummy memory cell that is not operative to communicate data to an external source of the memory device.

The stack structure 160 may include a lowermost insulation layer 106, a lower insulation layer 110, interlayer insulation layers 114, and an upper insulation layer 120.

The lowermost insulation layer 106, the lower insulation layer 110, the interlayer insulation layers 114, and the upper insulation layer 120 may be formed of an oxide-based insulating material, for example, silicon oxide.

The lowermost insulation layer 106 may be disposed between the lower gate horizontal pattern 158L and the lower structure 103. The lower insulation layer 110 may be disposed between the intermediate gate horizontal patterns 158M1 and 158M2 and the lower gate horizontal pattern 158L. For example, the lower insulation layer 110 may be disposed between the lowermost intermediate gate horizontal pattern 158M1 and the lower gate horizontal pattern 158L.

The interlayer insulation layers 114 may be repeatedly stacked and alternately with the intermediate gate horizontal patterns 158M1 and 158M2. For example, the interlayer insulation layers 114 may be stacked between the intermediate gate horizontal patterns 158M1 and 158M2. Therefore, any one of the interlayer insulation layers 114 may be disposed between a pair of intermediate gate horizontal patterns 158M1 and 158M2 adjacent to each other in the vertical direction Z, among the intermediate gate horizontal patterns 158M1 and 158M2. In addition, an interlayer insulation layer 114 may be disposed between the uppermost intermediate gate horizontal pattern 158M2 and the upper gate horizontal pattern 158U. When the upper gate horizontal pattern 158U is provided in plural, interlayer insulation layers 114 may be disposed between the upper gate horizontal patterns 158U. The upper insulation layer 120 may be disposed on the upper gate horizontal pattern 158U.

The stack structure 160 may further include an additional dielectric layer 155 covering the upper and lower surfaces of each of the gate horizontal patterns 158L, 158M1, 158M2, and 158U, and capable of partially extending to cover side surfaces thereof. The additional dielectric layer 155 may be formed of a high-k dielectric such as aluminum oxide, or the like.

A first capping insulation layer 139 may be disposed on the pad regions P of the gate horizontal patterns 158L, 158M1, 158M2, and 158U. The first capping insulation layer 139 may have an upper surface formed to be coplanar with an upper surface of the upper insulation layer 120. For example, the upper insulating layer 120 may be disposed in the memory array region MA, and the first capping insulation layer 139 may be disposed in regions other than the memory array region MA, i.e., in the extension region EA. The stack structure 160 in the memory array region MA may be covered by the upper insulating layer 120, and the stack structure 160 in the extension region EA may be covered by the first capping insulating layer 139. The boundary between the upper insulating layer 120 and the first capping insulating layer 139 may be substantially vertical, and may be located near the boundary between the memory array region MA and the extension region EA.

A second capping insulation layer 142 covering the upper insulation layer 120 and the first capping insulation layer 139 may be provided. A third capping insulation layer 148 may be arranged on the second capping insulation layer 142, and a fourth capping insulation layer 172 may be arranged on the third capping insulation layer 148. The first to fourth capping insulation layers 139, 142, 148, and 172 may be formed of an oxide-based insulating material, for example, silicon oxide.

Separation structures 162 may be disposed on the lower structure 103. The separation structures 162 may extend from the lower structure 103 in the vertical direction Z to pass through the stack structure 160, and may have a linear shape extending lengthwise in the first horizontal direction X. The separation structures 162 may have upper surfaces formed to be coplanar with each other. In some embodiments, the upper surfaces of the separation structures 162 may be coplanar with the upper surface of the third capping insulation layer 148.

The separation structures 162 may include main separation structures 162m and auxiliary separation structures 162s1 and 162s2. Each of the memory blocks BLK described in FIG. 1A may be disposed between the main separation structures 162m adjacent to each other in the second horizontal direction Y. For example, the main separation structures 162m may provide a physical separation between the individual memory blocks BLK. The main separation structures 162m may cross the memory array region MA and the extension region EA.

The auxiliary separation structures 162s1 and 162s2 may be arranged between the main separation structures 162m. Each of the auxiliary separation structures 162s1 and 162s2 may have shorter lengths than the main separation structures 162m, respectively. The auxiliary separation structures 162s1 and 162s2 may include first auxiliary separation structures 162s1 and second auxiliary separation structures 162s2.

The first auxiliary separation structures 162s1 may cross the memory array region MA in the first horizontal direction X, and may extend into a portion of the extension region EA. The second auxiliary separation structures 162s2 may be spaced apart in the first horizontal direction X from the memory array region MA, and may be disposed in the extension region EA. A portion of the second auxiliary separation structures 162s2 may have an end portion facing an end portion of the first auxiliary separation structures 162s1. For example, the first auxiliary separation structures 162s1 may be aligned in the first horizontal direction X with the second auxiliary separation structures 162s2. The number of the second auxiliary structures 162s2 disposed between the pair of main separation structures 162m adjacent to each other in the second horizontal direction Y may be greater than the number of the first auxiliary structures 162s1 disposed between the adjacent pair of main separation structures 162m in the second horizontal direction Y. Therefore, the main separation structures 162m and the first auxiliary separation structures 162s1 may include portions disposed in the memory array region MA, and may cross the memory array region MA.

The main separation structures 162m may extend in the memory array region MA from the lower structure 103 in the vertical direction Z to pass through the stack structure 160, the second capping insulation layer 142, and the third capping insulation layer 148, and may extend in the extension region EA from the lower structure 103 in the vertical direction Z to pass through the stack structure 160, the first capping insulation layer 139, the second capping insulation layer 142, and the third capping insulation layer 148. The main separation structures 162m may cross the memory array region MA and the extension region EA, and may separate the stack structure 160 in the second horizontal direction Y. The second horizontal direction Y may be parallel to the upper surface 103s of the lower structure 103, and may be perpendicular to the first horizontal direction X. Each of the memory blocks BLK described in FIG. 1A may be disposed between the main separation structures 162m adjacent to each other. For example, one memory block BLK may be disposed between adjacent main separation structures 162m.

The first auxiliary separation structures 162s1 may extend in the memory array region MA from the lower structure 103 in the vertical direction Z to pass through the stack structure 160, the second capping insulation layer 142, and the third capping insulation layer 148, and may extend in a portion of the extension region EA adjacent to the memory array region MA from the lower structure 103 in the vertical direction Z to pass through the stack structure 160, the first capping insulation layer 139, the second capping insulation layer 142, and the third capping insulation layer 148. The second auxiliary structures 162s2 may extend from the lower structure 103 in the vertical direction Z, in the extension region EA spaced apart from the memory array region MA, to pass through the stack structure 160, the first capping insulation layer 139, the second capping insulation layer 142, and the third capping insulation layer 148.

Each of the separation structures 162 may include a first separation layer 165 and a second separation layer 168. The first separation layer 165 may be disposed on a side surface of the second separation layer 168. Top surfaces of the first separation layer 165 and the second separation layer 168 may be coplanar with one another, and lower surfaces of the first separation layer 165 and the second separation layer 168 may be coplanar with one another.

In an example embodiment, the second separation layer 168 may be formed of a conductive material (e.g., a metal nitride such as polysilicon, TiN, or the like, or a metal such as W, or the like), and the first separation layer 165 may be formed of an insulating material such as silicon oxide, or the like. The embodiments are not limited thereto. For example, the separation structures 162, including the first separation layer 165 and the second separation layer 168, may be formed from an insulating material.

In the stack structures 160, separation insulation patterns 123 may be disposed to pass through the upper gate horizontal patterns 158U in the vertical direction Z, and extend lengthwise in the first horizontal direction X to separate the upper gate horizontal patterns 158U in the second horizontal direction Y. The separation insulation patterns 123 may be disposed on the intermediate gate horizontal patterns 158M1 and 158M2. For example, the separation insulation patterns 123 may be formed on an uppermost one of the intermediate gate horizontal patterns 158M1 and 158M2, and below the lowermost one of the upper gate horizontal patterns 158U. The separation insulation patterns 123 may be formed to extend from the uppermost one of the intermediate gate horizontal patterns 158M1 and 158M2 through the upper gate horizontal patterns 158U, intervening interlayer insulation layers 114, and the upper insulation layer 120. An upper surface of the separation insulation patterns 123 may be coplanar with an upper surface of the upper insulation layer 120. The separation insulation patterns 123 may be formed of silicon oxide.

Vertical channel structures 124c, which may extend lengthwise in the vertical direction Z, may be disposed on the lower structure 103. The vertical channel structures 124c may be disposed in the memory array region MA. The vertical channel structures 124c may be spaced apart from the separation structures 162 and the separation insulation patterns 123.

Vertical support structures 145 and 124d, which may extend lengthwise in the vertical direction Z, may be disposed on the lower structure 103. The vertical support structures 145 and 124d may include first vertical support structures 145 and second vertical support structures 124d.

In an example embodiment, the first vertical support structures 145 may be disposed in the extension region EA.

In an example embodiment, the first vertical support structures 145 may pass through the stack structure 160 in the extension region EA, and may pass through the first capping insulation layer 139 and the second capping insulation layer 142. When viewed in plan view, the first vertical support structures 145 may extend lengthwise in the second horizontal direction Y. When viewed in cross-section, the first vertical support structures 145 may extend from the lower structure 103 to the second capping insulation layer 142, and may have a top surface that is coplanar with a top surface of the second capping layer 142.

In an example embodiment, the second vertical support structures 124d may be disposed in the memory array region MA. The second vertical support structures 124d may extend from the lower structure 103 to pass through the stack structure 160. The second vertical support structures 124d may pass through the separation insulation patterns 123. The second vertical support structures 124d may be in contact with the separation insulation patterns 123. The term "contact," as used herein, refers to a direct connection (i.e., touching) unless the context indicates otherwise.

The second vertical support structures 124d and the vertical channel structures 124c may have upper surfaces formed to be coplanar with each other. The second vertical support structures 124d and the vertical channel structures 124c may have the same cross-sectional structure as each other and the same width as each other. For example, when viewed in a plan view, diameters of the second vertical support structures 124d may be the same as diameters of the vertical channel structures 124c. For example, the second vertical support structures 124d and the vertical channel structures 124c may be formed of material layers having the same cross-sectional structure.

In an example embodiment, the first vertical structures 145 may have an upper surface positioned on a higher vertical level than the upper surfaces of the second vertical support structures 124*d* and the vertical channel structures 124*c*.

The additional dielectric layer 155 may cover the upper and lower surfaces of each of the gate horizontal patterns 158L, 158M1, 158M2, and 158U, and may extend to side surfaces of the gate horizontal patterns 158L, 158M1, 158M2, and 158U facing the first vertical support structures 145, the second vertical support structures 124*d*, and the vertical channel structures 124*c*.

First contact plugs 178 may be disposed on the pad regions P. The first contact plugs 178 may pass through the first to fourth capping insulation layers 139, 142, 148, and 172, and may be in contact with the pad regions P of the gate horizontal patterns 158L, 158M1, 158M2, and 158U. The first contact plugs 178 may be formed of a conductive material. Second contact plugs 175, in contact with the vertical channel structures 124*c*, may be disposed on the vertical channel structures 124*c*. For example, lower surfaces of the second contact plugs 175 may contact top surfaces of the vertical channel structures 124*c*. The second contact plugs 175 may be formed of a conductive material. The first contact plugs 178 also may be referred to as a "gate contact plug," and the second contact plugs 175 also may be referred to as a "bit line contact plug."

Figure 8A:
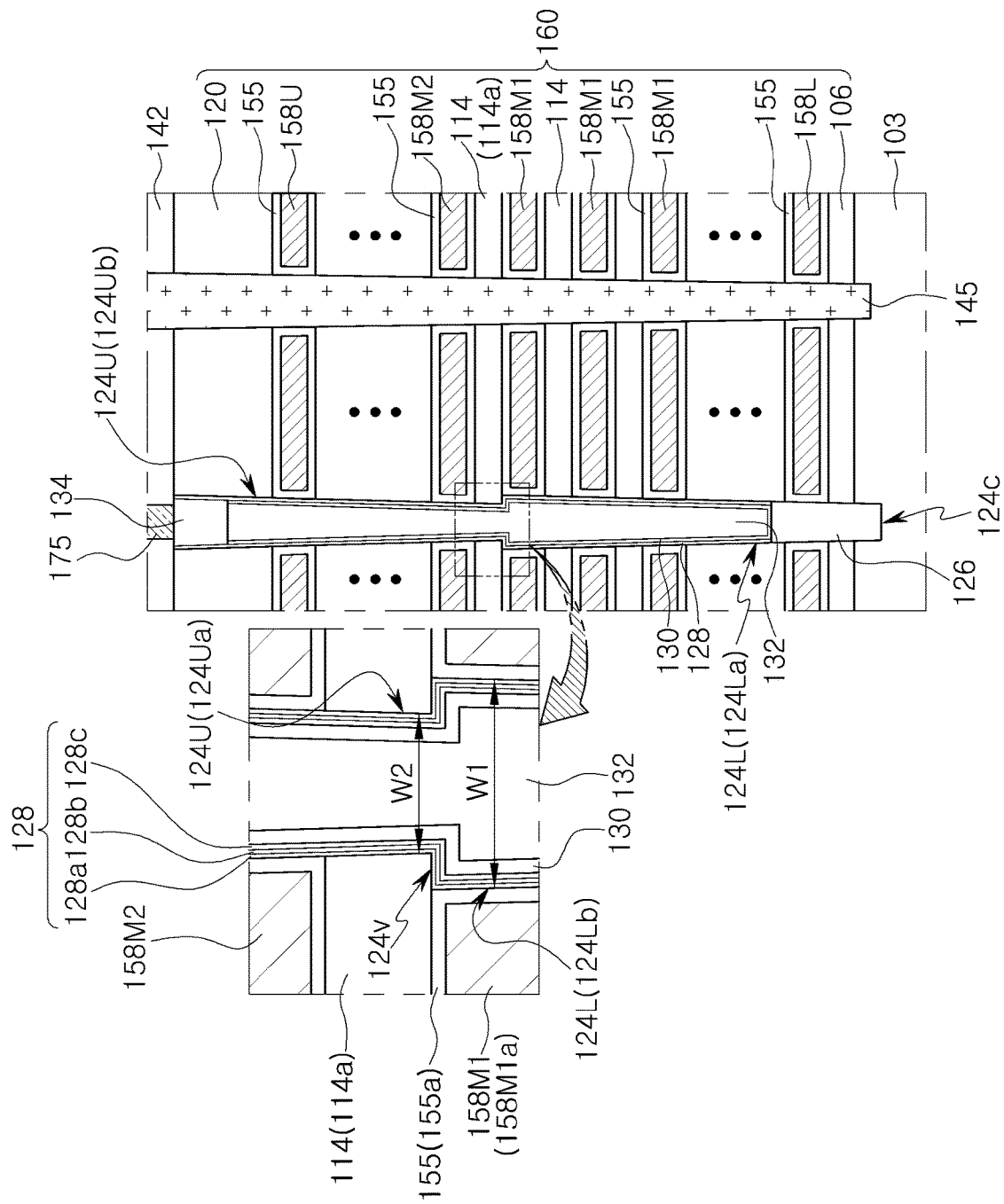

In an example embodiment, the second vertical support structures 124*d* and the vertical channel structures 124*c* may be formed of material layers having the same cross-sectional structure as each other, and the first vertical support structures 145 may be formed of a material layer of a cross-sectional structure different from the vertical channel structures 124*c*. Hereinafter, the first vertical support structures 145 and the vertical channel structures 124*c* having structures different from each other will be described with reference to FIG. 8A. FIG. 8A is a cross-sectional view schematically illustrating one vertical channel structure 124*c* and one first vertical support structure 145, for explaining the first vertical support structures 145 and the vertical channel structures 124*c* having structures different from each other. Therefore, hereinafter, the one vertical channel structure 124*c* and the one first vertical support structure 145 will mainly be described.

Referring to FIG. 8A, together with FIGS. 2 to 7B, the vertical channel structure 124*c* may include a channel semiconductor layer 130, and a gate dielectric structure 128 disposed between the channel semiconductor layer 130 and the stack structure 160.

In an example embodiment, the vertical channel structure 124*c* may further include a semiconductor pattern 126, a vertical core pattern 132 on the semiconductor pattern 126, and a pad pattern 134 on the vertical core pattern 132.

The channel semiconductor layer 130 may be disposed to contact the semiconductor pattern 126 and surround an outer side surface of the vertical core pattern 132. The gate dielectric structure 128 may be disposed to surround an outer side surface of the channel semiconductor layer 130. The semiconductor pattern 126 may be an epitaxial material layer that may be formed in an SEG process. The vertical core pattern 132 may be formed of an insulating material (e.g., silicon oxide, or the like). The pad pattern 134 may be formed of polysilicon having an N-type conductivity, or may be a drain region. The pad pattern 134 may be disposed on a higher vertical level than the upper gate horizontal pattern 158U. For example, a lower surface of the pad pattern 134 may be at a higher vertical level than a top surface of the uppermost upper gate horizontal pattern 158U. The pad pattern 134 of the vertical channel structure 124*c* may be in contact with the second contact plug 175 described above. For example, the pad pattern 134 of the vertical channel structure 124*c* may be electrically connected to the second contact plug 175.

In an example embodiment, the channel semiconductor layer 130 may pass through the gate horizontal patterns 158L, 158M1, 158M2, and 158U. When the vertical channel structure 124*c* further includes a semiconductor pattern 126, the semiconductor pattern 126 may pass through the lower gate horizontal pattern 158L, and the channel semiconductor layer 130 may pass through the intermediate and upper gate horizontal patterns 158M1, 158M2, and 158U. The channel semiconductor layer 130 may be formed of a polysilicon layer. The semiconductor pattern 126 also may be referred to as a lower channel semiconductor layer.

In an example embodiment, the semiconductor pattern 126 also may be referred to as a channel semiconductor layer. For example, the semiconductor pattern 126 also may be referred to as a lower channel semiconductor layer positioned in a relatively lower portion, and the channel semiconductor layer 130 also may be referred to as an upper channel semiconductor layer positioned in a relatively upper portion.

The gate dielectric structure 128 may include a tunnel dielectric 128*c*, an information storage layer 128*b*, and a blocking dielectric 128*a*. The information storage layer 128*b* may be disposed between the tunnel dielectric layer 128*c* and the blocking dielectric 128*a*. The blocking dielectric 128*a* may be disposed between the information storage layer 128*b* and the stack structure 160. The tunnel dielectric 128*c* may be disposed between the information storage layer 128*b* and the channel semiconductor layer 130. The tunnel dielectric 128*c* may include silicon oxide and/or impurity doped silicon oxide. The blocking dielectric 128*a* may include silicon oxide and/or a high-k dielectric. The information storage layer 128*b* may be formed of a material capable of storing information, for example, silicon nitride.

The information storage layer 128*b* may include regions capable of storing information between the channel semiconductor layer 130 and the first and second intermediate gate horizontal patterns 158M1 and 158M2, which may be the word lines (e.g., word lines WL in FIGS. 1A and 1B). For example, electrons injected into the information storage layer 128*b* from the channel semiconductor layer 130 through the tunnel dielectric 128*c* may be trapped and retained, or electrons trapped in the information storage layer 128*b* may be released, according to an operation condition of a non-volatile memory device, such as a flash memory device.

Therefore, as described above, regions of the information storage layer 128*b* positioned between the channel semiconductor layer 130 and the first and second intermediate gate horizontal patterns 158M1 and 158M2, which may be the word lines (e.g., word lines WL in FIGS. 1A and 1B), may be defined as information storage regions, and these information storage regions may constitute the memory cells (e.g., memory cells MCT in FIG. 1B) described in FIG. 1B.

An interlayer insulation layer disposed between a first intermediate gate horizontal pattern 158M1*a*, positioned in a relatively upper portion in the first intermediate gate horizontal patterns 158M1, and a second intermediate gate horizontal pattern 158M2*a*, positioned in a relatively lower portion in the second intermediate gate horizontal patterns 158M2, may be referred to as an intermediate interlayer insulation layer 114*a*. A thickness of the intermediate interlayer insulation layer 114*a* may be substantially the same as a thickness of each of the interlayer insulation layers 114 positioned between the first intermediate gate horizontal patterns 158M1, and a thickness of each of the interlayer insulation layers 114 positioned between the second intermediate gate horizontal patterns 158M2. As used herein, thickness may refer to the thickness or height measured in a direction perpendicular to a top surface of the lower structure 103.

The vertical channel structure 124c may include a first vertical region 124L, a second vertical region 124U on the first vertical region 124L, and a width variation portion 124v between the first vertical region 124L and the second vertical region 124U.

In the vertical channel structure 124c, the first vertical region 124L may be a region passing through the lower gate horizontal pattern 158L and the first intermediate gate horizontal patterns 158M1, and the second vertical region 124U may be a region passing through the second intermediate gate horizontal patterns 158M2 and the upper gate horizontal pattern 158U.

The first vertical region 124L may include a lower region 124La, and an upper region 124Lb on the lower region 124La. The second vertical region 124U may include a lower region 124Ua, and an upper region 124Ub on the lower region 124Ua.

Each of the first vertical region 124L and the second vertical region 124U may have a constant regularity in a vertical direction Z away from the lower structure 103, and may have a variable width or a predictably variable width. For example, in the vertical channel structure 124c, each of the first vertical region 124L and the second vertical region 124U may increase in width in a vertical direction away from the lower structure 103. For example, in the first vertical region 124L, the lower region 124La, relatively closer to the lower structure 103, may have a width less than a width of the upper region 124Lb relatively farther from the lower structure 103. In the second vertical region 124U, the lower region 124Ua relatively closer to the lower structure 103 may have a width less than a width of the upper region 124Ub relatively farther from the lower structure 103.

The upper region 124Lb of the first vertical region 124L may have a width greater than a width of the lower region 124La of the first vertical region 124L and a width less than a width of the lower region 124Ua of the second vertical region 124U. The upper region 124Ub of the second vertical region 124U may have a width greater than a width of the lower region 124Ua of the second vertical region 124U and greater than a width of the lower region 124La of the first vertical region 124L. In some embodiments, the widths of the upper regions 124Lb and 124Ub of the first and second vertical regions 124L and 124U, respectively, may be the same, and the widths of the lower regions 124La and 124Ua of the first and second vertical regions 124L and 124U, respectively, may be the same.

The upper region 124Lb of the first vertical region 124L and the lower region 124Ua of the second vertical region 124U may have widths different from each other. For example, the upper region 124Lb of the first vertical region 124L adjacent to the second vertical region 124U may have a first width W1, and the lower region 124Ua of the second vertical region 124U adjacent to the first vertical region 124L may have a second width W2 less than the first width W1.

In the vertical channel structure 124c, the width variation portion 124v may be a portion varying from the first width W1 of the upper region 124Lb of the first vertical region 124L to the second width W2 of the lower region 124Ua of the second vertical region 124U.

Any one of additional dielectric layer 155a among the additional dielectric layers 155 may cover upper and lower surfaces of the first intermediate gate horizontal pattern 158M1a positioned in a relatively upper portion in the first intermediate gate horizontal patterns 158M1, and may cover side surface of the first intermediate gate horizontal pattern 158M1a facing the vertical channel structure 124c. The width variation portion 124v of the vertical channel structure 124c may be disposed adjacent to a boundary between the intermediate interlayer insulation layer 114a and the additional dielectric layer 155a. For example, an upper surface of the width variation portion 124v of the vertical channel structure 124c may be coplanar with an upper surface of the additional dielectric layer 155a, and may face a lower surface of the intermediate interlayer insulation layer 114a. The intermediate interlayer insulation layer 114a may have the same thickness as remaining interlayer insulation layers 114.

In an example embodiment, the first vertical support structure 145 may have a variable width with a regular regularity in a vertical direction away from the lower structure 103, or may have a predictably variable width. For example, a width of the first vertical support structure 145 may gradually increase in a vertical direction Z away from the lower structure 103. For example, when viewed in cross-section, a sidewall of the first vertical support structure 145 may maintain a substantially constant angle with respect to the top surface of the lower structure 103 along the entire length of the sidewall.

In an example embodiment, the first vertical support structure 145 may have substantially the same width, from a lower portion thereof to an upper portion thereof. For example, when viewed in cross-section, the first vertical support structure 145 may have substantially vertical sidewalls.

Therefore, the first vertical support structure 145 may be formed without the width variation portion 124v in which a width varies between the upper and lower regions, such as the vertical channel structure 124c, and may thus have a cross-sectional structure different from that of the vertical channel structure 124c.

Among the interlayer insulation layers 114, the intermediate interlayer insulation layer 114a may be formed as a single layer. The embodiments are not limited thereto, but may be modified to include multiple layers. For example, FIG. 8B is a cross-sectional view illustrating a modified embodiment of the intermediate interlayer insulation layer 114a and the vertical channel structure 124c as illustrated in FIG. 8A.

Figure 8B:
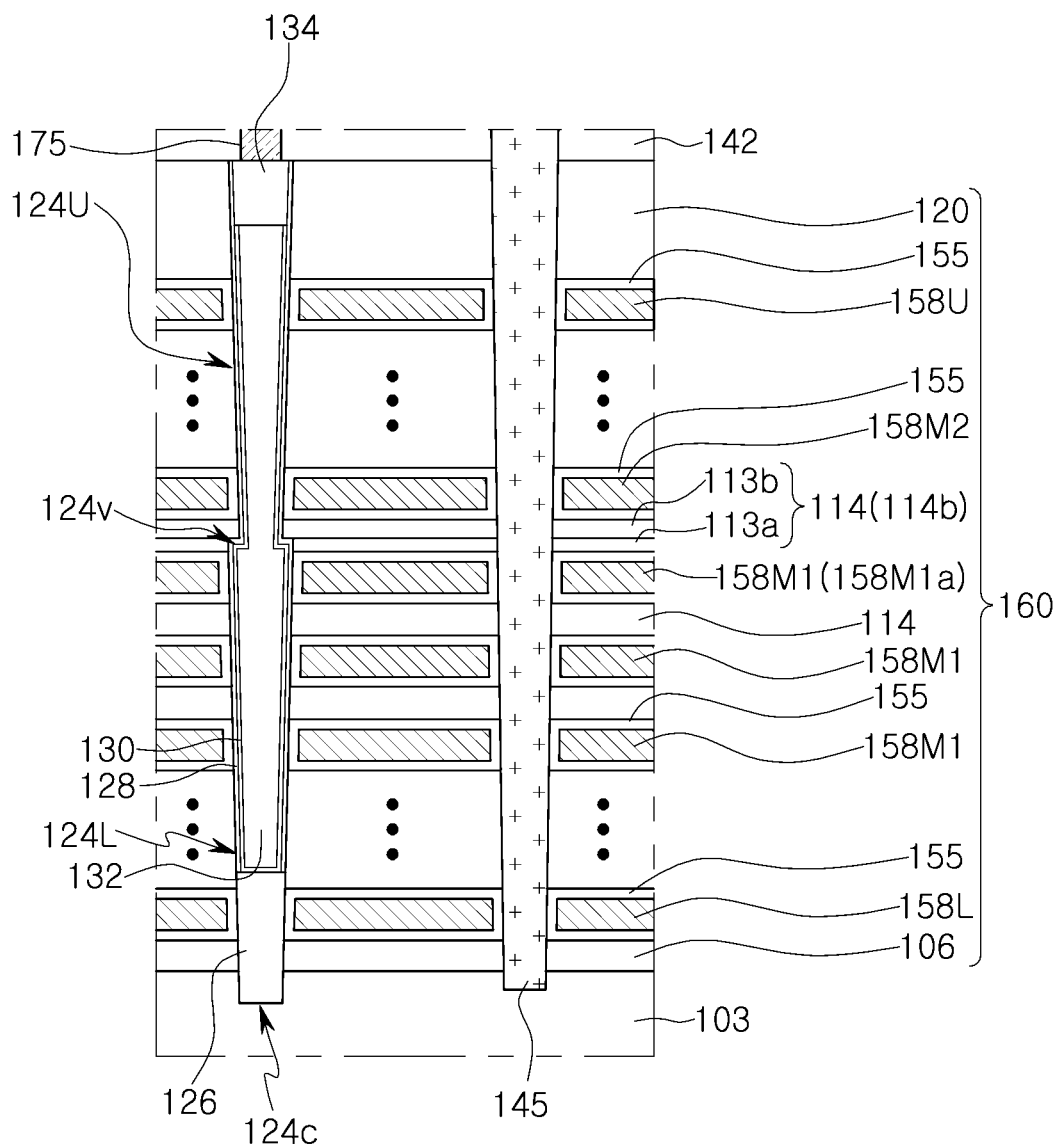
FIG. 8B is a cross-sectional view schematically illustrating a modified embodiment of a three-dimensional semiconductor device, according to an exemplary embodiment.

In a modified embodiment, referring to FIG. 8B, in the interlayer insulation layers 114, the intermediate interlayer insulation layer (e.g., intermediate interlayer insulation layer 114a in FIG. 8A) may be modified to be an intermediate interlayer insulation layer 114b including a first region 113a and a second region 113b on the first region 113a. The width variation portion 124v of the vertical channel structure 124c may be disposed adjacent to a boundary between the first region 113a and the second region 113b. For example, an upper surface of the width variation portion 124v of the vertical channel structure 124c may be coplanar with an upper surface of the first region 113a, and may face a lower surface of the second region 113b. The width variation portion 124v of the vertical channel structure 124c may be positioned on a higher vertical level than the first intermediate gate horizontal patterns 158M1. In the interlayer insulation layers 114, the intermediate interlayer insulation layer 114b, including the first and second regions 113a and 113b, may have the same thickness as remaining interlayer insulation layers 114. Therefore, the interlayer insulation layers 114 may be formed to have the same thickness as each other.

Figure 8C:
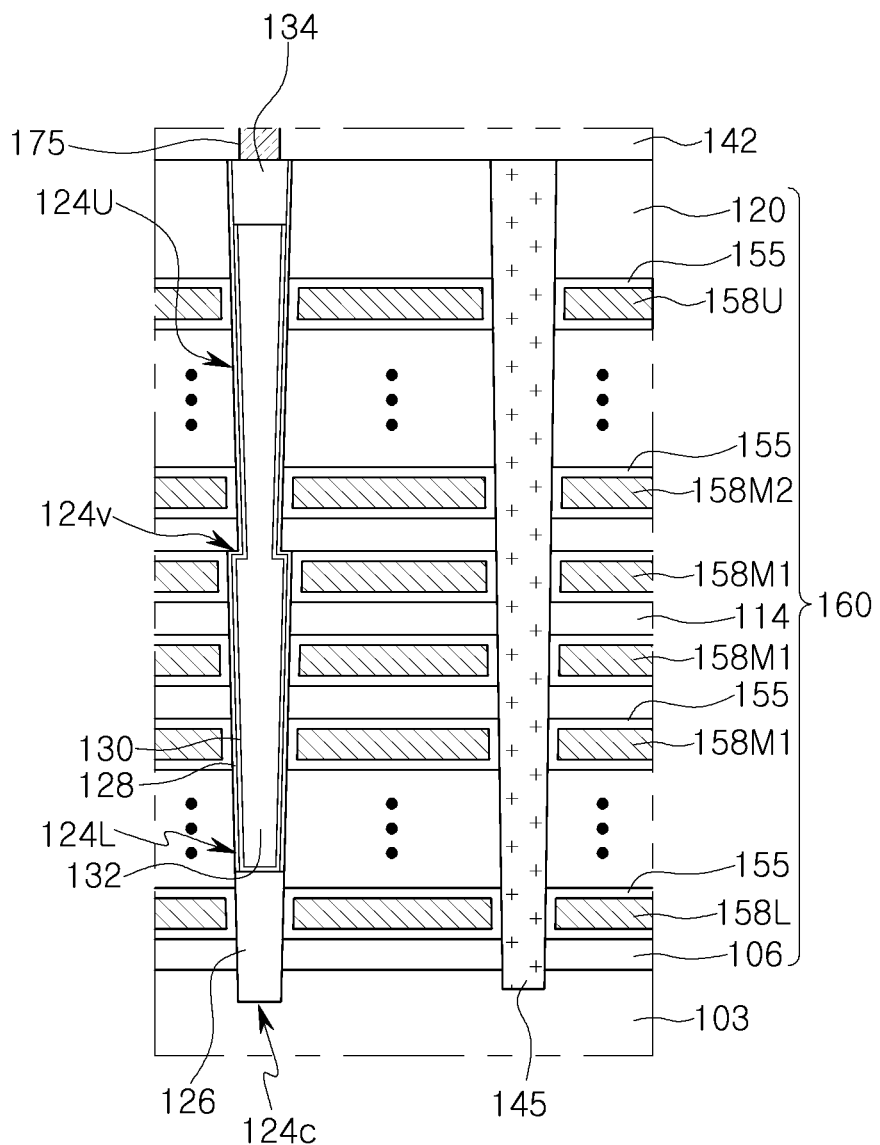
FIG. 8C is a cross-sectional view schematically illustrating a modified embodiment of a three-dimensional semiconductor device, according to an exemplary embodiment.

Referring again to FIG. 8A, the upper surface of the first vertical support structure 145 may be positioned on a vertical level higher than the upper surface of the vertical channel structure 124c. The embodiments are not limited thereto. FIG. 8C is a cross-sectional view illustrating a modified embodiment of the first vertical support structure 145 in FIG. 8A.

In a modified embodiment, referring to FIG. 8C, the first vertical support structure 145 may be modified to have an upper surface formed to be coplanar with the upper surface of the vertical channel structure 124c.

Referring again to FIGS. 2 to 7B, the first vertical support structures 145 described above will be described again.

Referring mainly to FIGS. 4 and 6B, with reference to FIGS. 2 to 7B, the first vertical support structures 145 may contact the separation structures 162. For example, sidewalls of the first vertical support structures 145 may contact sidewalls of the separation structures 162 for the entire vertical length of the first vertical support structures 145. When viewed in a plan view, the first vertical support structures 145 may be in a rectangular shape that contacts the separation structures 162 and extends in a width direction of the separation structures 162. The embodiments are not limited thereto. Hereinafter, various modified embodiments of the first vertical support structures 145 will be described with reference to FIGS. 9A to 9G, respectively. FIGS. 9A to 9G are plan views illustrating planar regions corresponding to FIG. 4 for explaining various modified embodiments of the first vertical support structures 145.

Figure 9A:
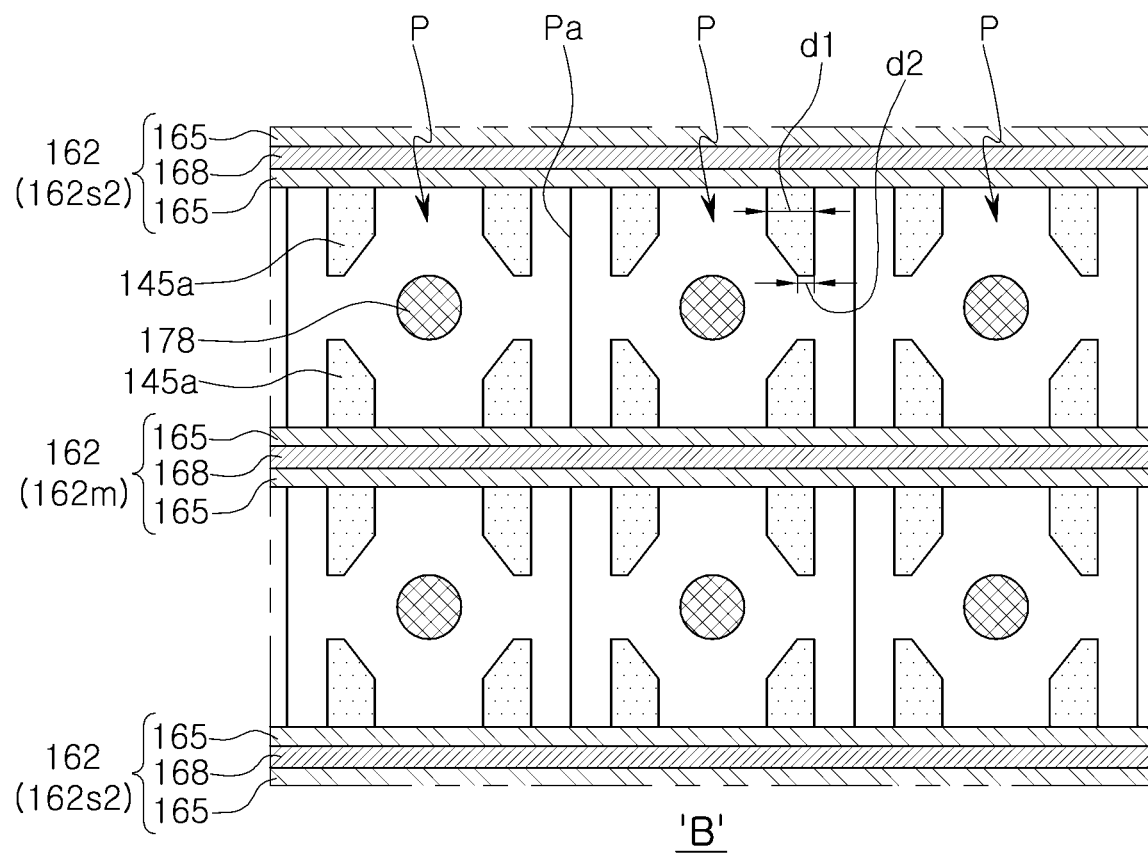
FIG. 9A is a plan view schematically illustrating a modified embodiment of a three-dimensional semiconductor device, according to an exemplary embodiment.

In a modified embodiment, referring to FIG. 9A, each of first vertical support structures 145a may be a pentagon, or shapes similar to a pentagon (e.g., a polygon having five linear sides). For example, each of the first vertical support structures 145a may extend in a second horizontal direction Y away from the separation structures 162 from a portion in contact with the separation structures 162 having a first width d1 (measured as a width in the first horizontal direction X), and may have a portion gradually decreasing from the first width d1 to a second width d2 to secure a portion of a pad region P, in which the contact plug 178 is positioned, as much as possible.

When viewed in a plan view, the first vertical support structures 145a may be mirror-symmetrical based on a boundary Pa between the pad regions P, and mirror-symmetrical between a pair of separation structures 162 adjacent to each other.

Figure 9B:
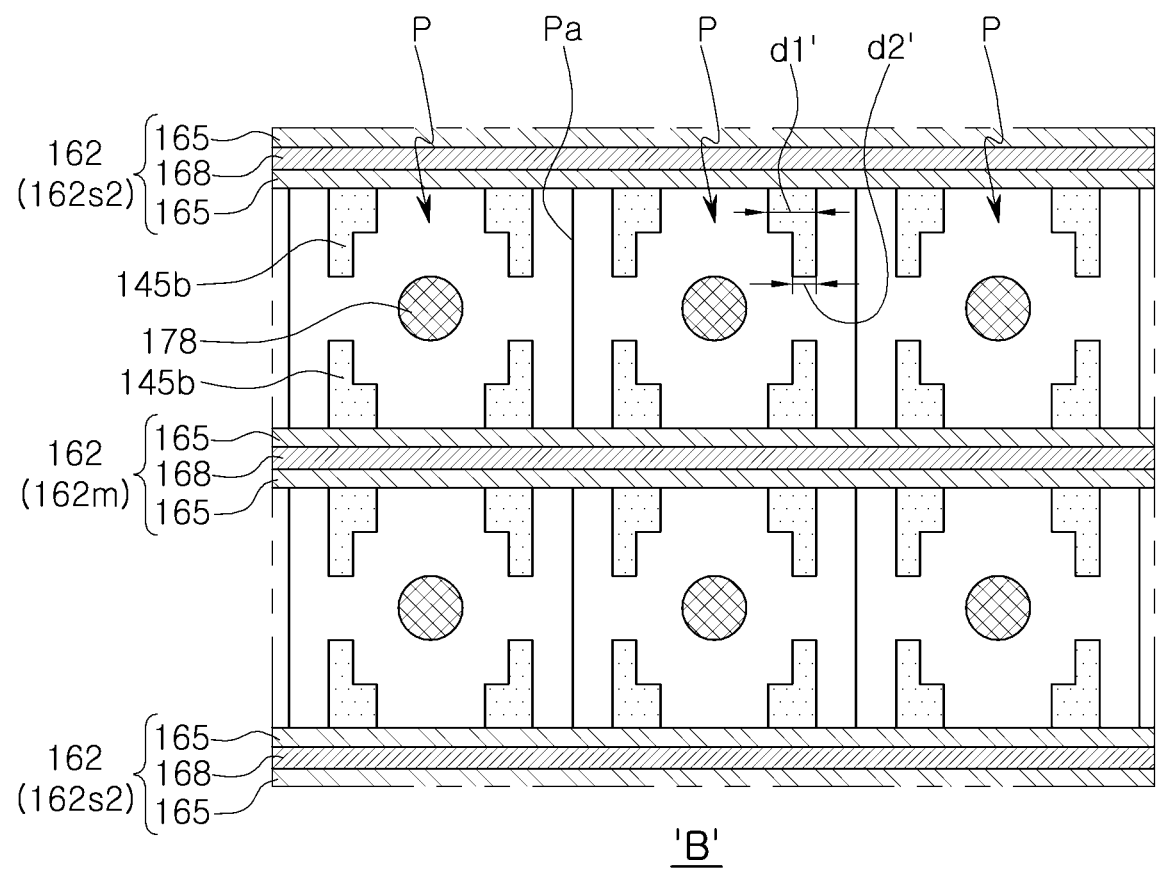
FIG. 9B is a plan view schematically illustrating a modified embodiment of a three-dimensional semiconductor device, according to an exemplary embodiment.

In another modified embodiment, referring to FIG. 9B, each of first vertical support structures 145b may have a first portion d1' having a first width, and a second portion d2' having a second width less than the first width and extending from a portion of the first portion d1' in a direction away from the separation structures 162. In each of the first vertical support structures 145b, the first portion d1' may be a portion in contact with the separation structures 162.

In each of the first vertical support structures 145b, the first portion d1' may have a rectangle, or shapes similar to a rectangle, and the second portion d2' may have a rectangle, or shapes similar to a rectangle.

Figure 9C:
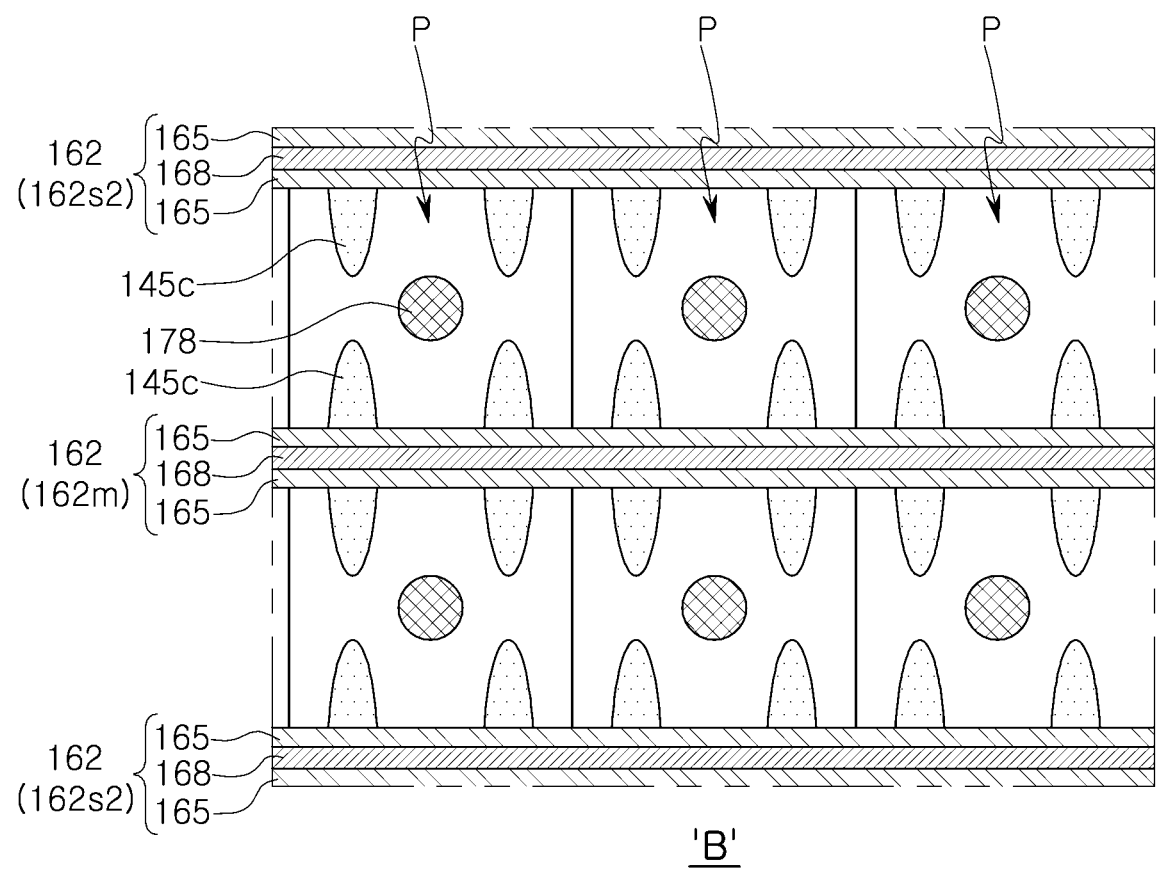
FIG. 9C is a plan view schematically illustrating a modified embodiment of a three-dimensional semiconductor device, according to an exemplary embodiment.

In another modified embodiment, referring to FIG. 9C, each of first vertical support structures 145c may be an elongated semicircular shape in a direction away from the separation structures 162. For example, the semicircular shapes of the first vertical support structures 145c may be elongated in the second horizontal direction Y and perpendicular to the first horizontal direction X.

Figure 9D:
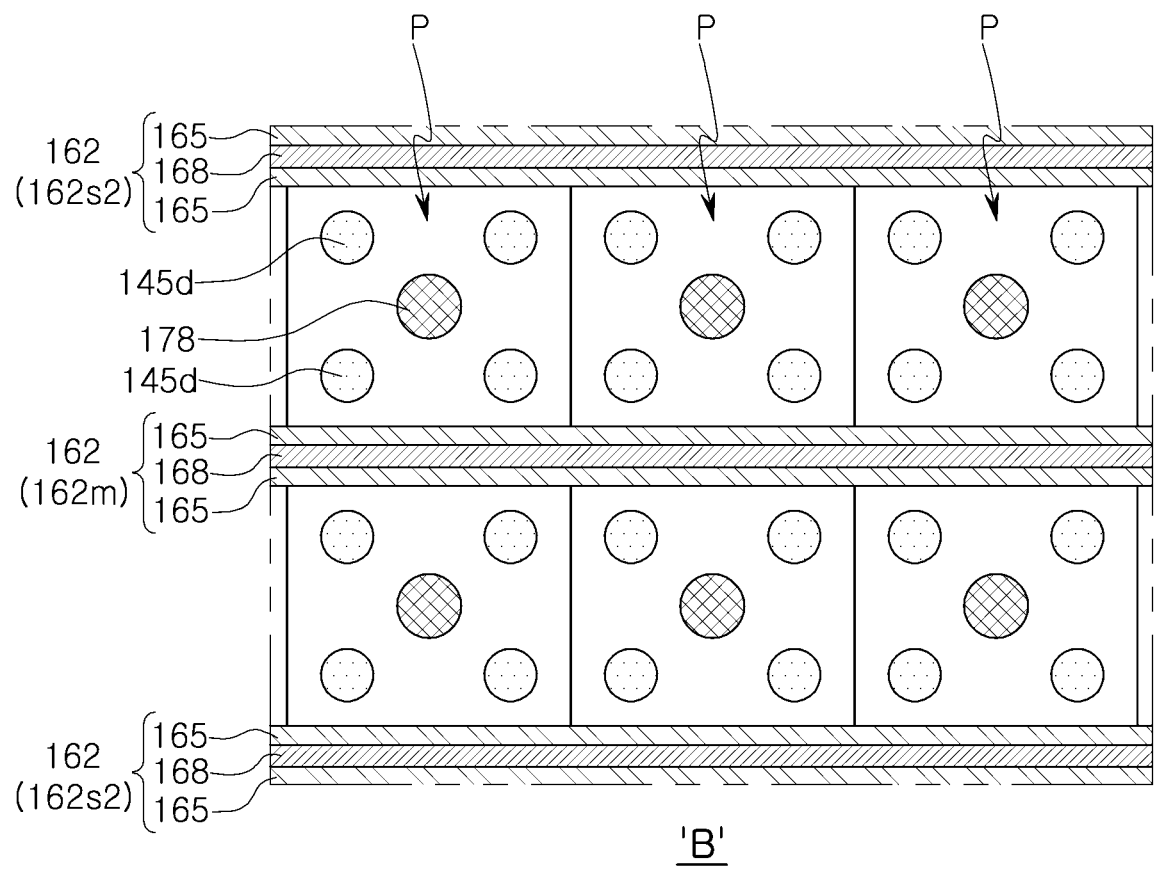
FIG. 9D is a plan view schematically illustrating a modified embodiment of a three-dimensional semiconductor device, according to an exemplary embodiment.

In another modified embodiment, referring to FIG. 9D, each of first vertical support structures 145d may be spaced apart from the separation structures 162. For example, the first vertical support structures 145d may not be in contact with the separation structures 162. In a plan view, each of the first vertical support structures 145d may be circular. In some embodiments, the first vertical support structures 145d may be arranged symmetrically around first contact plugs 178.

Figure 9E:
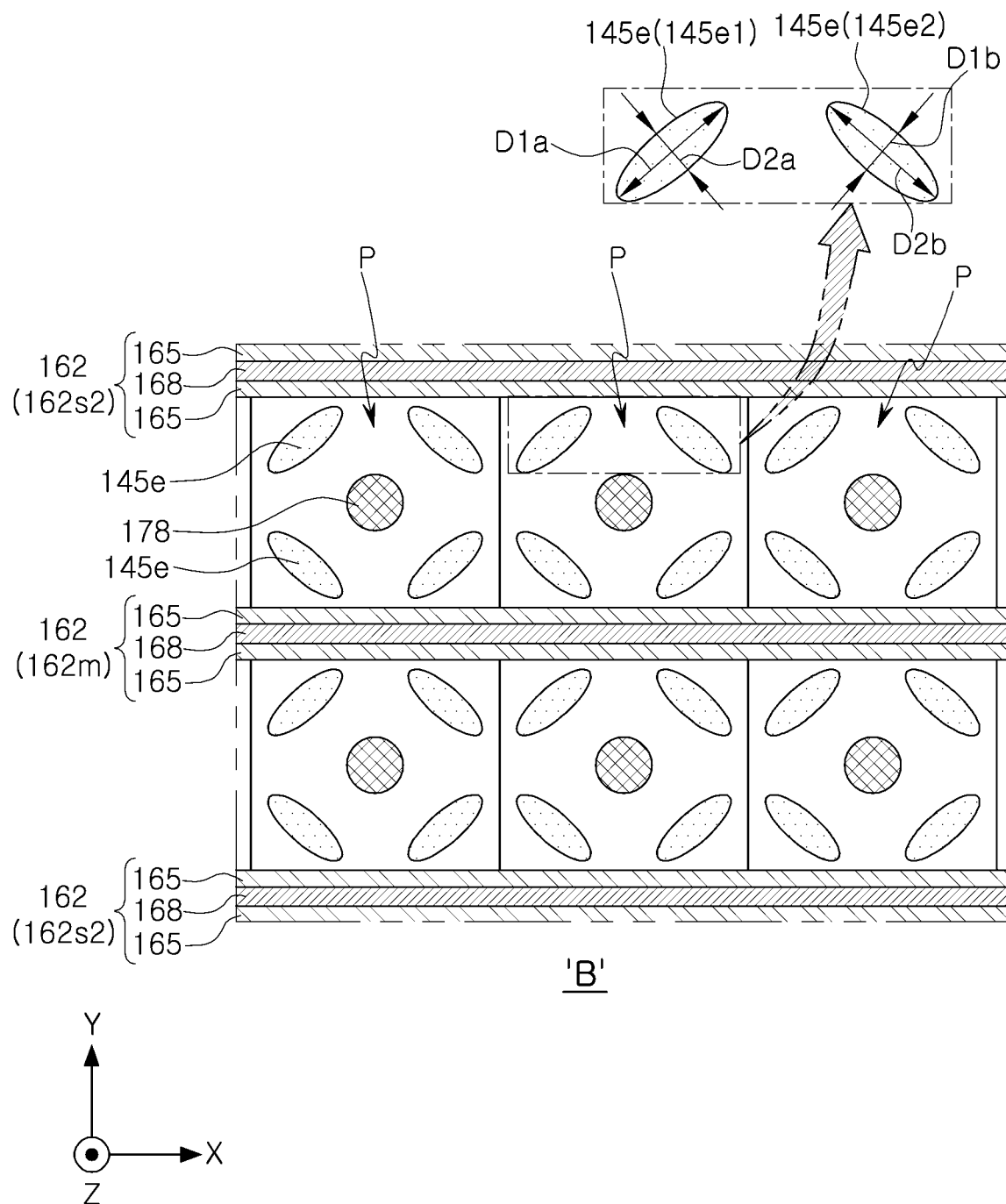
FIG. 9E is a plan view schematically illustrating a modified embodiment of a three-dimensional semiconductor device, according to an exemplary embodiment.

In another modified embodiment, referring to FIG. 9E, each of first vertical support structures 145e may be spaced apart from the separation structures 162, and may have elongated elliptical shapes. For example, the first vertical support structures 145e may include a first support 145e1 and a second support 145e2 having longitudinal axis directions different from each other. For example, the first support 145e1 may have an elongated shape having a first short axis direction D2a and a first long axis direction D1a intersecting the first short axis direction D2a, and the second support 145e2 may have an elongated shape having a second short axis direction D2b and a second long axis direction D1b intersecting the second short axis direction D2b. The first long axis direction D1a and the second long axis direction D1b may be directions intersecting each other. In some embodiments, the first and second long axis directions D1a and D1b may be perpendicular to one another, and the first and second short axis directions D2a and D2b may be perpendicular to one another. The first short axis direction D2a and the second short axis direction D2b may extend in a direction toward a neighboring first contact plug 178.

The first long axis direction D1a, the second long axis direction D1b, the first short axis direction D2a, and the second short axis direction D2b may be inclined against both the longitudinal axis direction of the separation structures 162 (e.g., the first horizontal direction X) and the width direction of the separation structures 162 (e.g., the second horizontal direction Y).

Figure 9F:
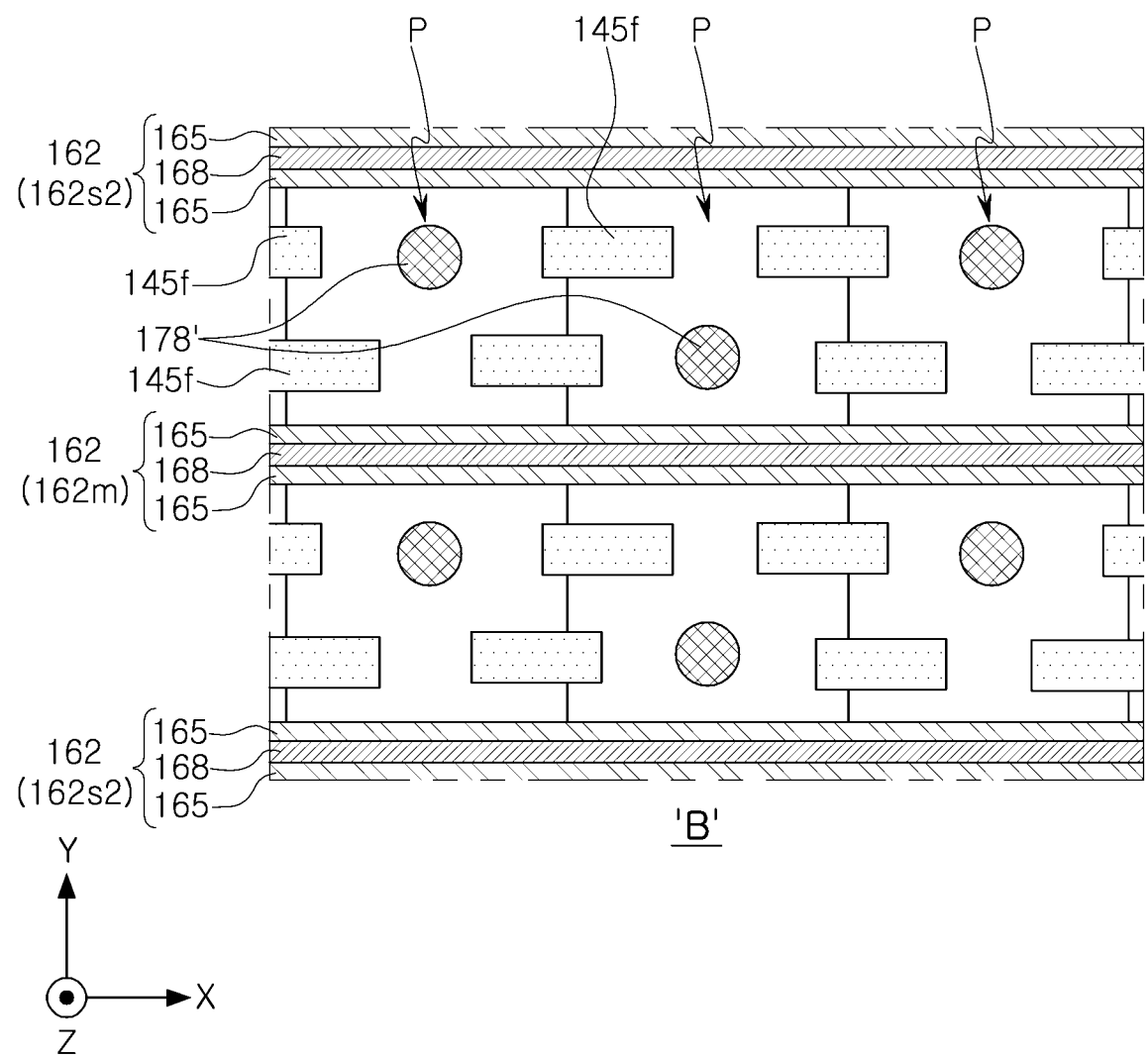
FIG. 9F is a plan view schematically illustrating a modified embodiment of a three-dimensional semiconductor device, according to an exemplary embodiment.
Figure 9G:
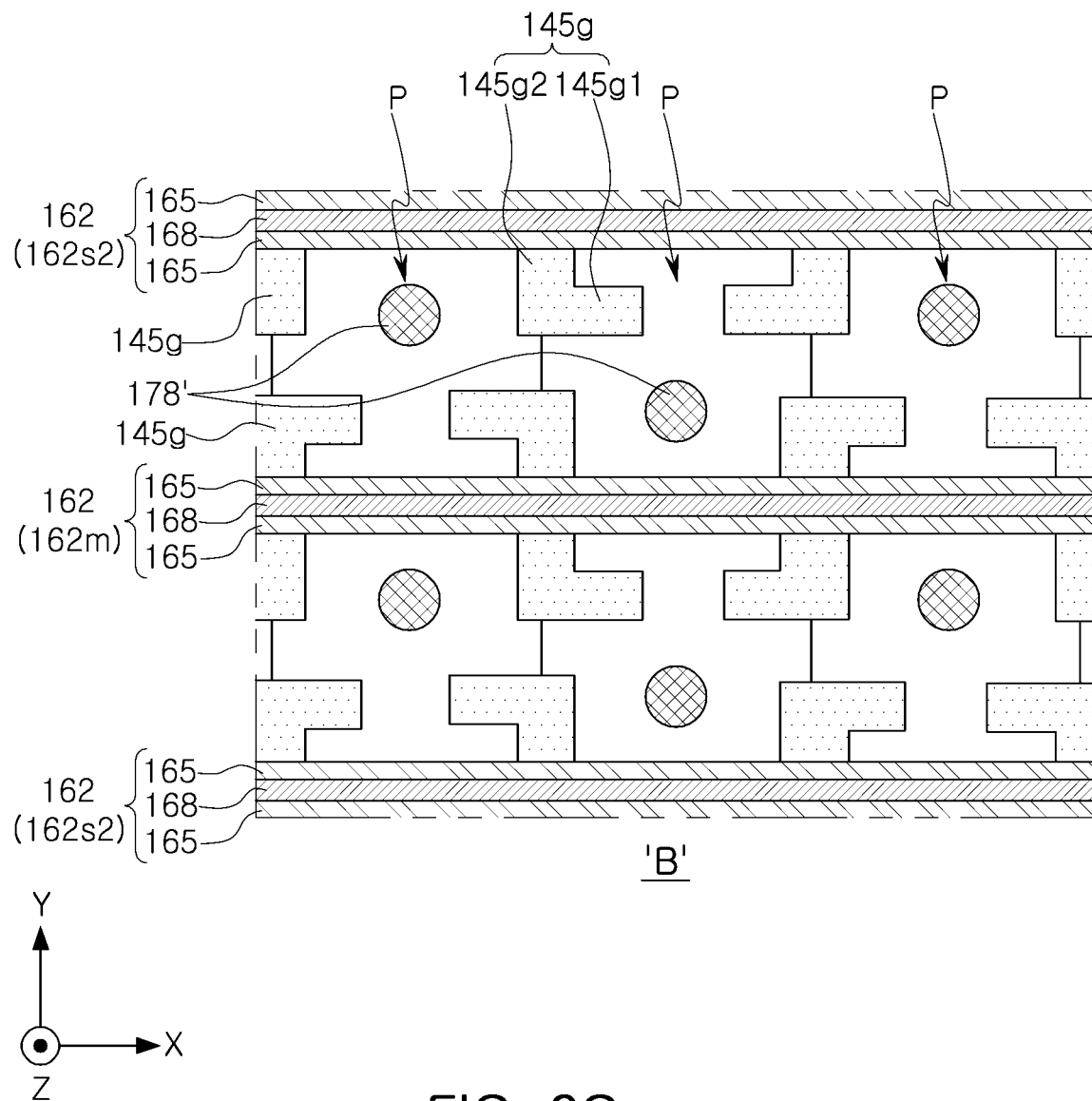
FIG. 9G is a plan view schematically illustrating a modified embodiment of a three-dimensional semiconductor device, according to an exemplary embodiment.

Referring mainly to FIGS. 3 and 4, with reference to FIGS. 2 to 7B, when viewed in a plan view, the first contact plugs 178 may be arranged in order along an imaginary straight line in the first horizontal direction X. For example, center points of the first contact plugs 178 between adjacent separation structures 162 may be aligned along the imaginary straight line in the first horizontal direction X. The embodiments are not limited thereto, but may be modified to have first contact plugs 178' zigzagged in the first horizontal direction X, as illustrated in FIGS. 9F and 9G. The first vertical support structures that may be modified, together with the first contact plugs 178' that may be zigzagged as described above, will now be described with reference to FIGS. 9F and 9G, respectively.

In a modified embodiment, referring to FIG. 9F, first contact plugs 178' may be zigzagged in the first horizontal direction X. For example, a portion of the zigzagged first contact plugs 178' may be closer to or biased toward the main separation structure 162m, and the remainder thereof may be closer to or biased toward the second auxiliary separation structure 162s2, between a pair of separation structures adjacent to each other among the separation structures 162 (e.g., between any one of the main separation structures 162m and any one of the second auxiliary separation structures 162s2). For example, assuming an imaginary line extending along the first horizontal direction X and centered between two adjacent separation structures 162, a first portion of the first contact plugs 178' may be disposed between the centered imaginary line and one of the adjacent separation structures 162, and a second portion of the first contact plugs 178' may be disposed between the centered imaginary line and the other of the adjacent separation structures 162.

Each of the first vertical support structures 145f may be spaced apart from the separation structures 162, and may be disposed around the first contact plugs 178' to be zigzagged.

In an example embodiment, the first vertical support structures 145f may be elongated in the first horizontal direction X, or may be rectangular in the first horizontal direction X. In some embodiments, a longitudinal axis of each of the first vertical support structures 145f may extend in the first horizontal direction X, and may be aligned with central points of the first contact plugs 178'.

In an example embodiment, each of the first vertical support structures 145f may overlap the pad region P, and may extend into a boundary region between the pad regions P. Each of the first vertical support structures 145f may overlap two pad regions P. An area overlapping any one of the two pad regions P may be relatively large. In this case, the term 'overlap' or 'overlapping' may refer to a shape to be viewed in a plan view. Therefore, a region 'overlapping,' when viewed in a plan view described herein, can be understood as an area in which the first vertical support structures 145f pass through the pad regions P.

In an example embodiment, based on one first contact plug 178' among the first contact plugs 178', the first vertical support structures 145f arranged in the first horizontal direction X may include a pair of first vertical support structures 145f facing each other in the first horizontal direction X with a first contact plug 178' therebetween.

Figure 10:
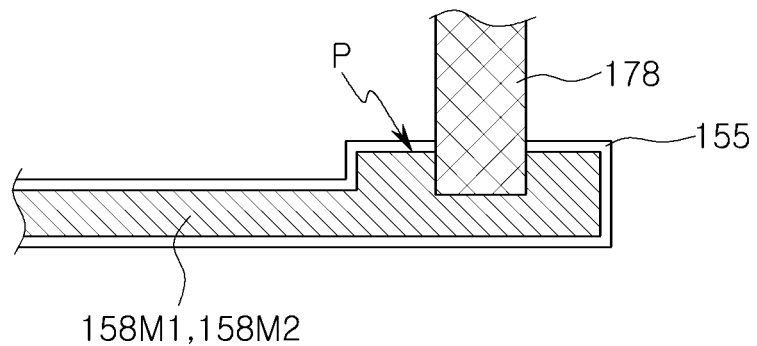
FIG. 10 is a cross-sectional view schematically illustrating a modified embodiment of a three-dimensional semiconductor device, according to an exemplary embodiment.

In a modified embodiment, referring to FIG. 9G, first vertical support structures 145g may be disposed around the first contact plugs 178,' which are zigzagged similarly to that illustrated in FIG. 9F, and may be in contact with the separation structures 162. For example, the first vertical support structures 145g may be disposed in positions corresponding to the first vertical support structures 145f illustrated in FIG. 9F, and may include a first portion 145g1 spaced apart from the separation structures 162, and a second portion 145g2 extending from the first portion 145g1 to contact a separation structure 162 relatively closer thereto among the separation structures 162. Referring again to FIGS. 2 to 7B, each of the gate horizontal patterns 158L, 158M1, 158M2, and 158U may have substantially the same thickness as each other in the memory array region MA and the extension region EA. For example, in any one of horizontal pattern among the gate horizontal patterns 158L, 158M1, 158M2, and 158U, a thickness of the pad region positioned in the extension region EA may be substantially the same as a thickness of the horizontal pattern positioned in the memory array region MA. The embodiments are not limited thereto, and the thickness of the pad region may be greater than other portions of the gate horizontal patterns 158L, 158M1, 158M2, and 158U. An embodiment having a pad region having increased thickness in this manner will now be described with reference to FIG. 10. FIG. 10 is a conceptual cross-sectional view illustrating the thicknesses of the pad regions P of any one of intermediate gate horizontal patterns 158M1 and 158M2 among the first intermediate gate horizontal patterns 158M1 and the second intermediate gate horizontal patterns 158M2.

Referring to FIG. 10, in any one of intermediate gate horizontal patterns 158M1 and 158M2, a thickness of a pad region P may be relatively increased, compared with the other portions. A first contact plug 178 may contact the pad region P having the increased thickness. The pad region P having the increased thickness may prevent the first contact plug 178 from passing through the pad region P.

Figure 11:
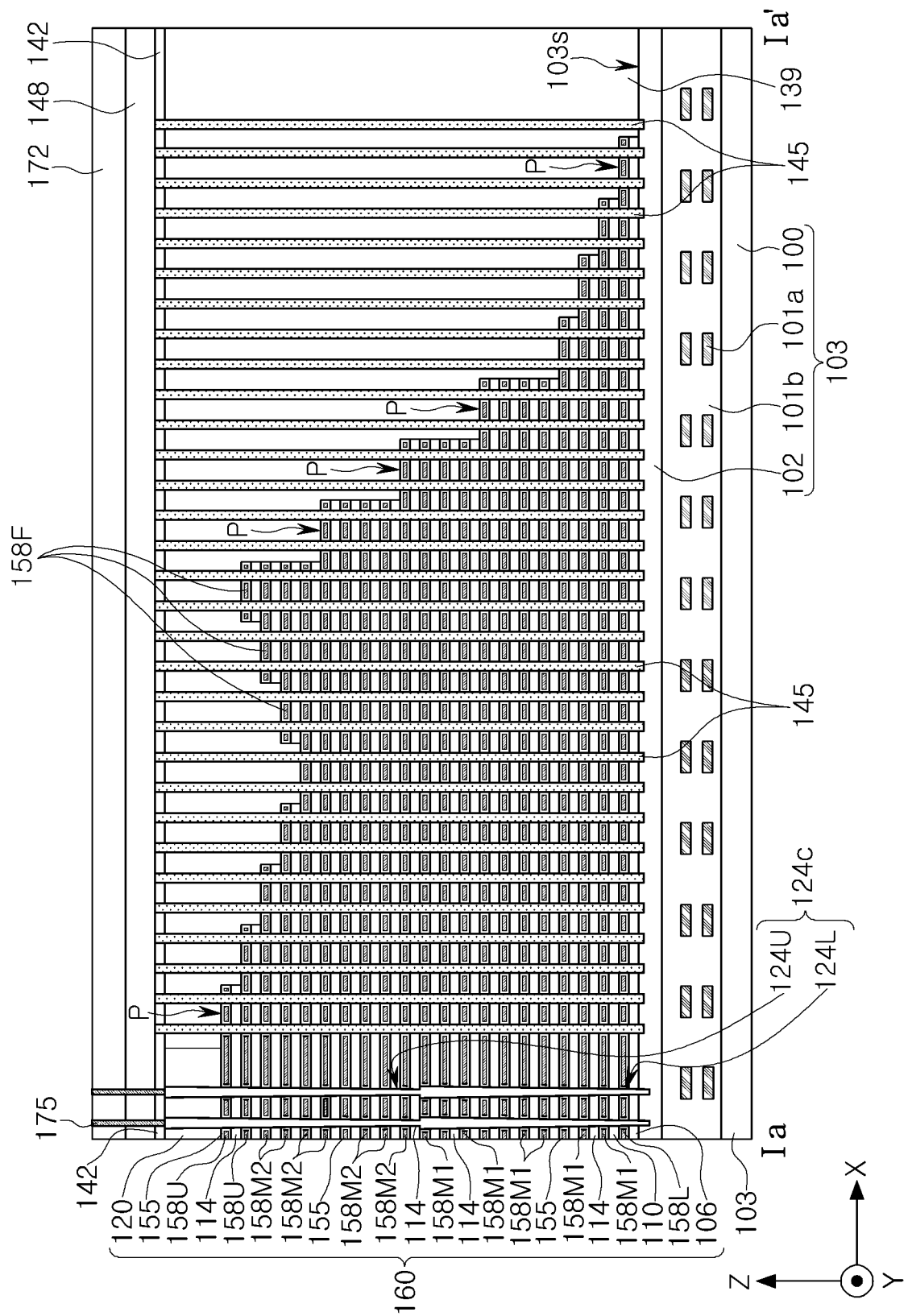
FIG. 11 is a cross-sectional view schematically illustrating a modified embodiment of a three-dimensional semiconductor device, according to an exemplary embodiment.
Figure 12:
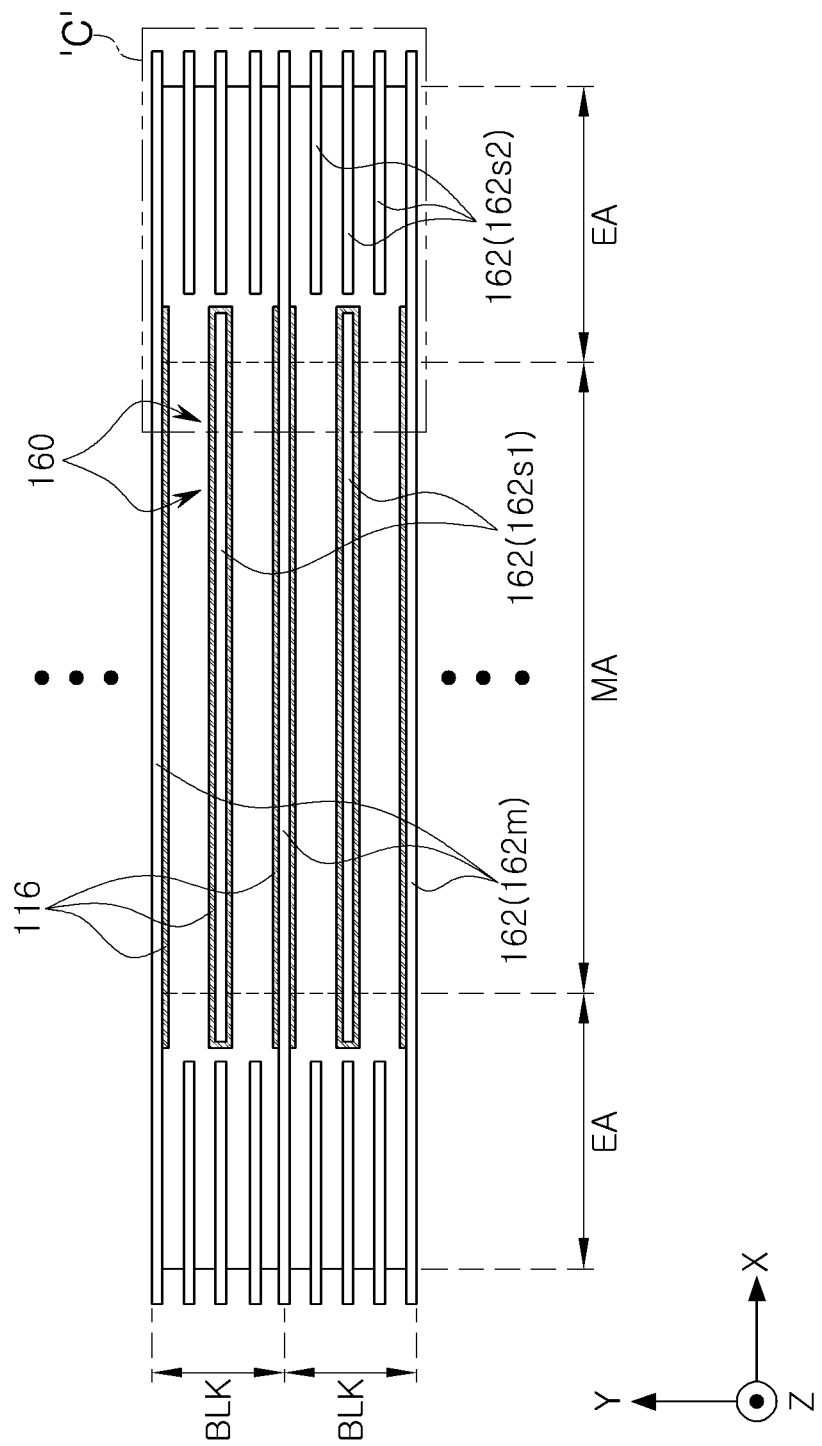
FIGS. 12 to 15 are views illustrating a modified embodiment of a three-dimensional semiconductor device, according to an exemplary embodiment.

Referring again to FIGS. 2 to 7B, the lower structure 103 may be formed of a semiconductor substrate in a bulk form. The embodiments are not limited thereto, and the lower structure 103 may be formed of a plurality of layers. An example embodiment of the lower structure 103 that may be formed of a plurality of layers as described above will now be described with reference to FIG. 11. FIG. 11 is a cross-sectional view illustrating a modified embodiment of the lower structure 103, which may correspond to the cross-sectional view of FIG. 5A.

Referring to FIG. 11, a lower structure 103 may include a lower substrate 100, a peripheral circuit structure 101a disposed on the lower substrate 100, an insulation structure 101b covering the peripheral circuit structure 101a, and an upper substrate 102 on the insulation structure 101b. The lower substrate 100 may be a single crystal silicon substrate, and the upper substrate 102 may be a polysilicon substrate.

Figure 13:
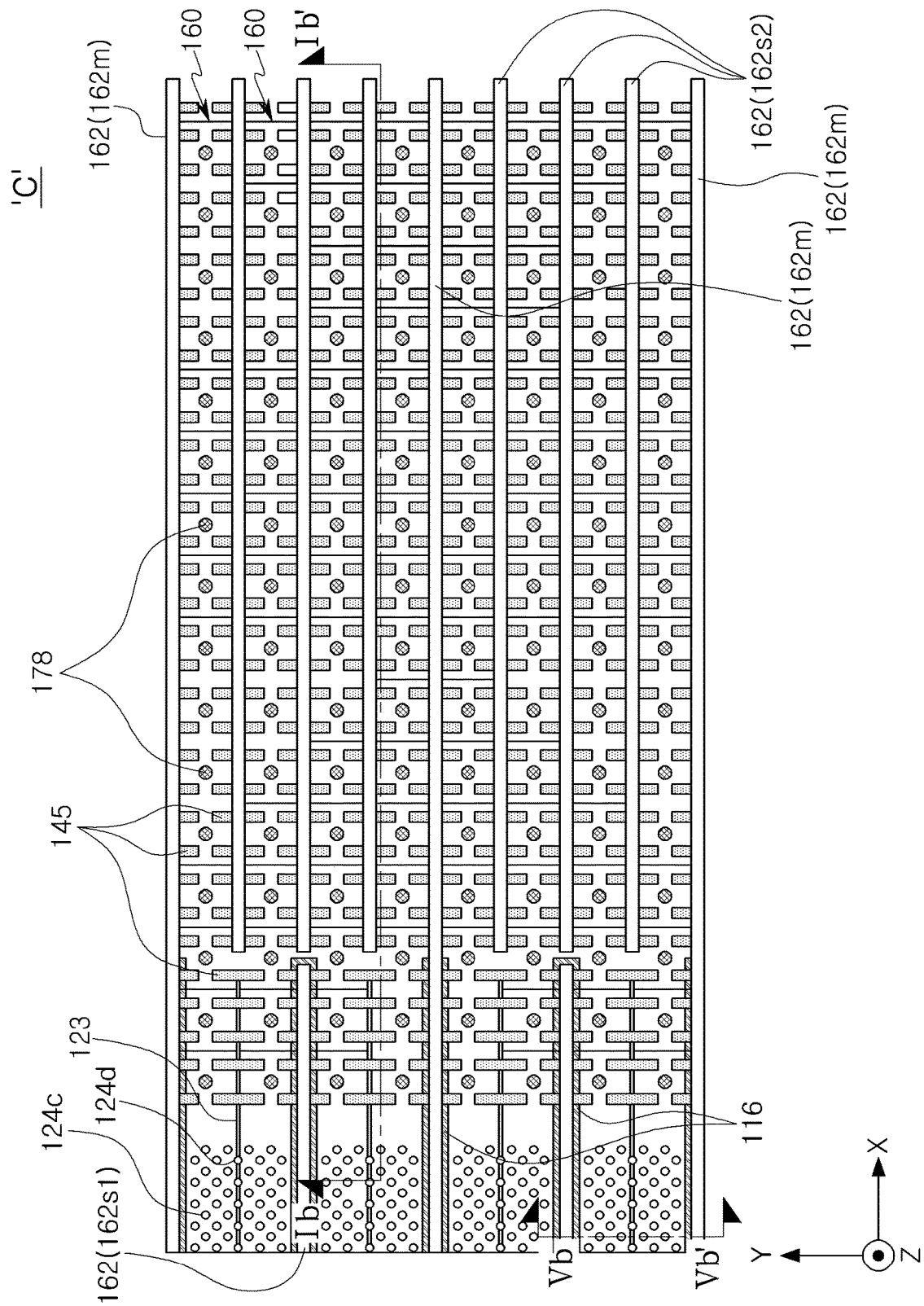
Figure 14A:
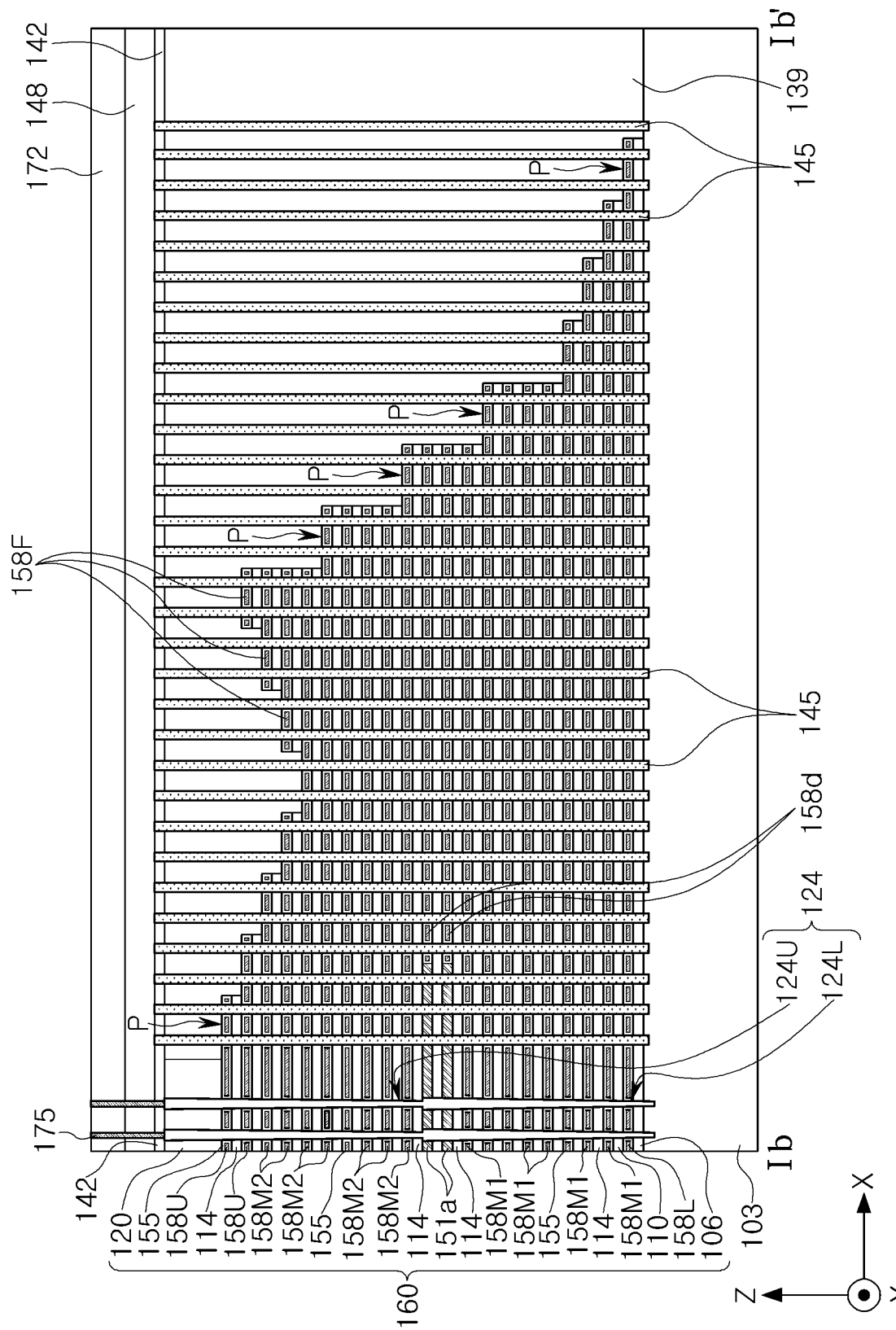
Figure 14B:
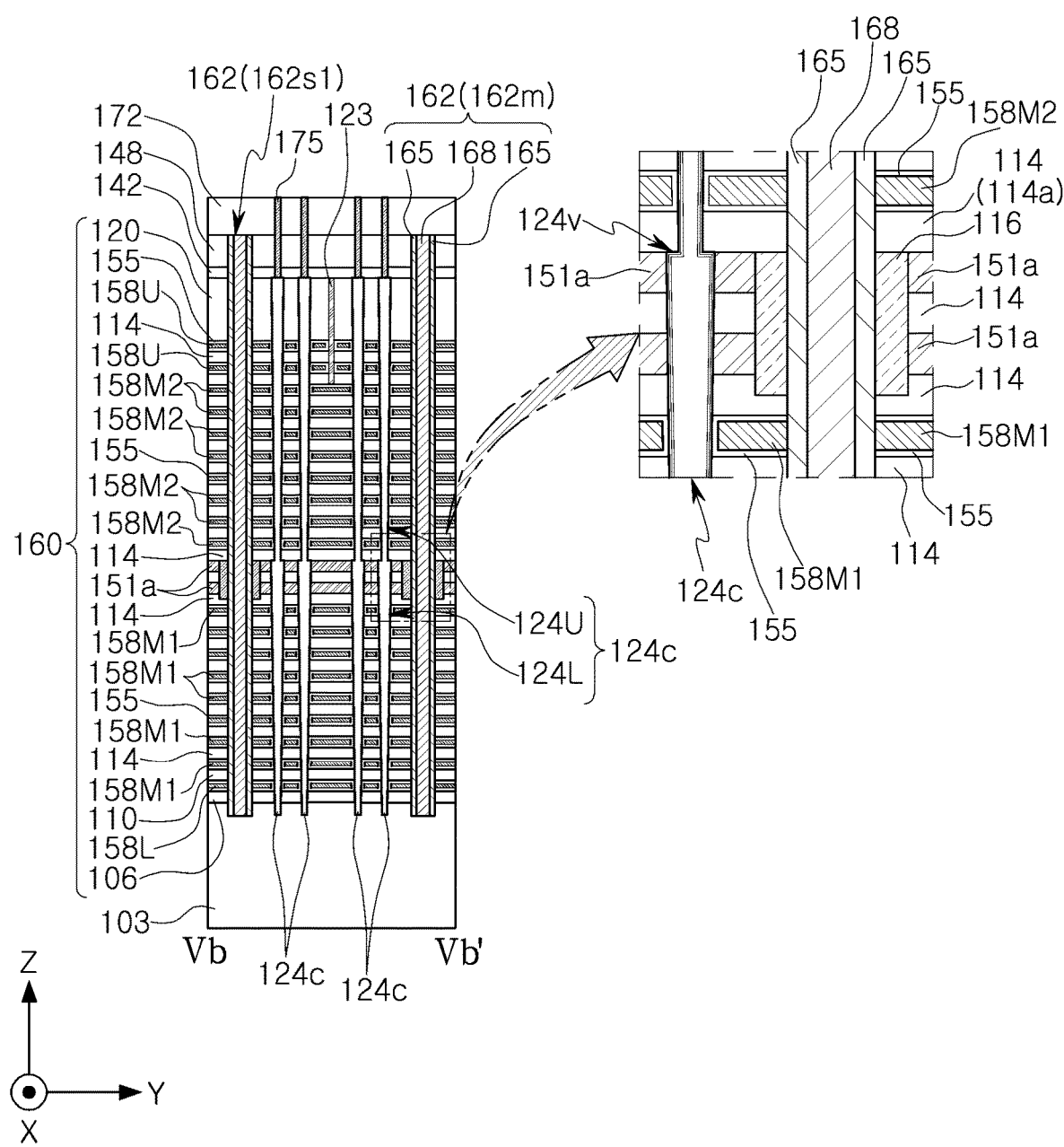
Figure 15:
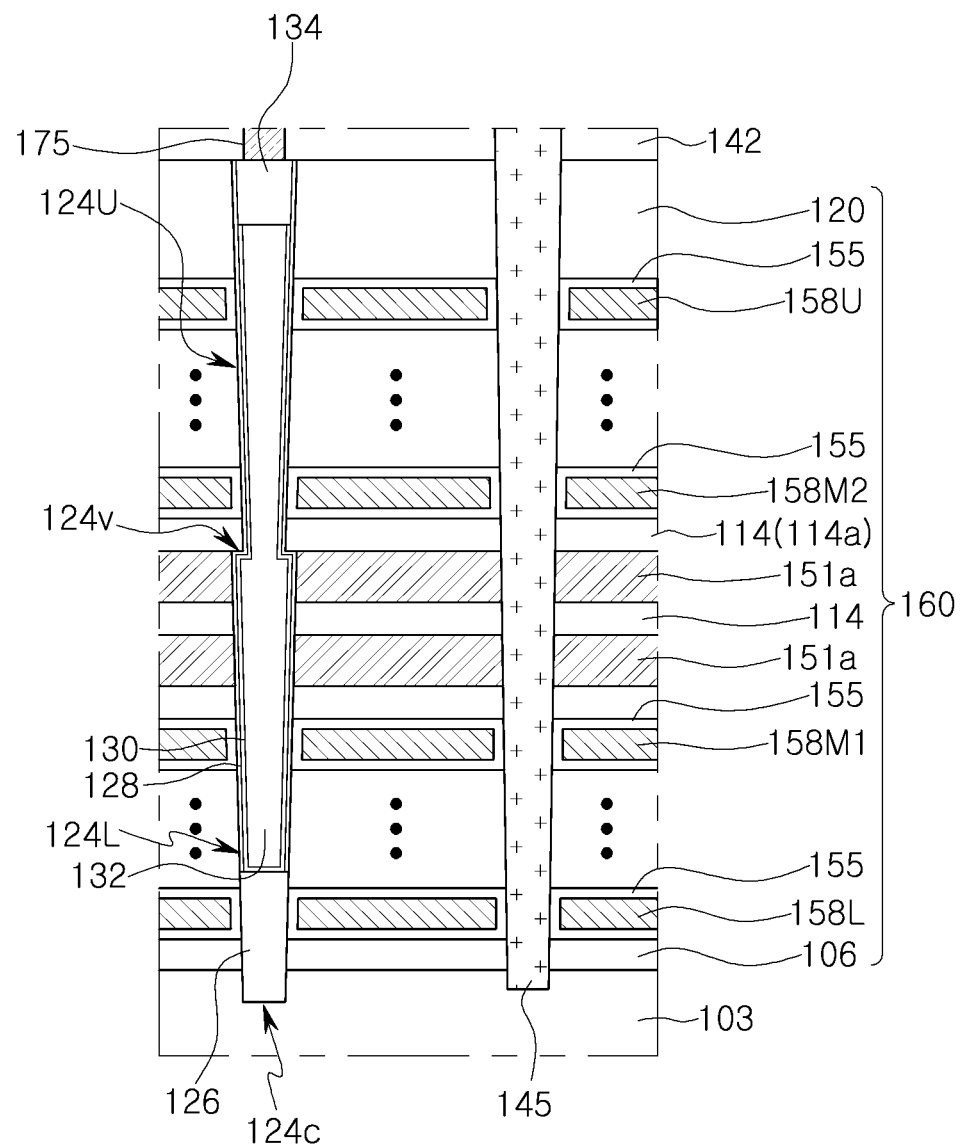

Next, a modified embodiment of a three-dimensional semiconductor device according to one example embodiment will be described with reference to FIGS. 12 to 15. In FIGS. 12 to 16B, FIG. 12 is a conceptual plan view illustrating a three-dimensional semiconductor device according to an example embodiment; FIG. 13 is an enlarged plan view of a region indicated by 'C' in FIG. 12; FIG. 14A is a cross-sectional view illustrating a region taken along line Ib-Ib' in FIG. 13; FIG. 14B is a cross-sectional view illustrating a region taken along line Vb-Vb' in FIG. 13; and FIG. 15 is a cross-sectional view conceptually illustrating a portion of components. Hereinafter, a three-dimensional semiconductor device described with reference to FIGS. 12 to 15 may further include a portion of components in a different manner to the three-dimensional semiconductor device described with reference to FIGS. 2 to 7B, and the constituent elements constituting the three-dimensional semiconductor device described above may be partially modified with reference to FIGS. 2 to 7B. Therefore, the same components among the components described with reference to FIGS. 2 to 7B will be referred to without further explanation, and only modified components will be described.

Referring to FIGS. 12 to 15, a portion of one or a plurality of first intermediate gate horizontal patterns positioned in a relatively upper portion among the first intermediate gate horizontal patterns (e.g., first intermediate gate horizontal patterns 158M1 in FIGS. 2 to 7B) may be replaced by a buffer horizontal pattern 151a. The buffer horizontal pattern 151a may be disposed between the remaining first intermediate gate horizontal patterns 158M1 and the second intermediate gate horizontal patterns 158M2.

A dummy intermediate gate horizontal pattern 158d may be disposed to have an end portion facing the buffer horizontal pattern 151a, and may be positioned on the same vertical level as the buffer horizontal pattern 151a.

Protective patterns 116 may be disposed between the separation structures 162 and the buffer horizontal pattern 151a. The protective patterns 116 may be formed of a material having an etch selectivity with respect to the buffer horizontal pattern 151a. For example, the buffer horizontal patterns 151a may be formed of an insulating material such as silicon nitride or the like, and the protective patterns 116 may be formed of an insulating material such as silicon oxide. Alternatively, the buffer horizontal patterns 151a may be formed of a polysilicon material, and the protection patterns 116 may be formed of an insulating material such as silicon oxide.

In an example embodiment, the protection patterns 116 may be disposed on side surfaces of main separation structures 162m and first auxiliary separation structures 162s1 in a memory array region MA, and may extend into a portion of the extension region EA.

In an example embodiment, the buffer horizontal pattern 151a may be positioned between the protection patterns 116. Upper surfaces of the protection patterns 116 may be coplanar with upper surfaces of an uppermost buffer horizontal pattern 151a. Lower surfaces of the protection patterns 116 may be at a lower vertical level than lower surfaces of a lowermost buffer horizontal pattern 151a.

The width variation portion 124v of the vertical channel structures 124c as described in FIGS. 2 to 7B may be disposed adjacent to an upper surface of the buffer horizontal pattern 151a, as illustrated in FIGS. 14B and 15.

In embodiments, a portion of one or a plurality of first intermediate gate horizontal patterns positioned in a relatively upper portion among the first intermediate gate horizontal patterns (e.g., first intermediate gate horizontal patterns 158M1 in FIGS. 2 to 7B), as illustrated in FIGS. 2 to 7B, may be replaced by a buffer horizontal pattern 151a formed of an insulating material. Therefore, electrical effects or effects by electric field, which may occur in one or a plurality of first intermediate gate horizontal patterns positioned in a relatively upper portion among the first intermediate gate horizontal patterns (e.g., first intermediate gate horizontal patterns 158M1 in FIGS. 2 to 7B) including a conductive material, and the width variation portion 124v of the vertical channel structures 124c, may be prevented, such that the performance of the semiconductor device may thus be improved.

The intermediate interlayer insulation layer 114a of the interlayer insulation layers 114 as described in FIGS. 2 to 7B may be positioned between the buffer horizontal pattern 151a and the second intermediate gate horizontal patterns 158M2. For example, the intermediate interlayer insulation layer 114a of the interlayer insulation layers 114 may be disposed above the uppermost buffer horizontal pattern 151a.

In the vertical channel structure 124c as described in FIGS. 2 to 7B, the width variation portion 124v may be disposed adjacent to a boundary between the intermediate interlayer insulation layer 114a and the buffer horizontal pattern 151a. For example, the width variation portion 124v may be disposed adjacent to a lower surface of the intermediate interlayer insulation layer 114a or adjacent to an upper surface of the buffer horizontal pattern 151a.

Figure 16:
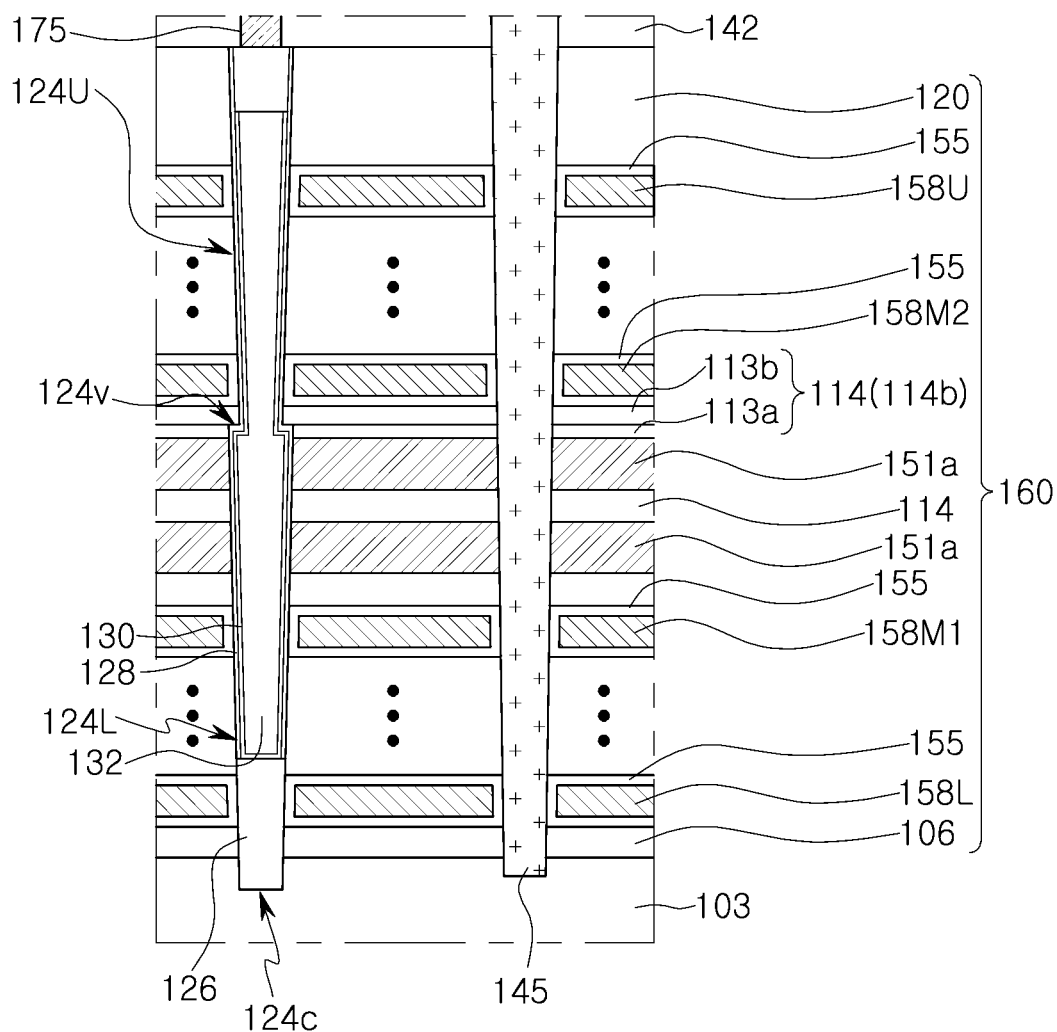
FIG. 16 is a cross-sectional view schematically illustrating a modified embodiment of a three-dimensional semiconductor device, according to an exemplary embodiment.

In an example embodiment, the width variation portion 124v may be disposed on substantially the same vertical level as the lower surface of the intermediate interlayer insulation layer 114a. For example, an upper surface of the width variation portion 124v of the vertical channel structure 124c may be coplanar with an upper surface of the buffer horizontal pattern 151a, and may face a lower surface of the intermediate interlayer insulation layer 114a. The embodiments are not limited thereto, but may be modified as illustrated in FIG. 16. FIG. 16 is a cross-sectional view illustrating a modified embodiment of the intermediate interlayer insulation layer 114a and the vertical channel structure 124c in FIG. 15.

In a modified embodiment, referring to FIG. 16, in the interlayer insulation layers 114, the intermediate interlayer insulation layer 114a may be modified to an intermediate interlayer insulation layer 114b including a first region 113a and a second region 113b on the first region 113a, and a width variation portion 124v of the vertical channel structure 124c may be positioned on a higher vertical level than an upper surface of the buffer horizontal pattern 151a. For example, the width variation portion 124v of the vertical channel structure 124c may be disposed adjacent to a boundary between the first region 113a and the second region 113b. For example, an upper surface of the width variation portion 124v of the vertical channel structure 124c may be coplanar with an upper surface of the first region 113a, and may face a lower surface of the second region 113b.

Figure 17:
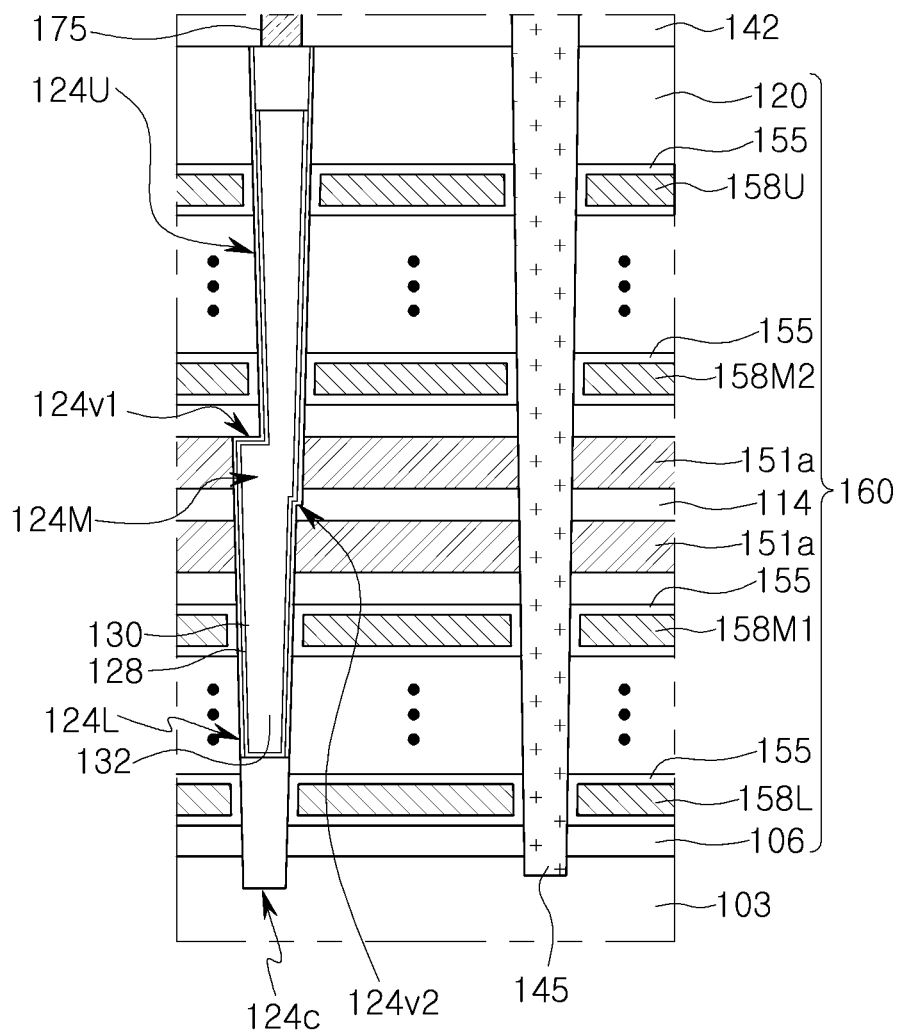
FIG. 17 is a cross-sectional view schematically illustrating a modified embodiment of a three-dimensional semiconductor device, according to an exemplary embodiment.

Referring again to FIGS. 12 to 15, the vertical channel structure 124c may include the first vertical region 124L, the second vertical region 124U on the first vertical region 124L, and the width variation portion 124v varying in width between the first and second vertical regions 124L and 124U. The embodiments are not limited thereto, and may be modified as illustrated in FIG. 17. FIG. 17 is a cross-sectional view illustrating a modified embodiment of the vertical channel structure 124c in FIG. 15.

In a modified embodiment, referring to FIG. 17, a vertical channel structure 124c may include a first vertical region 124L, a second vertical region 124U on the first vertical region 124L, and a third vertical region 124M between the first and second vertical regions 124L and 124U. For example, the third vertical region 124M may be on the first vertical region 124L, and the second vertical region 124U may be on third vertical region 124M.

In embodiments, the first vertical region 124L may be referred to as a 'lower vertical region,' the second vertical region 124U may be referred to as an 'upper vertical region,' and the third vertical region 124M may be referred to as an 'intermediate vertical region.' Hereinafter, the first vertical region 124L will be referred to as a 'lower vertical region,' the second vertical region 124U will be referred to as an 'upper vertical region,' and the third vertical region 124M will be referred to as an 'intermediate vertical region.'

The vertical channel structure 124c may include a first width variation portion 124v1 varying in width between the intermediate vertical region 124M and the upper vertical region 124U, and a second width variation portion 124v2 varying in width between the intermediate vertical region 124M and the lower vertical region 124L. In some embodiments, the first width variation portion 124v1 may have an upper surface that is parallel to an upper surface of the lower structure 103 and coplanar with the upper surface of the buffer horizontal pattern 151a, and the second width variation portion 124v2 may have a lower surface that is parallel to the upper surface of the lower structure 103.

The lower vertical region 124L, the intermediate vertical region 124M, and the upper vertical region 124U may be structures having a tendency to increase in width in a direction away from the lower structure 103.

A lower region of the intermediate vertical region 124M may have a width greater than a width of an upper region of the lower vertical region 124L. An upper region of the intermediate vertical region 124M may have a width greater than a width of a lower region of the upper vertical region 124U.

The first width variation portion 124v1 may be a portion varying in width from the lower region of the upper vertical region 124U having a relatively narrow width to the upper region of the intermediate vertical region 124M having a relatively wide width. The second width variation portion 124v2 may be a portion varying in width from the lower region of the intermediate vertical region 124M having a relatively wide width to the upper region of the lower vertical region 124L having a relatively narrow width.

The first and second width variation portions 124v1 and 124v2, and the intermediate vertical region 124M are positioned between the first intermediate gate horizontal patterns 158M1 and the second intermediate gate horizontal patterns 158M2. For example, an upper surface of the first width variation portion 124v1 may be at a lower vertical level than the second intermediate gate horizontal patterns 158M2, and a lower surface of the second width variation portion 124v2 may be at a higher vertical level than the first intermediate gate horizontal patterns 158M1.

Figure 18:
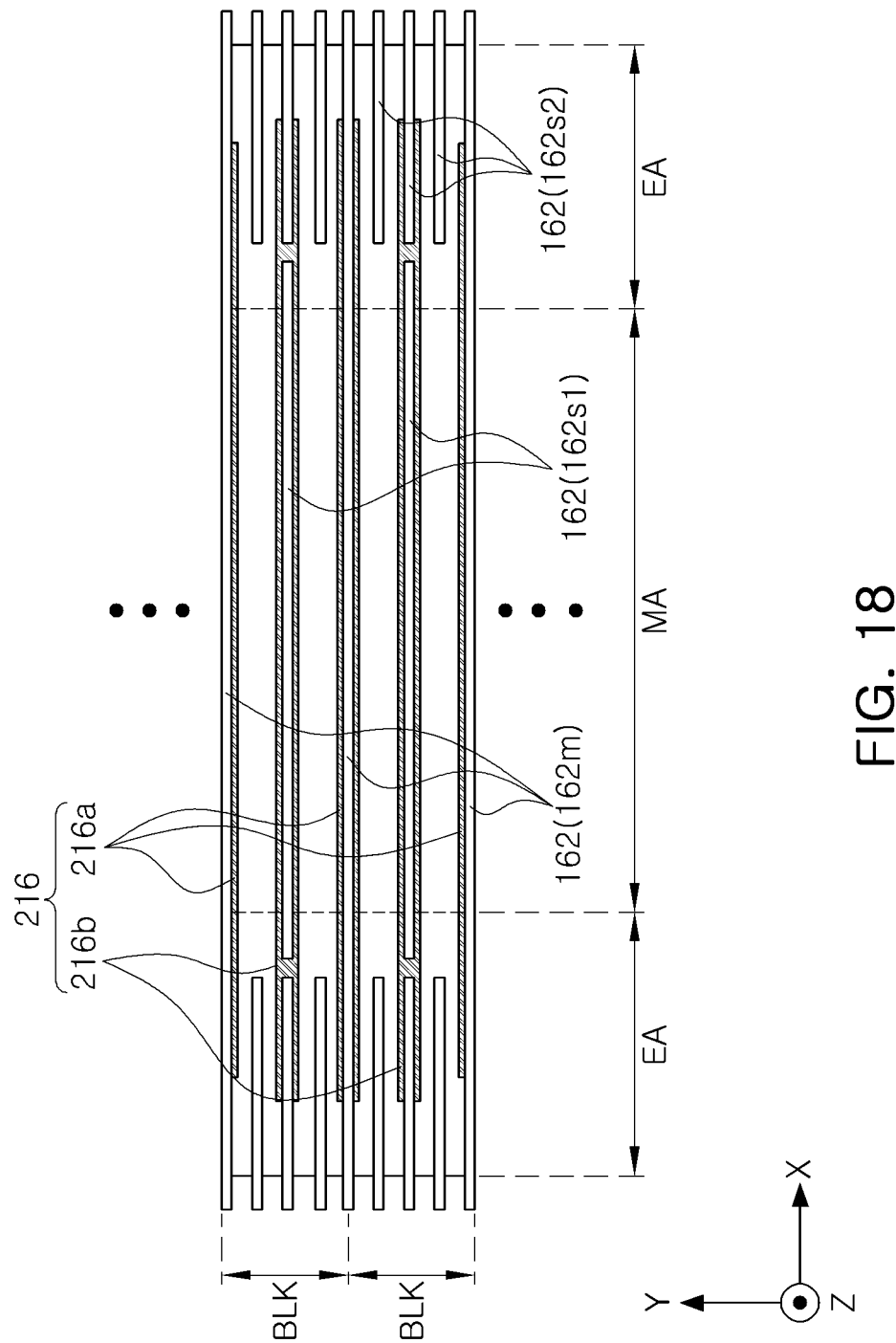
FIG. 18 is a plan view schematically illustrating a modified embodiment of a three-dimensional semiconductor device, according to an exemplary embodiment.

Referring again to FIGS. 12 to 15, the protection patterns 116 are formed on the side surfaces of the main separation structures 162m and the first auxiliary separation structures 162s1 in the memory array region MA, and may be spaced apart from the second auxiliary separation structures 162s2. The embodiments are not limited thereto, but may be modified as illustrated in FIG. 18. FIG. 18 is a plan view illustrating a plane corresponding to the plane of FIG. 12 for explaining a modified embodiment of the protective patterns 116.

In a modified embodiment, referring to FIG. 18, protection patterns 216 may be disposed on the side surfaces of the main separation structures 162m and the first auxiliary separation structures 162s1 in the memory array region MA, and may extend from the memory array region MA into a portion of the extension region EA to cover the side surfaces of the second auxiliary separation structures 162s2 in a portion of the second auxiliary separation structures 162s2.

The protection patterns 216 may include first protection patterns 216a disposed on the side surfaces of the main separation structures 162m in the memory array region MA and extending from the memory array region MA into a portion of the extension region EA, and second protective patterns 216b disposed on the side surfaces of the first auxiliary separation structures 162s1 in the memory array region MA and extending from the memory array region MA into a portion of the extension region EA to cover the side surfaces of the second auxiliary separation structures 162s2 having end portions facing the first auxiliary separation structures 162s1.

Figure 19:
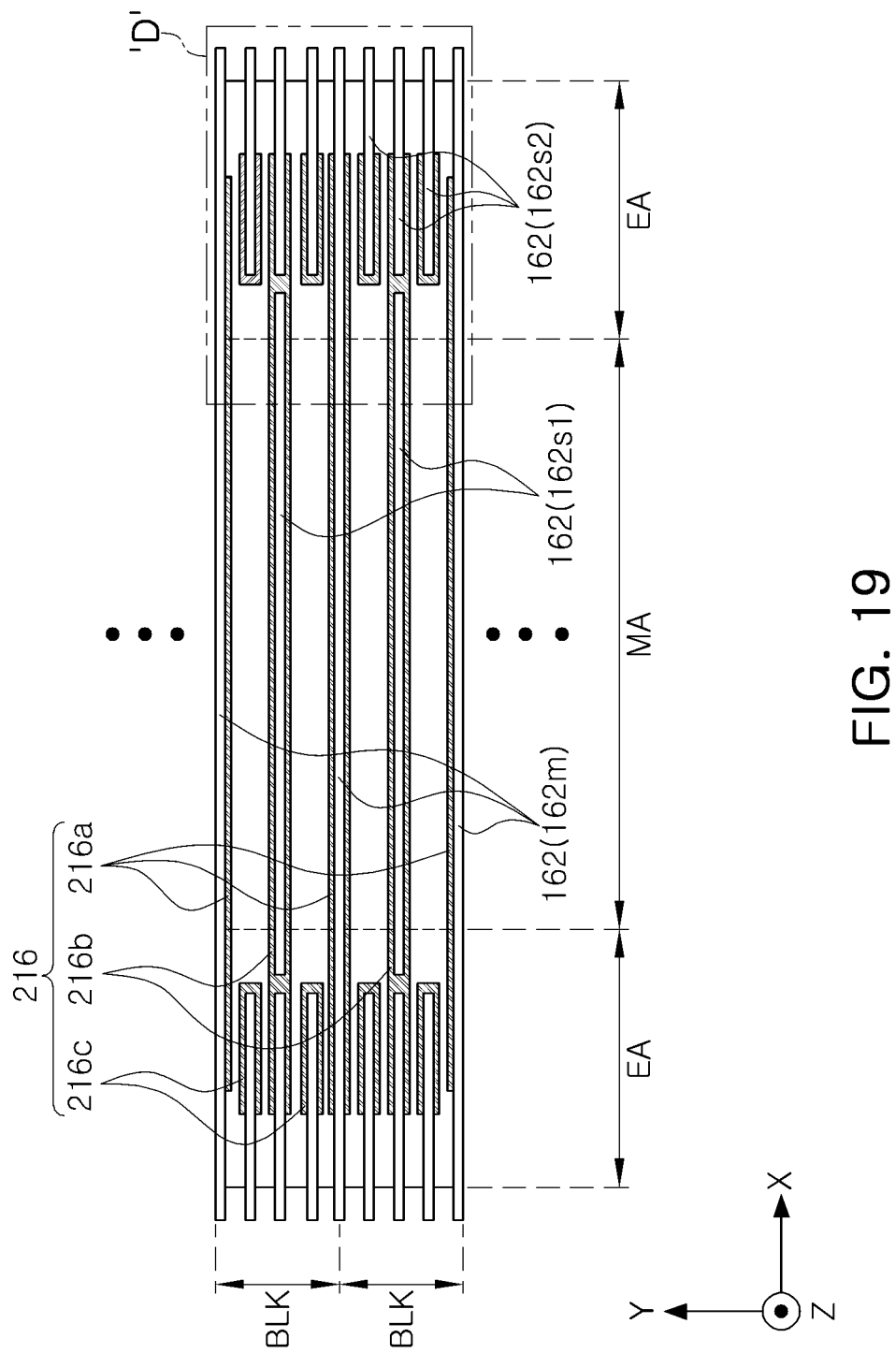
FIGS. 19 to 21C are views illustrating a modified embodiment of a three-dimensional semiconductor device, according to an exemplary embodiment.
Figure 20:
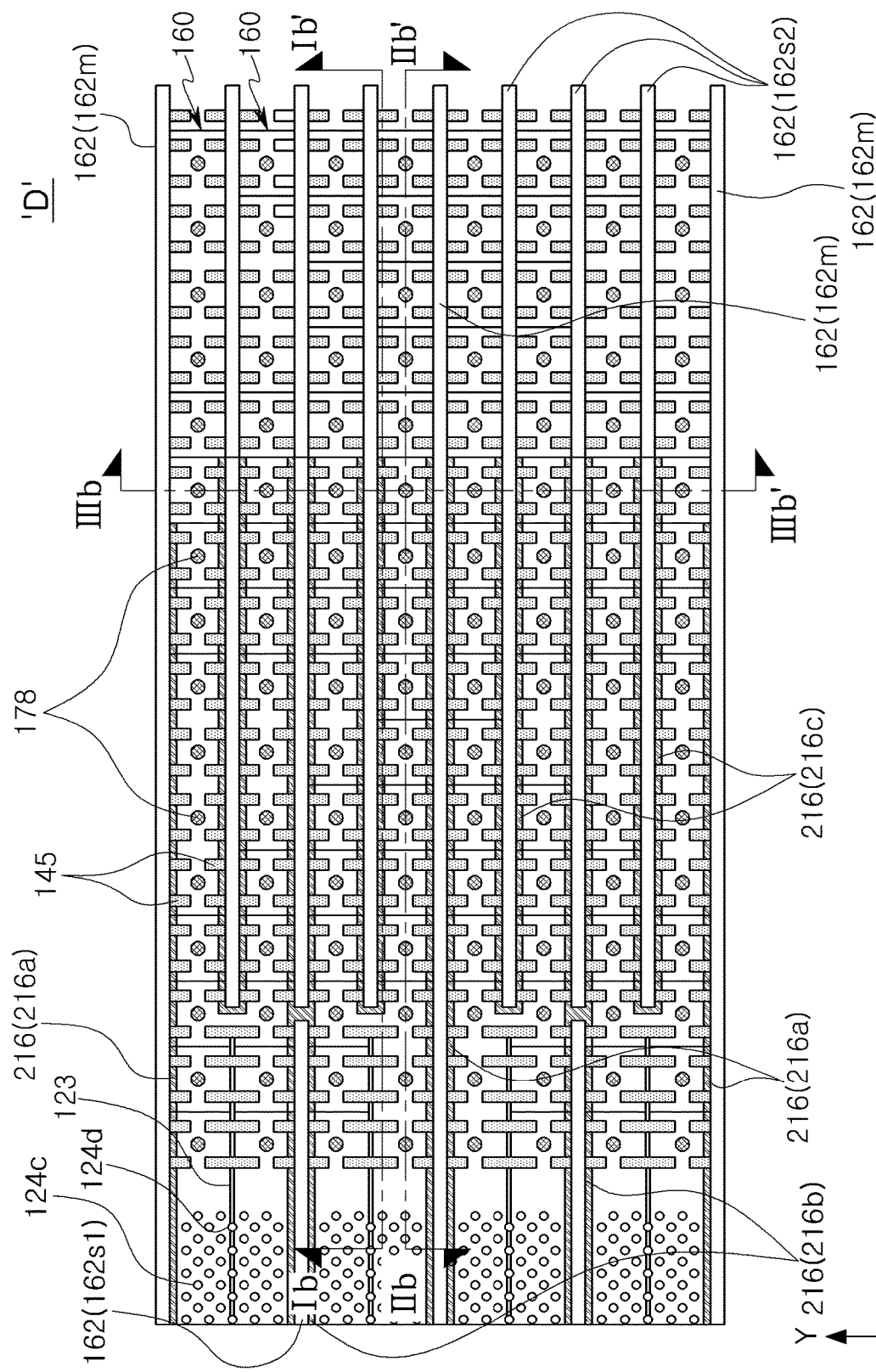
Figure 21A:
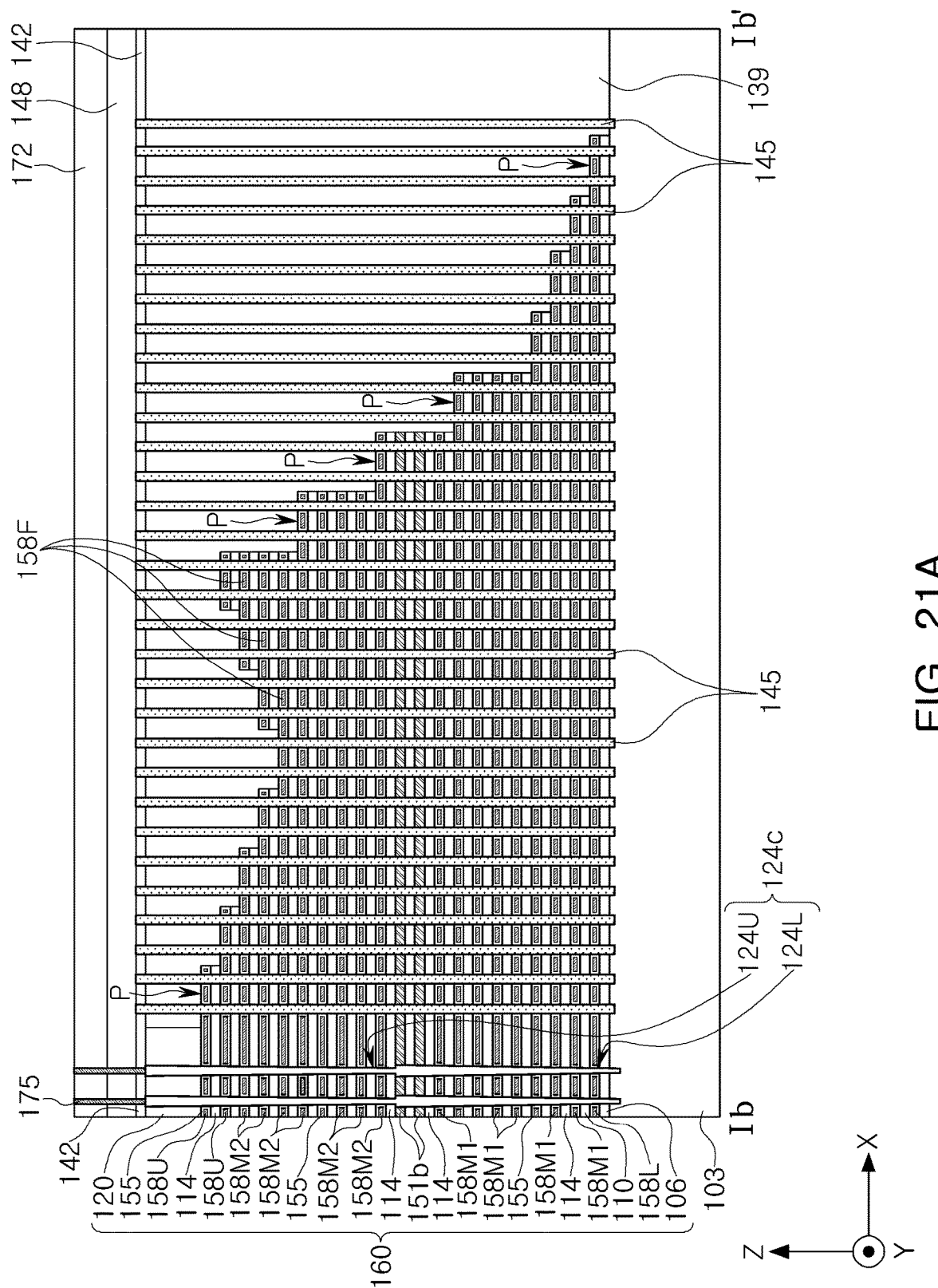
Figure 21B:
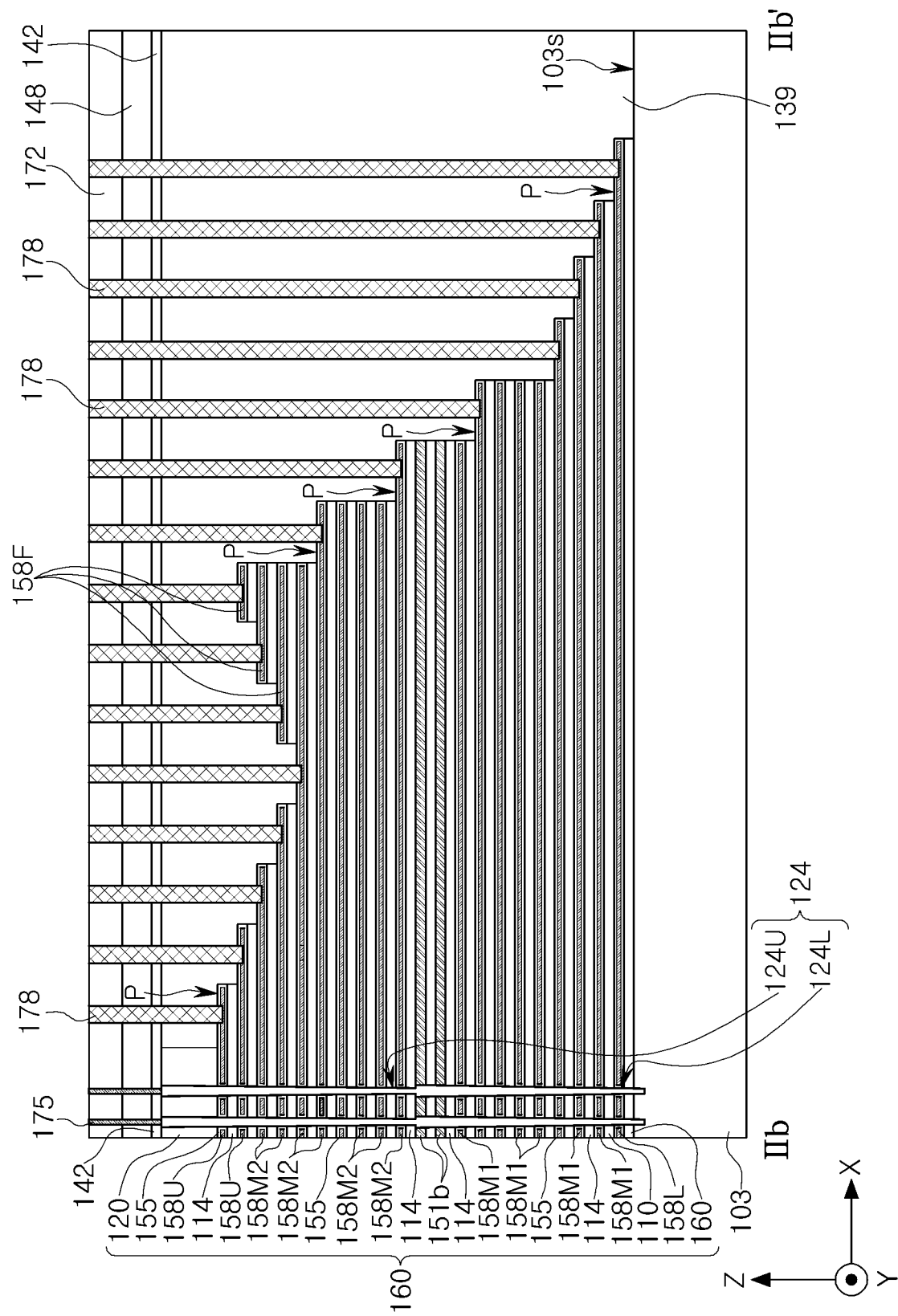
Figure 21C:
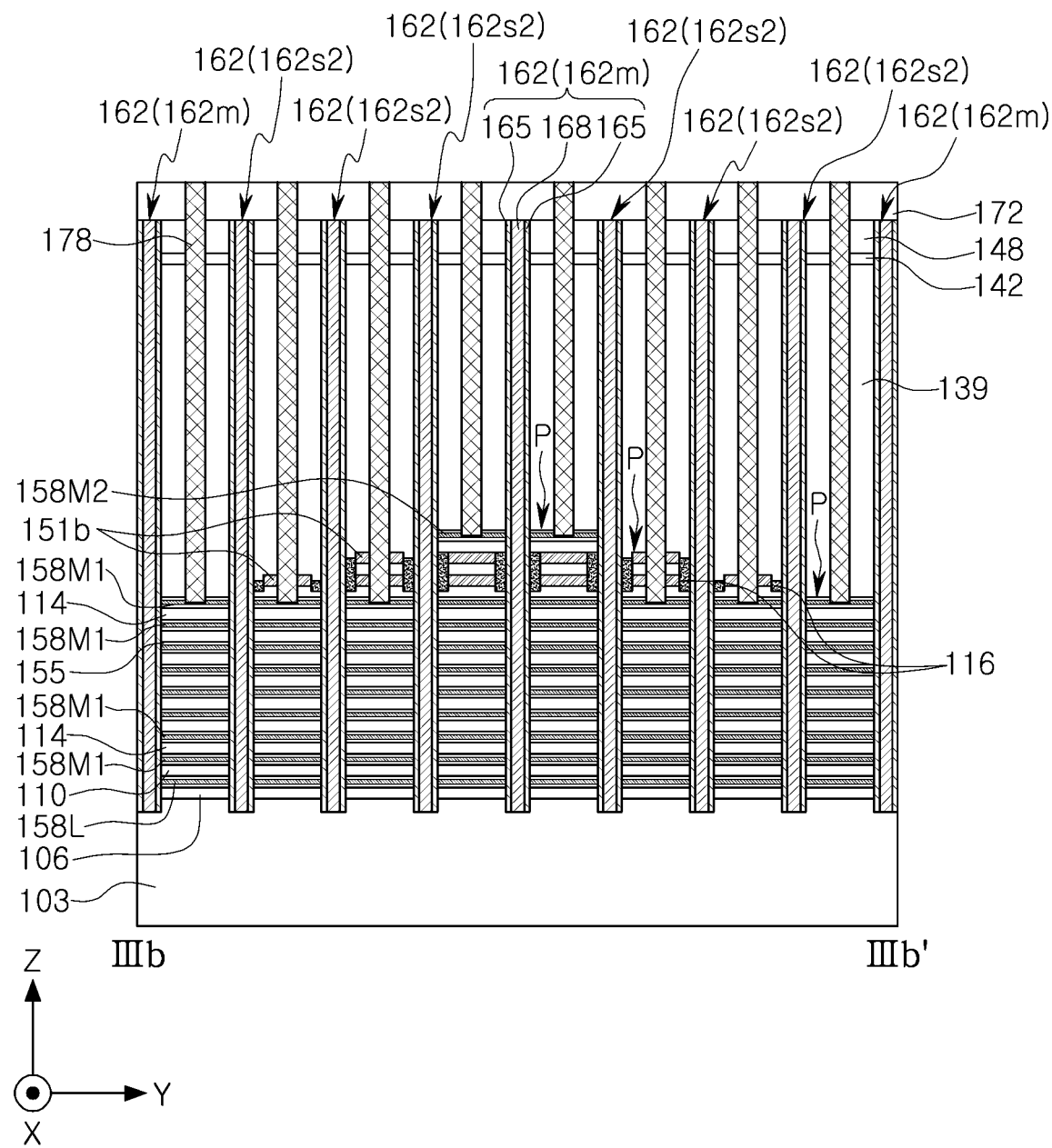

The protection patterns 216 may include the first and second protection patterns 216a and 216b described above. The embodiments are not limited thereto, and may further include a third protection pattern 216c, as illustrated in FIG. 19. An example embodiment of a three-dimensional semiconductor device including such modifiable protective patterns 216 will be described with reference to FIGS. 19 to 21C. FIG. 19 is a plan view illustrating a plane corresponding to the plane of FIG. 18 for explaining a modified embodiment of the protective patterns 216 described in FIG. 18; FIG. 20 is a plan view illustrating a region denoted by 'D' in FIG. 19; FIG. 21A is a cross-sectional view illustrating a region taken along line Ib-Ib' in FIG. 20; FIG. 21B is a cross-sectional view illustrating a region taken along line IIb-IIb' in FIG. 20; and FIG. 21C is a cross-sectional view illustrating a region taken along line in FIG. 20. Hereinafter, the three-dimensional semiconductor device described with reference to FIGS. 19 to 21C may further include a portion of components in a different manner to the three-dimensional semiconductor device described with reference to FIGS. 2 to 7B. The components constituting the three-dimensional semiconductor device described with reference to FIGS. 12 to 15 may be partially modified. Hereinafter, the same components as those described with reference to FIGS. 12 to 15 will be referred to without further explanation, and only modified portions of components to be modified will be described.

Referring to FIGS. 19 to 21C, protection patterns 216 may further include third protection patterns 216c disposed on side surfaces of remaining second auxiliary separation structures 162s2 spaced apart from the second protection patterns 216b, in addition to the first and second protection patterns 216a and 216b described above. As described above, the first and second protective patterns 216a and 216b may extend from the memory array region MA to a portion of the extension region EA. The third protection patterns 216c may be disposed in a portion of the extension region EA, and may be spaced apart from the memory array region MA.

In an example embodiment, when the first vertical support structures 145 described above are in contact with the separation structures 162, the first vertical support structures 145 may pass through the protective patterns 216.

In an example embodiment, in the extension region EA, the protective patterns 216 may be cut by the first vertical support structures 145 to be arranged spaced apart from each other in the first horizontal direction X, as illustrated in FIG. 20.

In an example embodiment, when the first vertical support structures (e.g., first vertical support structures 145d in FIG. 9D, first vertical support structures 145e in FIG. 9E), spaced apart from the separation structures 162 as illustrated in FIGS. 9D and 9E are provided, the protective patterns 216 may extend continuously in the first horizontal direction X, as illustrated in FIG. 19.

Figure 22:
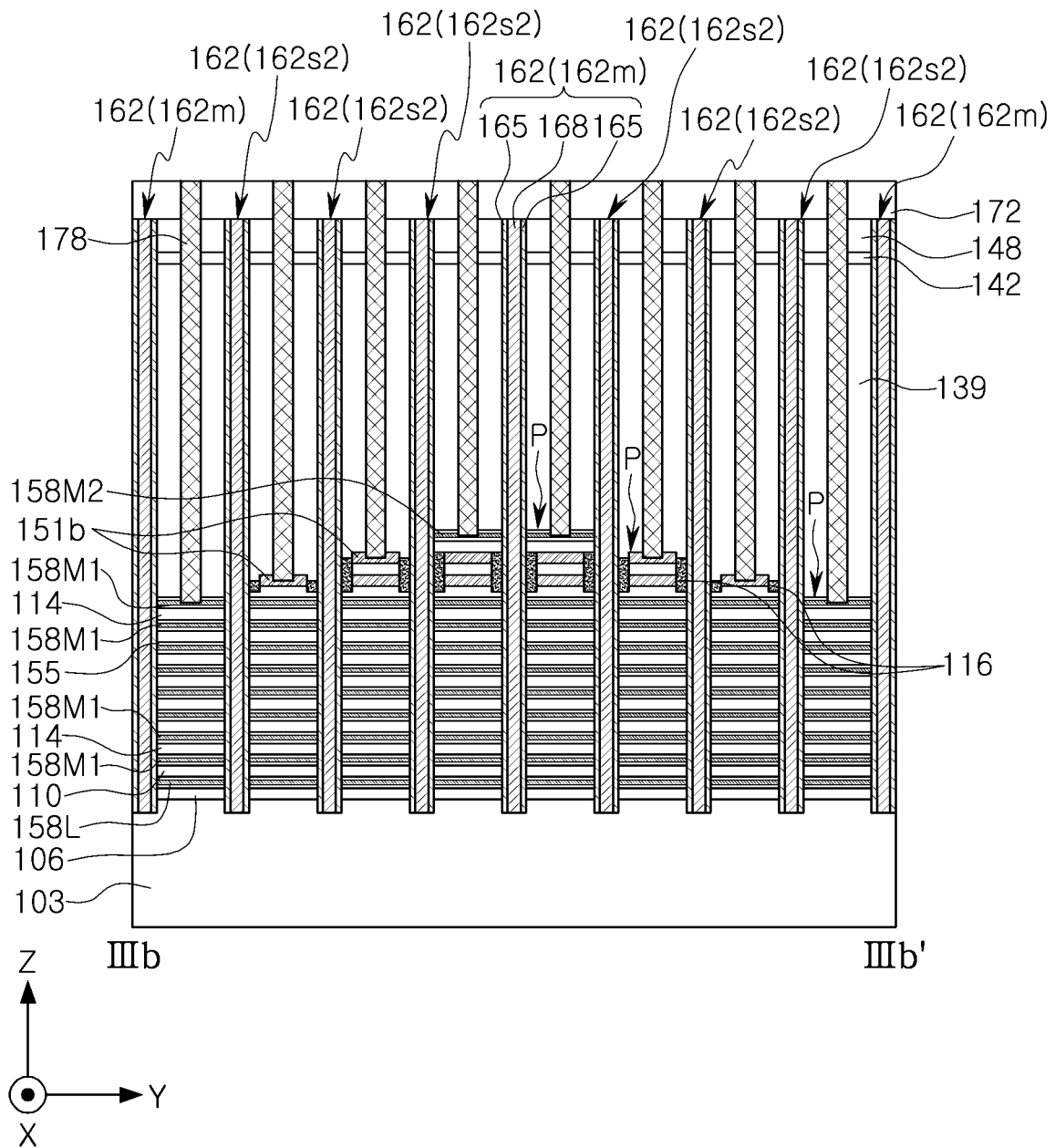
FIG. 22 is a cross-sectional view illustrating a modified embodiment of a three-dimensional semiconductor device, according to an exemplary embodiment.

The buffer horizontal pattern (e.g., buffer horizontal pattern 151a in FIG. 14A) described above with reference to FIGS. 12 to 16 may be modified to a buffer horizontal pattern 151b extending to a region in which the dummy horizontal pattern (e.g., dummy horizontal pattern 158d in FIG. 14A) positioned on the same level as the buffer horizontal pattern (e.g., buffer horizontal pattern 151a in FIG. 14A) is disposed. Therefore, the buffer horizontal pattern 151b may have the pad region P as illustrated in FIG. 21C. As above, a pad region P of the buffer horizontal pattern 151b may be a dummy pad. In an example embodiment, the first contact plugs 178 described above may pass through the pad regions P of the buffer horizontal patterns 151b, and may be in contact with the gate horizontal pattern 158M1 and 158M2 positioned in a location lower than a position of the buffer horizontal pattern 151b. The embodiments are not limited thereto, and may be modified as illustrated in FIG. 22. FIG. 22 may illustrate a cross-section that may correspond to FIG. 21C, and may represent first contact plugs 178 that may be modified.

In a modified embodiment, referring to FIG. 22, the first contact plugs 178 also may be in contact with the pad regions P of the buffer horizontal patterns 151b, without passing through the pad regions P of the buffer horizontal patterns 151b.

As described above with reference to FIGS. 2 to 16, the vertical channel structure 124c and the second vertical support structure 124d may have the same cross-sectional structure as each other or cross-sectional shape as each other.

In some embodiments, the vertical channel structure 124c and the second vertical support structure 124d may have cross-sectional structures or cross-sectional shapes different from the first vertical support structure 145.

In some embodiments, the vertical channel structure 124c and the second vertical support structure 124d may further comprise a plurality of material layers greater than material layers constituting the first vertical support structure 145.

For example, the first vertical support structure 145 may comprise a silicon oxide layer, and the vertical channel structure 124c may further comprise material layers constituting the gate dielectric structure 128, the channel semiconductor layer 130, and the pad pattern 134, than the first vertical support structure 145.

In some embodiments, the interlayer dielectric layers 114 may include an intermediate interlayer insulation layer 114a adjacent to the width variation portion 124v of the vertical channel structure 124c, and the intermediate interlayer insulation layer 114a may have the same thickness as an interlayer insulation layer, among the interlayer insulation layers 114, adjacent to the intermediate interlayer insulation layer 114a in the vertical direction Z.

In some embodiments, the upper surface of the first vertical support structure 145 may be positioned on vertical heights different from the upper surface of the vertical channel structure 124c. For example, a distance between the upper surface of the first vertical support structure 145 and the upper surface of the lower structure 103 may be greater than a distance between the upper surface of the vertical channel structure 124c and the upper surface of the lower structure 103.

Next, an example embodiment of a method of forming the three-dimensional semiconductor device as described above will be described with reference to FIGS. 23A to 28B. In FIGS. 23A to 28B, FIGS. 23A, 24A, 25A, 26A, 27A, and 28A are cross-sectional views illustrating a region taken along line Ib-Ib' in FIG. 20, and FIGS. 23B, 24B, 25B, 26B, 27B, and 28B are cross-sectional views illustrating a region taken along line in FIG. 20. While described with reference to lines Ib-Ib' and IIb-IIb' of FIG. 20, the method of forming the three-dimensional structure device disclosed in connection with FIGS. 23A to 28B is applicable to the embodiments disclosed in FIGS. 2 to 8A.

Figure 23A:
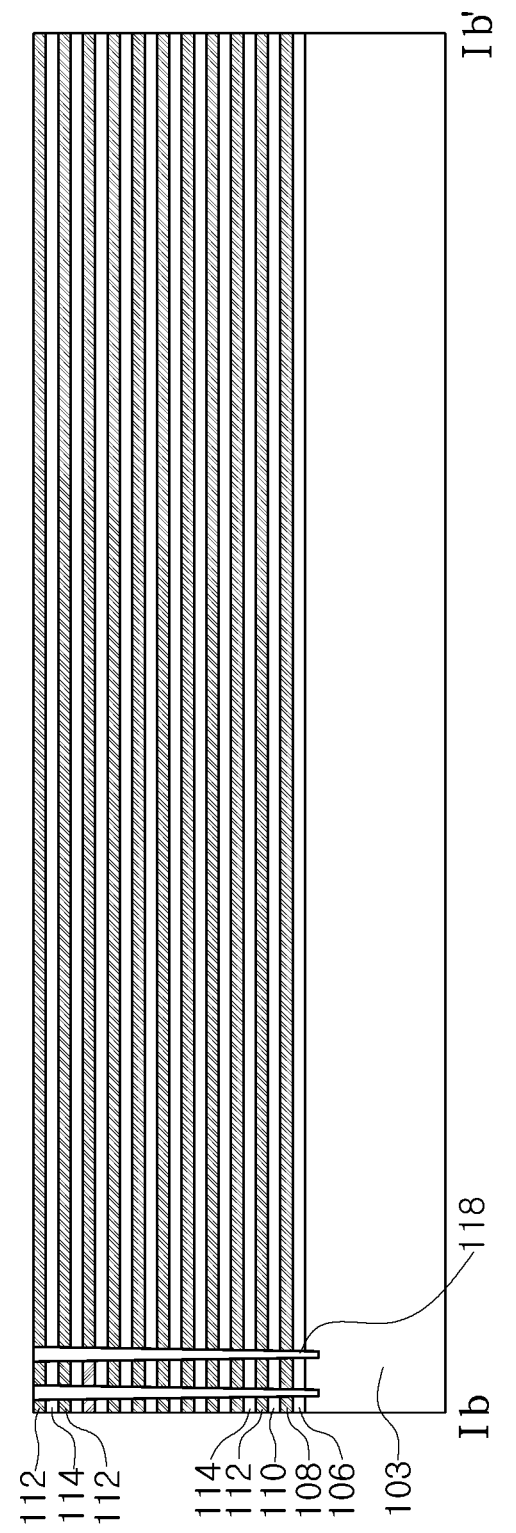
FIGS. 23A to 28B are cross-sectional views illustrating an example embodiment of a method of forming a three-dimensional semiconductor device, according to an exemplary embodiment.
Figure 23B:
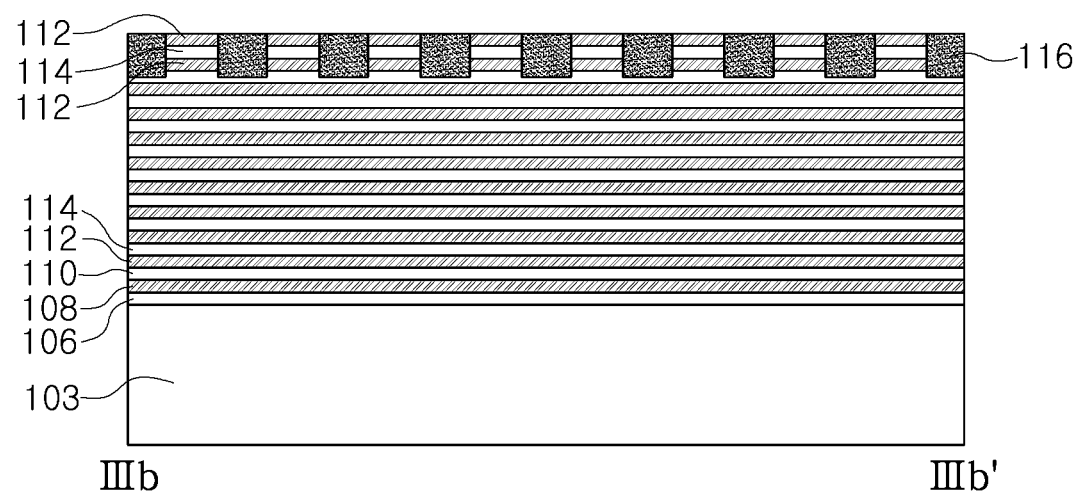

Referring to FIGS. 20, 23A, and 23B, a lowermost insulation layer 106, a lowermost mold layer 108, and a lower insulation layer 110 may be sequentially formed on a lower structure 103. Mold layers 112 and interlayer insulation layers 114 alternately stacked on the lower insulation layer 110 may be formed. The lowermost mold layer 108 and the mold layers 112 may be formed of the same first material as each other, and the lowermost insulation layer 106, the lower insulation layer 110, and the interlayer insulation layers 114 may be formed of the same second material as each other. The second material may have an etch selectivity with respect to the first material. For example, the second material may be silicon nitride, and the first material may be silicon oxide.

Protective patterns 116 passing through an uppermost mold layer or passing through the uppermost mold layer and a second-uppermost mold layer in the mold layers 112 may be formed. The protective patterns 116 may be formed of a material having etching selectivity with the mold layers 112, for example, silicon oxide.

Sacrificial vertical structures 118, which extend on the lower structure 103 in the vertical direction to pass through the lowermost insulation layer 106, the lower insulation layer 110, the interlayer insulation layers 114, the lower mold layer 108, and the mold layers 112, may be formed. The sacrificial vertical structures 118 may be formed of a material having etching selectivity with the mold layers 112 and the interlayer insulation layers 114, and are not limited to specific materials.

Each of the sacrificial vertical structures 118 may be formed to increase in width in a vertical direction away from the lower structure 103.

In an example embodiment, after forming the protective patterns 116, the sacrificial vertical structures 118 may be formed. Alternatively, after forming the sacrificial vertical structures 118, the protection patterns 116 may be formed.

Figure 24A:
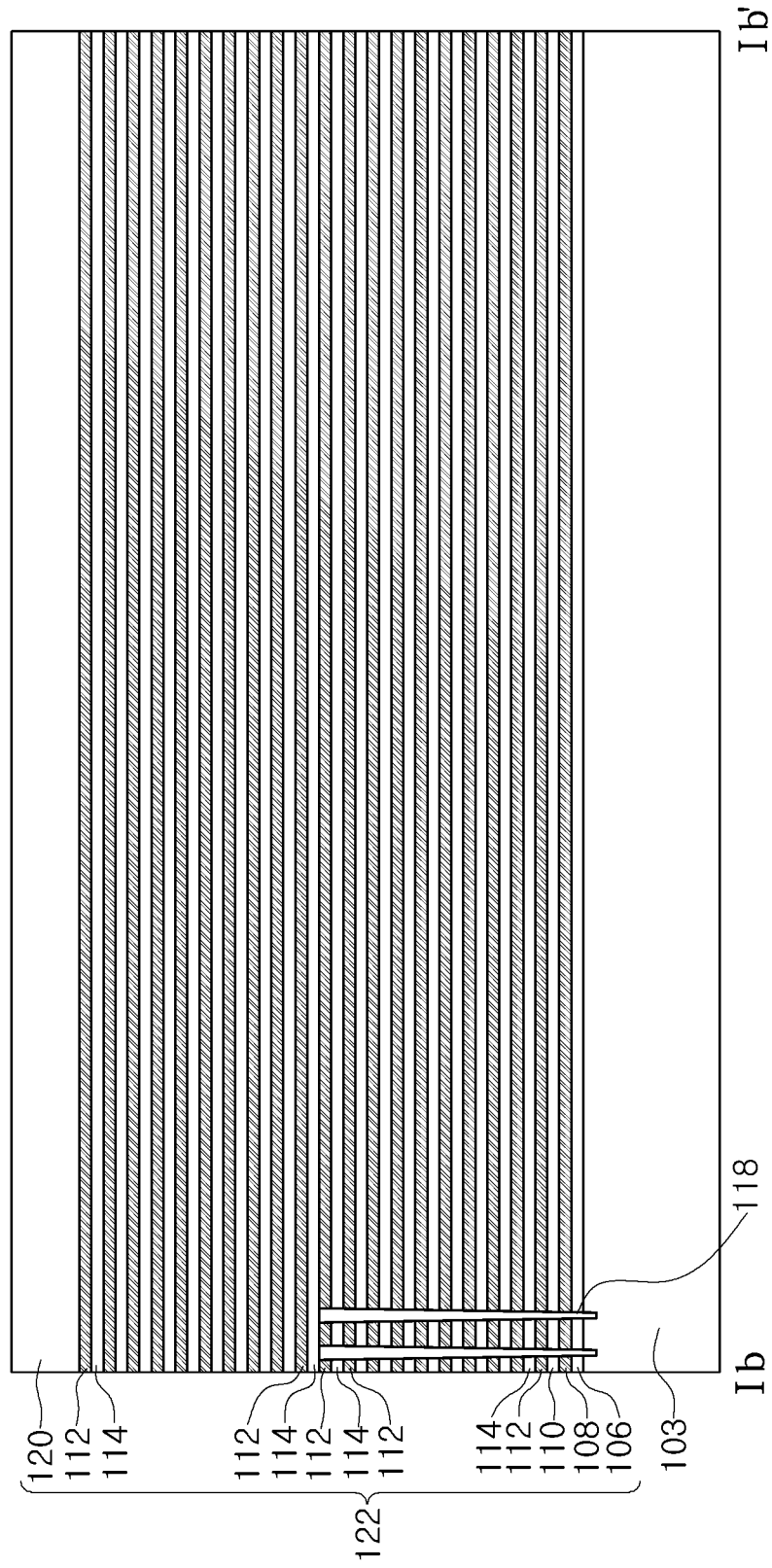
Figure 24B:
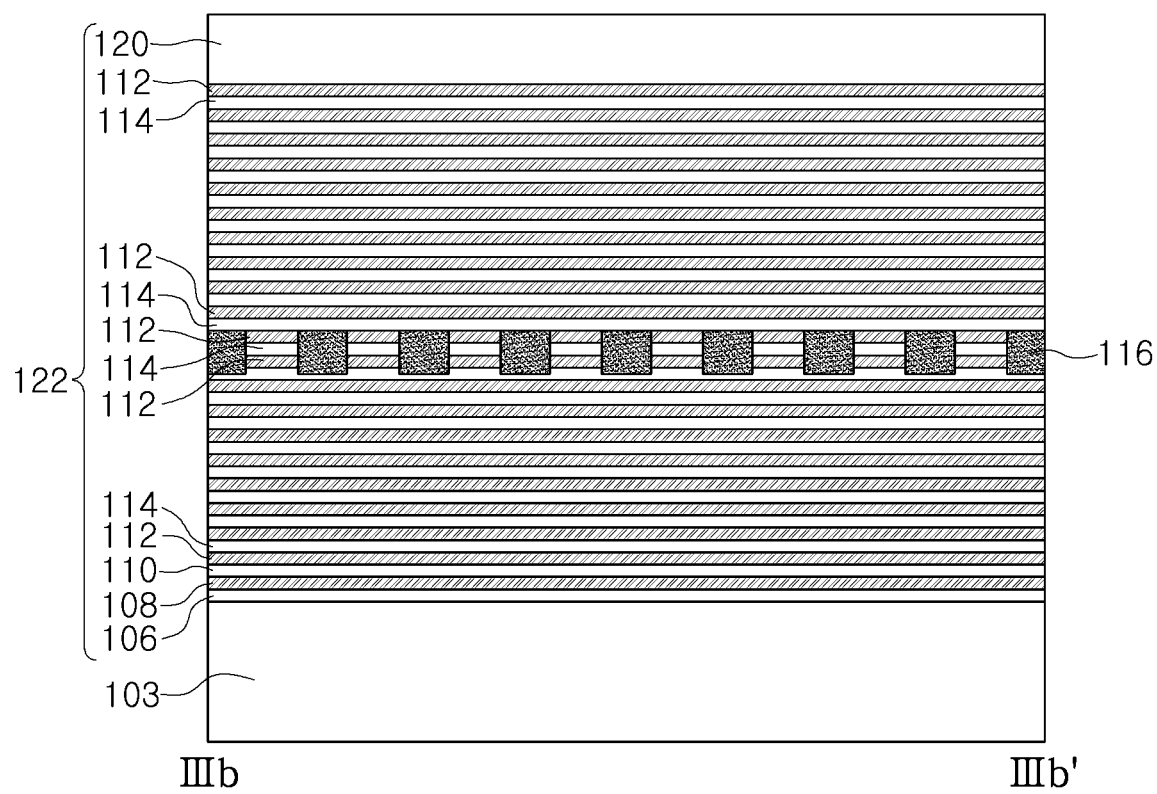

Referring to FIGS. 20, 24A, and 24B, the interlayer insulation layers 114 and the mold layers 112 may be repeatedly stacked on the lower structure 103 having the protection patterns 116 and the sacrificial vertical structures 118 formed thereon. An upper insulation layer 120 may be formed on an uppermost mold layer among the mold layers 112. The upper insulation layer 120 may be formed to be thicker than the respective interlayer insulation layers 114.

Figure 25A:
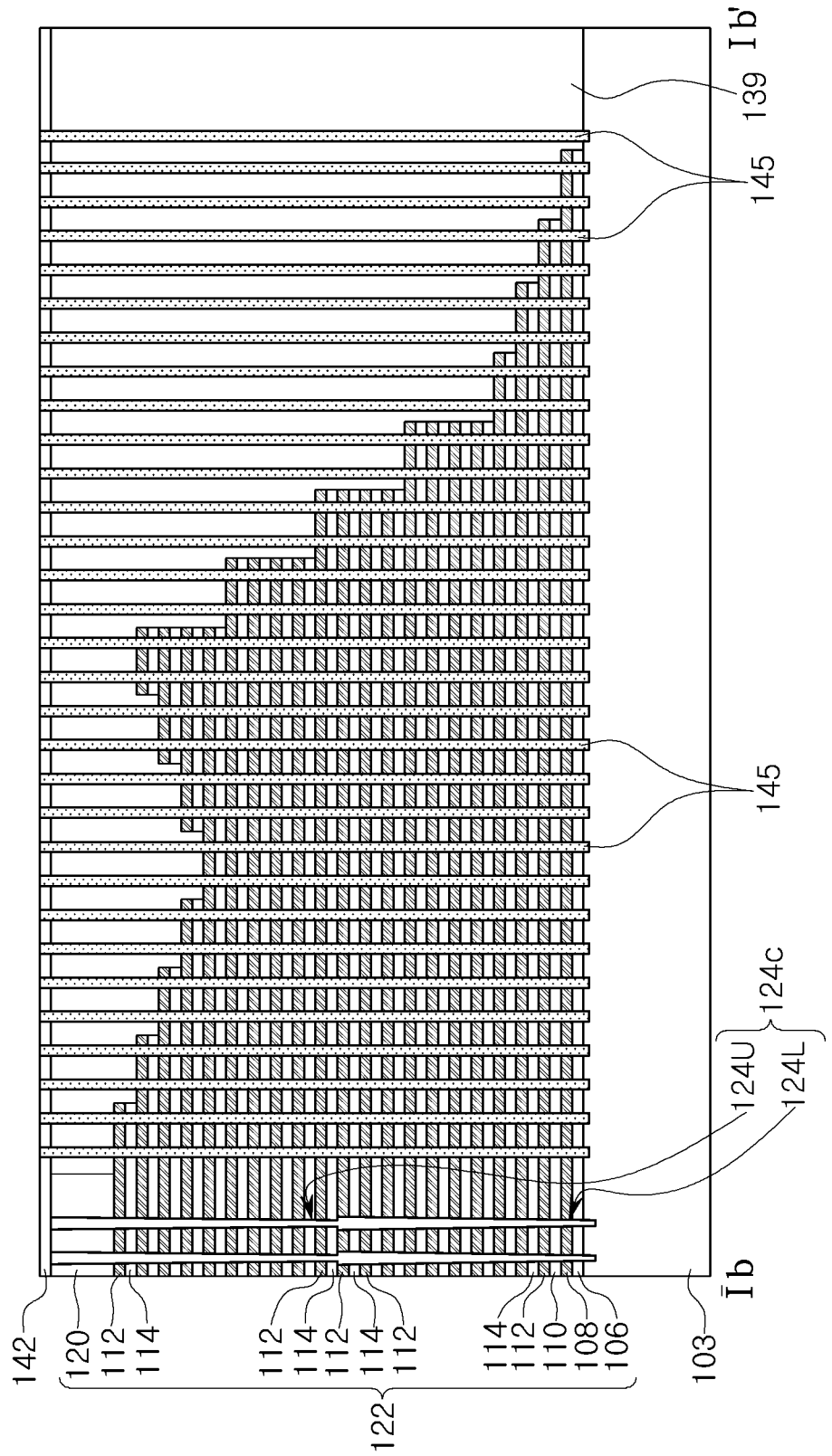
Figure 25B:
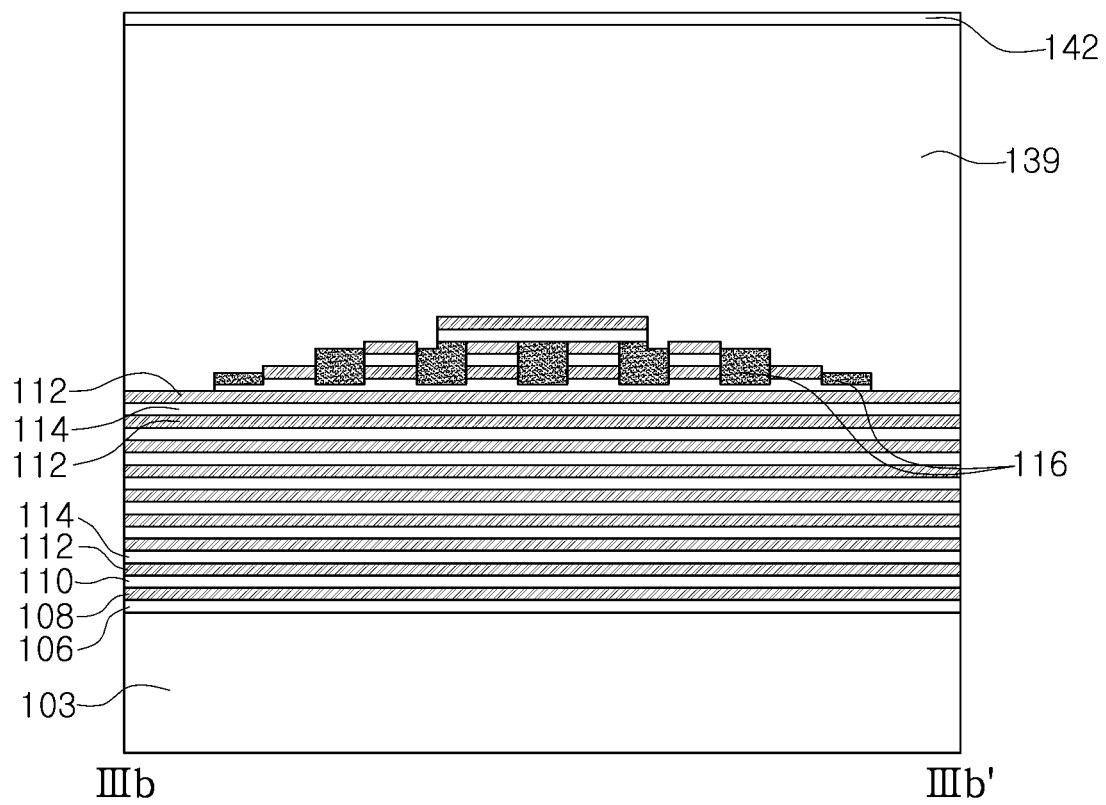

Referring to FIGS. 20, 25A, and 25B, the interlayer insulation layers 114, the mold layers 112, and the upper insulation layer 120 positioned in a location higher than or above a position of the sacrificial vertical structures (e.g., sacrificial vertical structures 118 in FIG. 24A) may be patterned to form holes exposing the sacrificial vertical structures (e.g., sacrificial vertical structures 118 in FIG. 24A). Each of the holes may be formed to have a width that decreases from the upper portion to the lower portion. A portion of the upper surface of the sacrificial vertical structures (e.g., sacrificial vertical structures 118 in FIG. 24A) may be exposed by the holes, respectively. Subsequently, the exposed sacrificial vertical structures (e.g., sacrificial vertical structures 118 in FIG. 24A) may be removed to extend the holes to the lower structure 103. Subsequently, the same vertical channel structures 124c as described in FIGS. 2 to 8A may be formed in the holes. The second vertical support structures (e.g., second vertical support structures 124d in FIG. 7B) described in FIGS. 2 to 8A may be formed simultaneously with the vertical channel structures 124c. The vertical channel structures 124c having the same structure as described in FIGS. 2 to 8A may be formed. For example, the vertical channel structures 124c may have the width variation portion (e.g., width variation portion 124v in FIG. 8A) as described above.

The forming operation of the vertical channel structures 124c may include forming semiconductor patterns 126 in a lower region of the holes, forming gate dielectric structures 128 on side walls of the holes on the semiconductor patterns 126, forming channel semiconductor layers 130 covering inner walls of the holes, forming vertical core patterns 132 partially filling the holes, and forming pad patterns 134 filling remaining portions of the holes.

Photolithography and etching processes for patterning the lowermost mold layer 108 and the mold layers 112 on the lower structure 103 may be repeated a plurality of times to form a stepped shape corresponding to the stepped shape arranged by the pad regions P as illustrated in FIGS. 2 to 8A. After forming such a stepped shape, a first capping insulation layer 139 may be formed to cover a region formed of the stepped shape.

A second capping insulation layer 142 covering the upper insulation layer 120 and the first capping insulation layer 139 may be formed. The first vertical support structures 145 may be formed to pass through the first and second capping insulation layers 139 and 142, and pass through a lower insulation layer 110, and the lowermost insulation layer 106, the lower insulation layer 110, the interlayer insulation layers 114, the lowermost mold layer 108, and the mold layers 112.

The forming operation of the first vertical support structures 145 may include forming holes passing through the lowermost insulation layer 106, the lower insulation layer 110, the interlayer insulation layers 114, the lowermost mold layer 108, and the mold layers 112, and then filling the holes with an insulating material, for example, silicon oxide.

The first vertical support structure 145 may be formed after forming the vertical channel structure 124c including the width variation portion 124v described above. Therefore, photolithography and etching processes for patterning the lowermost mold layer 108 and the mold layers 112 on the lower structure 103 may be repeated a plurality of times to stably form a stepped shape corresponding to the stepped shape arranged by the pad regions P as illustrated in FIGS. 2 to 8A without any defects occurring. Therefore, the reliable pad regions P as described in FIGS. 2 to 8A may be formed without incurring any defects.

According to embodiments, each of the interlayer insulation layers 114 may be formed to have the same thickness. Since the interlayer insulation layers 114 are formed to have the same thickness, the lowermost mold layer 108 and the mold layers 112 on the lower structure 103 may be patterned to stably form a stepped shape corresponding to the stepped shape arranged by the pad regions P as illustrated in FIGS. 2 to 8A without incurring any defects.

Figure 26A:
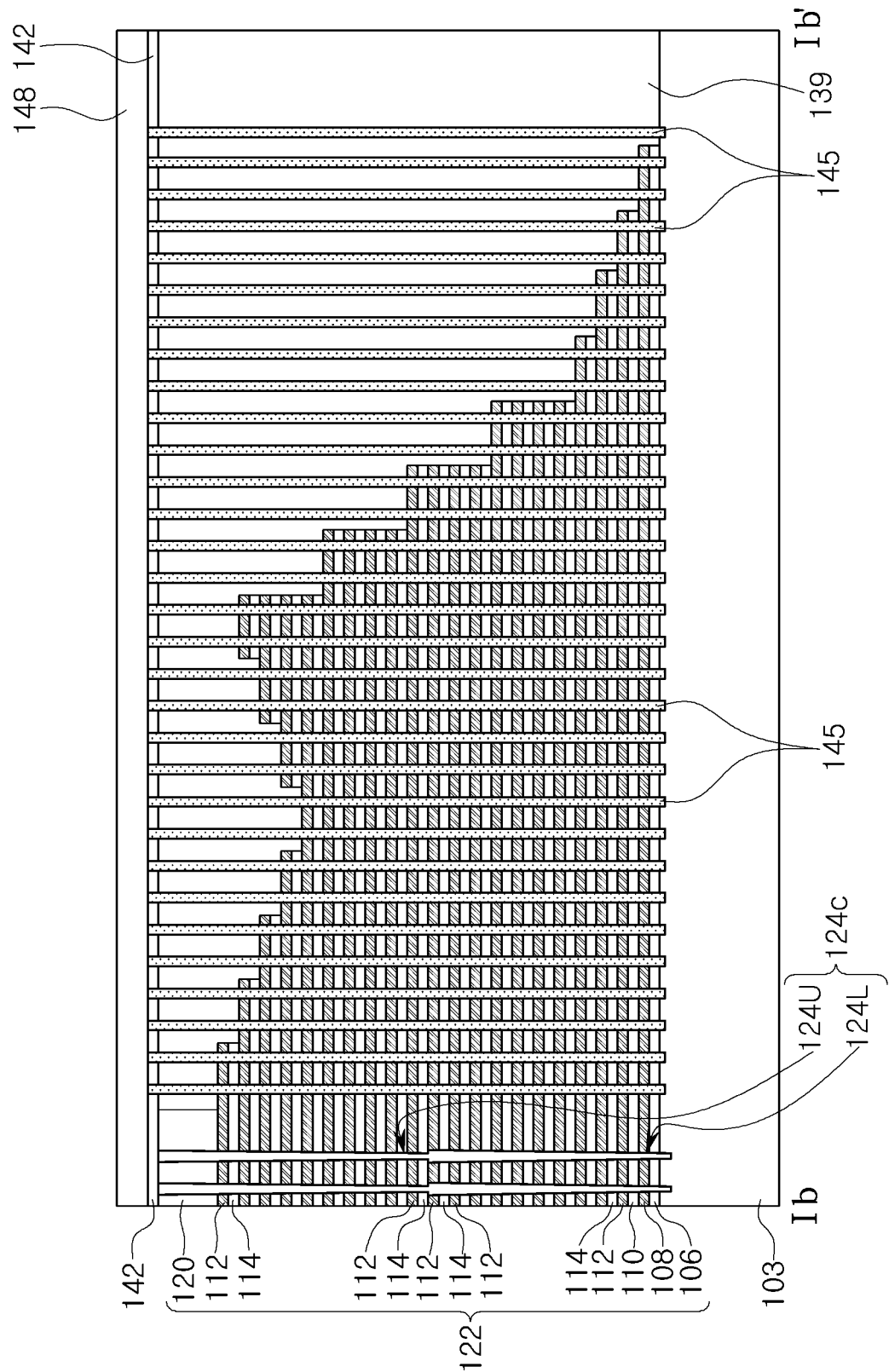
Figure 26B:
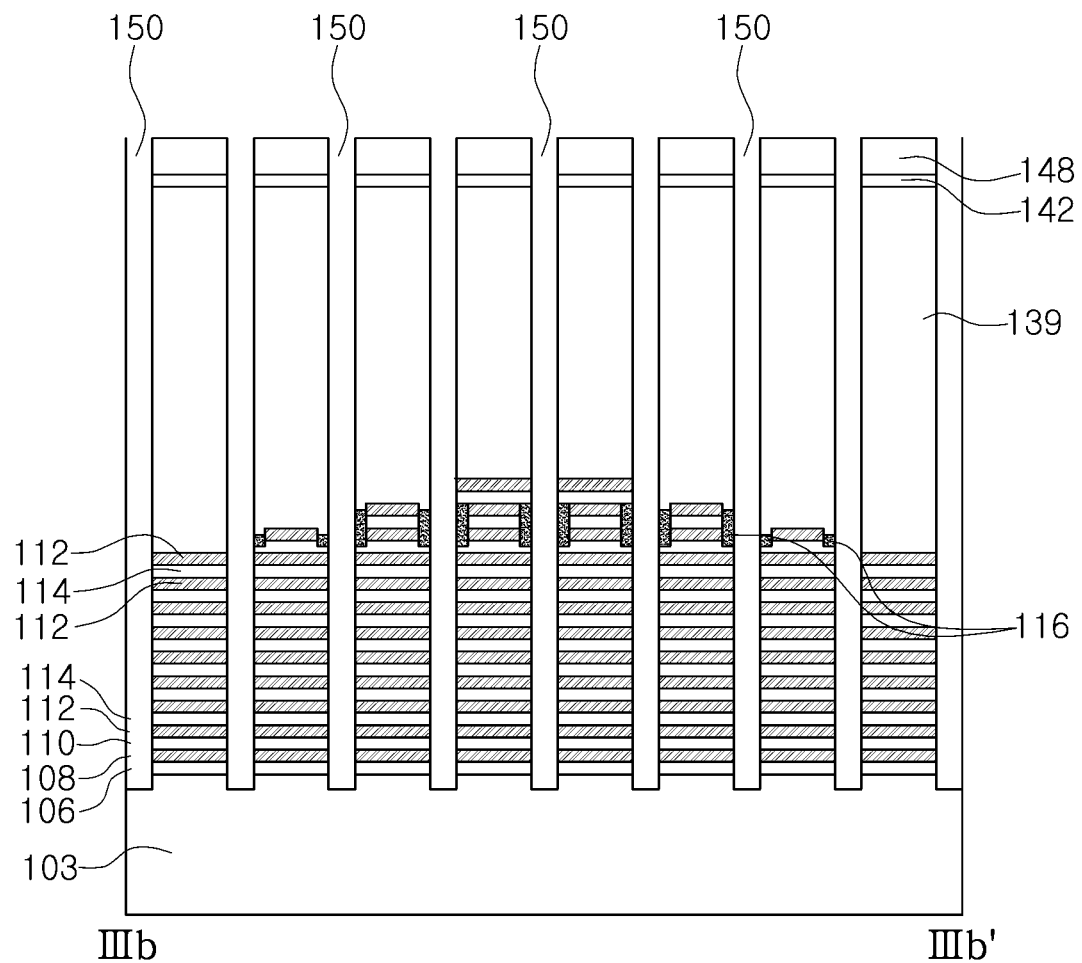

Referring to FIGS. 20, 26A, and 26B, a third capping insulation layer 148 may be formed on the second capping insulation layer 142. Separation trenches 150 may be formed in positions corresponding to the separation structures 162 described in FIGS. 2 to 8A. The protective patterns 116 may be passed through by the separation trenches 150. For example, the separation trenches 150 may be formed to cut through a center region of the protective patterns 116. The mold layers positioned between the protection patterns 116 may not be exposed by the separation trenches 150, and may be defined as a buffer horizontal pattern 151b. The remaining mold layers 112 and the lowermost mold layer 108 may be exposed by the separation trenches 150.

Figure 27A:
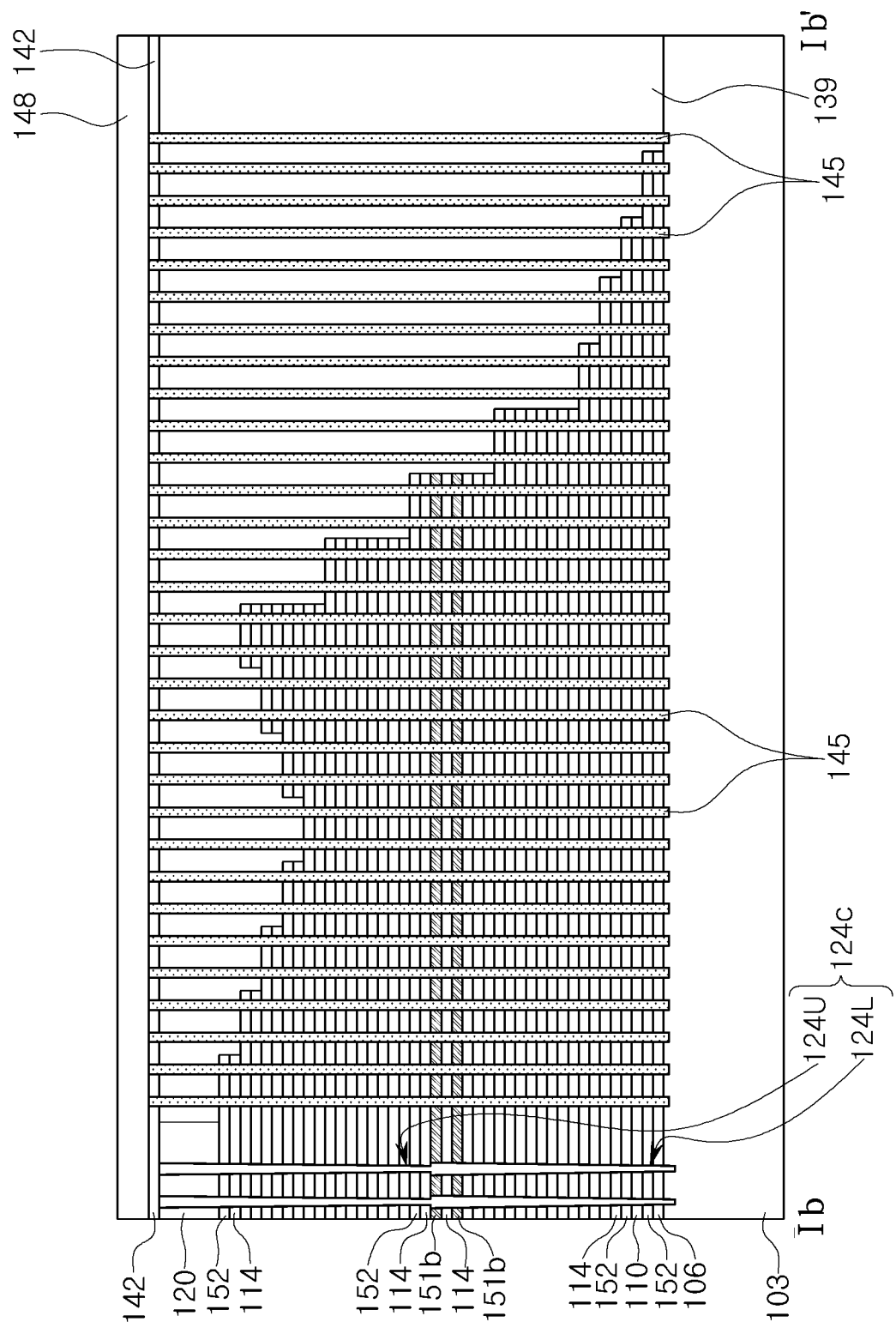
Figure 27B:
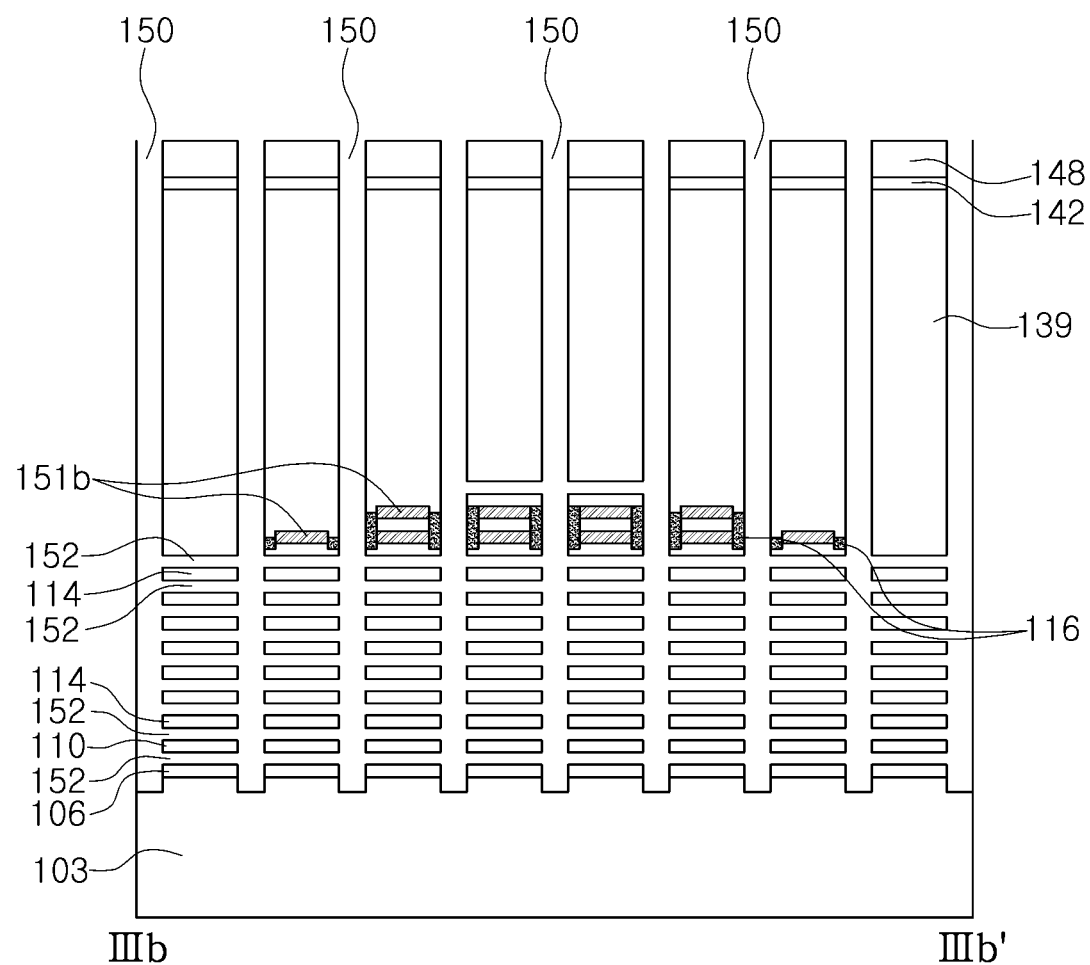

Referring to FIGS. 20, 27A, and 27B, the mold layers 112 and the lowermost mold layer 108 exposed by the separation trenches 150 may be removed to form empty spaces 152. The first vertical support structures 145, the vertical channel structures 124c, and the second vertical support structures (e.g., second vertical support structures 124d in FIG. 7B) may prevent the interlayer insulation layers 114 from collapsing or warping.

Figure 28A:
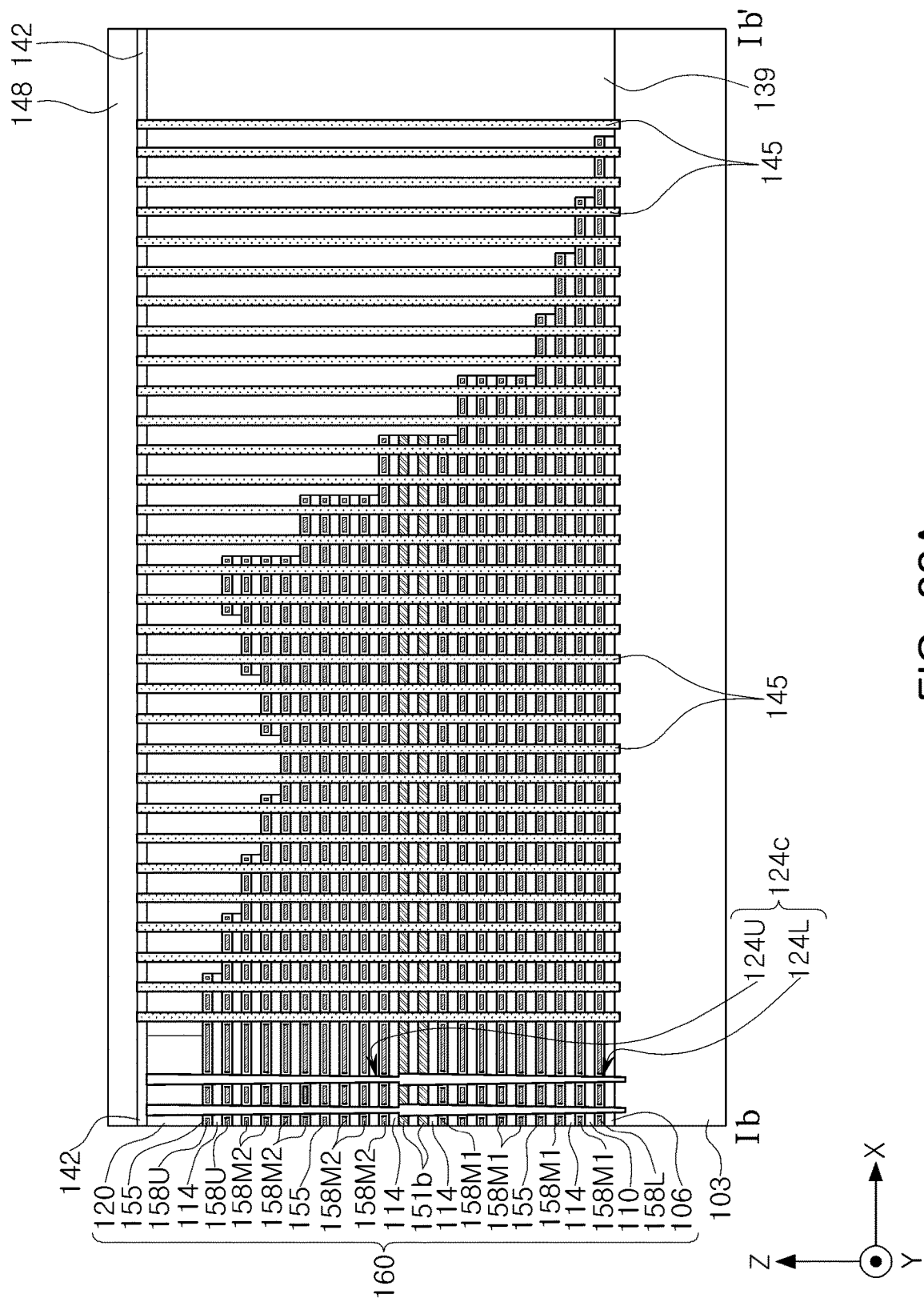
Figure 28B:
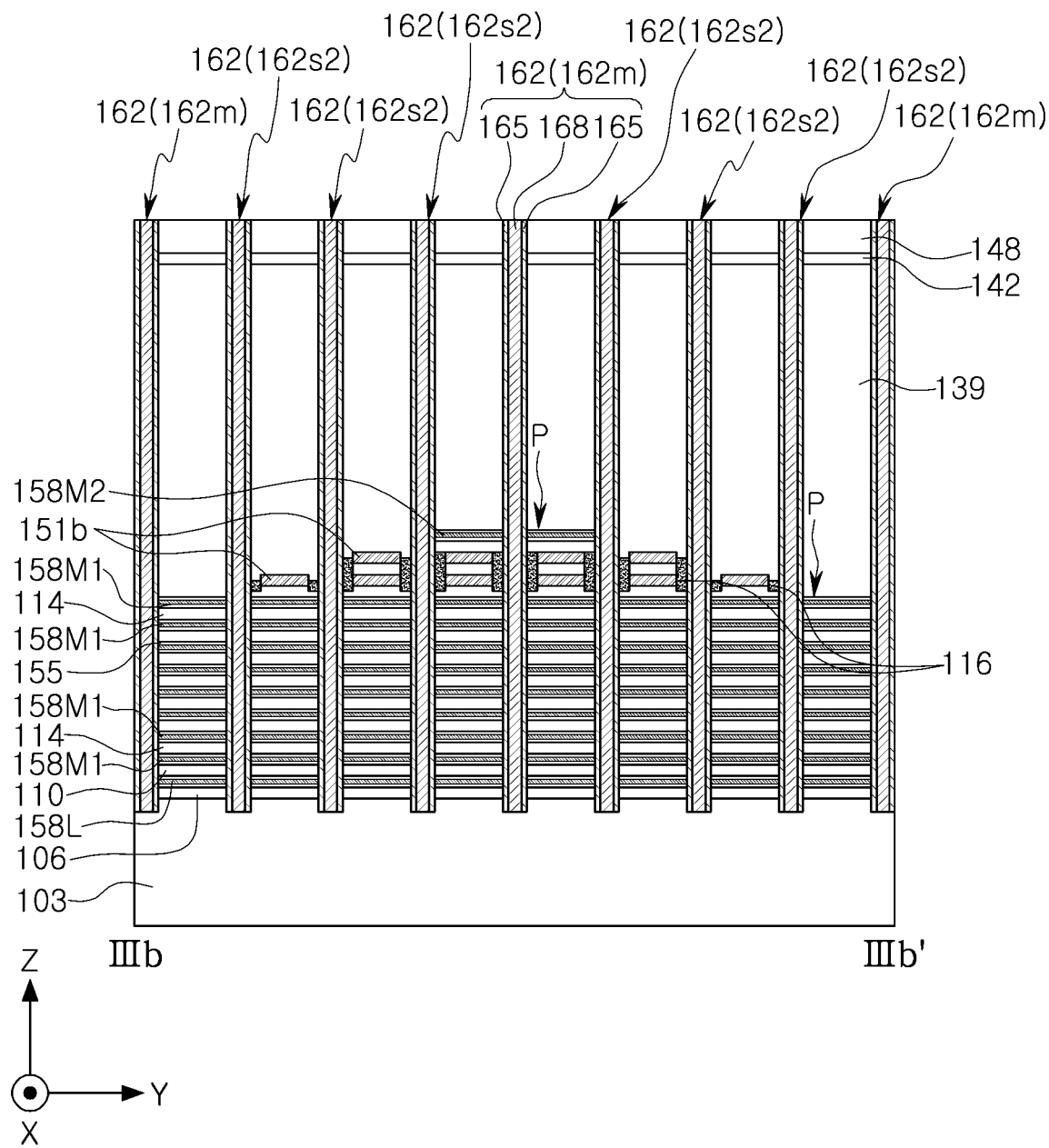

Referring to FIGS. 20, 28A, and 28B, an additional dielectric layer 155 and gate horizontal patterns 158L, 158M1, 158M2, and 158U may be sequentially formed in the empty spaces (e.g., empty spaces 152 in FIGS. 27A and 27B). The gate horizontal patterns 158L, 158M1, 158M2, and 158U may be formed of a conductive material such as a metal nitride (e.g., TiN, or the like) and/or a metal (e.g., W, or the like), or the like. Separation structures 162 may be formed in the separation trenches 150. The forming operation of the separation structures 162 may include forming a first separation layer 165 on the side surfaces of the separation trenches 150, and forming a second separation layer 168 filling the separation trenches 150.

Referring again to FIGS. 20 to 21C, a third capping insulation layer 172 may be formed on the second capping insulation layer 148. Subsequently, an operation of forming a plug may proceed. For example, first contact plugs 175 may be formed to sequentially pass through the second to fourth capping insulation layers 142, 148, and 172, and contact the upper portions of the vertical channel structures 124c. First contact plugs 178 may be formed to sequentially pass through the first to fourth capping insulation layers 139, 142, 148, and 172 in the extension region EA, and contact the gate horizontal patterns 158L, 158M1, 158M2, and 158U.

According to example embodiments, a three-dimensional semiconductor device may increase the number of gates stacked in a vertical direction to improve the degree of integration.

While example embodiments have been shown and described above, it will be apparent to those skilled in the art that modified embodiments and variations could be made without departing from the scope of the present inventive concept as defined by the appended claims.

What is claimed is:

1. A three-dimensional semiconductor device comprising:
a silicon substrate;
a stack structure on the silicon substrate, the stack structure including a first stack portion and a second stack portion on the first stack portion, each of the first and second stack portions including interlayer insulation layers and gate horizontal patterns alternately stacked in a vertical direction, the vertical direction being perpendicular to an upper surface of the silicon substrate, wherein the gate horizontal patterns are stacked in a first region on the silicon substrate in the vertical direction and extend from the first region in a horizontal direction, the horizontal direction being parallel to the upper surface of the silicon substrate, and wherein the gate horizontal patterns include pad regions arranged in a stepped shape in a second region adjacent to the first region;
a vertical channel structure passing through the stack structure in the first region; and
a vertical support structure passing through the stack structure in the second region and spaced apart from the vertical channel structure in the horizontal direction,
wherein the gate horizontal patterns of the first stack portion include a first lowermost gate horizontal pattern and a first uppermost gate horizontal pattern
wherein the gate horizontal patterns of the second stack portion include a second lowermost gate horizontal pattern and a second uppermost gate horizontal pattern,
wherein the vertical channel structure includes a vertical core pattern, a channel layer on a side surface of the vertical core pattern, and a data storage layer on an external surface of the channel layer,
wherein a cross-sectional shape of the vertical channel structure in the vertical direction
is different than a cross-sectional shape of the vertical support structure in the vertical direction,
wherein the vertical channel structure includes a first vertical region, a second vertical region, and a junction region between the first vertical region and the second vertical region,
wherein the interlayer insulation layers include an intermediate interlayer insulation layer adjacent to the junction region,
wherein the intermediate interlayer insulation layer and an interlayer insulation layer adjacent to the intermediate interlayer insulation layer in the vertical direction, among the interlayer insulation layers, have substantially the same thickness,
wherein the vertical support structure is formed of a single body,
wherein a maximum width of the single body is greater than a maximum width of the vertical channel structure,
wherein a lower end of the vertical support structure and a lower end of the vertical channel structure are at a lower level than the upper surface of the silicon substrate, wherein the vertical support structure does not include a material of the channel layer, wherein at least a portion of the channel layer extends continuously from a first height level to a second height level, wherein at least a portion of the single body extends continuously from the first height level to the second height level, wherein the first height level is at a lower level than the first lowermost gate horizontal pattern, wherein the second height level is at a higher level than the second uppermost gate horizontal pattern, wherein a side surface of the vertical channel structure includes a bending portion at a third height level, and wherein the third height level is at the same level as a level between a lower surface of the first uppermost gate horizontal pattern and a lower surface of the second lowermost gate horizontal pattern.

2. The three-dimensional semiconductor device according to claim 1, wherein the vertical channel structure contacts the silicon substrate, wherein the vertical support structure contacts the silicon substrate, wherein the single body does not include a bending portion at the third height level, wherein at least a portion of the data storage layer extends continuously from the first height level to the second height level, and wherein at least a portion of the vertical core pattern extends continuously from the first height level to the second height level.

3. The three-dimensional semiconductor device according to claim 1, wherein the lower end of the vertical channel structure is at a different level than the lower end of the vertical support structure.

4. The three-dimensional semiconductor device according to claim 1, wherein:

the first vertical region comprises a lower region and an upper region on the lower region, the second vertical region comprises a lower region and an upper region on the lower region of the second vertical region, the upper region of the first vertical region has a width greater than a width of the lower region of the first vertical region, and the upper region of the second vertical region has a width greater than a width of the lower region of the second vertical region.

5. The three-dimensional semiconductor device according to claim 4, wherein:

the upper region of the first vertical region adjacent to the second vertical region has a first width, the lower region of the second vertical region adjacent to the first vertical region has a second width less than the first width, and the junction region is a portion that changes from the first width to the second width between the upper region of the first vertical region and the lower region of the second vertical region.

6. The three-dimensional semiconductor device according to claim 1, wherein:

each of the first vertical region and the second vertical region changes in width with regularity in the vertical direction as they extend away from the silicon substrate, an upper region of the first vertical region and a lower region of the second vertical region have widths different from each other, and the junction region is a portion that changes in width between the upper region of the first vertical region and the lower region of the second vertical region.

7. The three-dimensional semiconductor device according to claim 1, wherein the vertical support structure changes in width with regularity in the vertical direction away from the silicon substrate.

8. The three-dimensional semiconductor device according to claim 1, wherein the single body is formed of silicon oxide.

9. The three-dimensional semiconductor device according to claim 1, further comprising:

a lower substrate; and a peripheral circuit structure on the lower substrate, wherein the silicon substrate is on the peripheral circuit structure.

10. The three-dimensional semiconductor device according to claim 1, further comprising:

separation structures;

protection patterns; and a buffer horizontal pattern, wherein the gate horizontal patterns are disposed between the separation structures, wherein the gate horizontal patterns comprise first gate horizontal patterns and second gate horizontal patterns on the first gate horizontal patterns, wherein the buffer horizontal pattern is disposed between the first gate horizontal patterns and the second gate horizontal patterns, and is formed of a material different from a material of the gate horizontal patterns, and wherein the protection patterns are disposed between the separation structures and the buffer horizontal pattern, and are formed of a material different from the material of the buffer horizontal pattern.

11. The three-dimensional semiconductor device according to claim 10, wherein:

the gate horizontal patterns are formed of a conductive material, the buffer horizontal pattern is formed of an insulating material, and the protection patterns are formed of an insulating material different from the insulating material of the buffer horizontal pattern.

* * * * *